(12) United States Patent
Schmit et al.

(10) Patent No.: US 7,242,216 B1
(45) Date of Patent: Jul. 10, 2007

(54) EMBEDDING MEMORY BETWEEN TILE ARRANGEMENT OF A CONFIGURABLE IC

(76) Inventors: Herman Schmit, 2919 Simkins Ct., Palo Alto, CA (US) 94303; Jason Redgrave, 278 Martens Ave., Mountain View, CA (US) 94040

( * ) Notice: Subject to any disclaimer, the term of this patent is extended or adjusted under 35 U.S.C. 154(b) by 158 days.

(21) Appl. No.: 11/081,809

(22) Filed: Mar. 15, 2005

Related U.S. Application Data

(60) Provisional application No. 60/626,322, filed on Nov. 8, 2004.

(51) Int. Cl.
*H03K 19/177* (2006.01)
(52) U.S. Cl. .............................. 326/39; 326/41; 326/47; 326/40
(58) Field of Classification Search ............ 326/38–41, 326/47, 101
See application file for complete search history.

(56) References Cited

U.S. PATENT DOCUMENTS

| | | |
|---|---|---|
| 4,873,459 A | 10/1989 | El Gamal et al. |
| 5,245,575 A | 9/1993 | Sasaki et al. |
| 5,349,250 A | 9/1994 | New |
| 5,357,153 A | 10/1994 | Chiang et al. |
| 5,365,125 A | 11/1994 | Goetting et al. |
| 5,369,622 A | 11/1994 | McLaury |
| 5,426,378 A | 6/1995 | Ong |
| 5,521,835 A | 5/1996 | Trimberger |
| 5,532,958 A | 7/1996 | Jiang et al. |
| 5,552,721 A | 9/1996 | Gould |
| 5,610,829 A | 3/1997 | Trimberger |
| 5,631,578 A | 5/1997 | Clinton et al. |
| 5,646,544 A | 7/1997 | Iadanza |
| 5,659,484 A | 8/1997 | Bennett et al. |
| 5,682,107 A | 10/1997 | Tavana et al. |
| 5,692,147 A | 11/1997 | Larsen et al. |
| 5,694,057 A | 12/1997 | Gould |
| 5,719,889 A | 2/1998 | Iadanza |
| 5,732,246 A | 3/1998 | Gould et al. |
| 5,737,235 A | 4/1998 | Kean et al. |
| 5,745,422 A | 4/1998 | Iadanza |
| 5,745,734 A | 4/1998 | Craft et al. |

(Continued)

OTHER PUBLICATIONS

"Design for Low Power in Actel Antifuse FPGAs", Actel Application Note, 2000 Actel Corporation Sep. 2000, pp. 1-8.

(Continued)

*Primary Examiner*—Anh Q. Tran
(74) *Attorney, Agent, or Firm*—Adeli Law Group

(57) ABSTRACT

Some embodiments of the invention provide a configurable IC that includes several configurable computational tiles and several memory tiles. These tiles are arranged in a particular tile arrangement. Each computational tile has a set of configurable logic circuits for configurably performing a plurality of computations and a set of configurable routing circuits. The routing circuits of the tiles configurably route signals between configurable logic circuits. The configurable IC also has several memory arrays for storing data on which the logic circuit perform computation. The memory arrays are embedded in the tile arrangement between two sets of memory tiles, where each set of memory tiles includes a set of routing circuits. In this IC, at least a first memory tile has the same set of configurable routing circuits as at least a second computational tile.

23 Claims, 28 Drawing Sheets

U.S. PATENT DOCUMENTS

| | | | |
|---|---|---|---|
| 5,764,954 A | 6/1998 | Fuller et al. | |
| 5,768,178 A | 6/1998 | McLaury | |
| 5,777,360 A | 7/1998 | Rostoker et al. | |
| 5,802,003 A | 9/1998 | Iadanza et al. | |
| 5,815,726 A | 9/1998 | Cliff | |
| 5,889,411 A | 3/1999 | Chaudhary | |
| 5,914,616 A | 6/1999 | Young et al. | |
| 5,914,906 A | 6/1999 | Iadanza et al. | |
| 5,982,655 A | 11/1999 | Doyle | |
| 6,002,991 A | 12/1999 | Conn, Jr. | |
| 6,023,421 A | 2/2000 | Clinton et al. | |
| 6,038,192 A | 3/2000 | Clinton et al. | |
| 6,044,031 A | 3/2000 | Iadanza et al. | |
| 6,054,873 A | 4/2000 | Laramie | |
| 6,069,490 A | 5/2000 | Ochotta et al. | |
| 6,075,745 A | 6/2000 | Gould et al. | |
| 6,086,631 A | 7/2000 | Chaudhary et al. | |
| 6,091,263 A | 7/2000 | New et al. | |
| 6,091,645 A | 7/2000 | Iadanza | |
| 6,107,821 A | 8/2000 | Kelem et al. | |
| 6,110,223 A | 8/2000 | Southgate et al. | |
| 6,118,707 A | 9/2000 | Gould et al. | |
| 6,130,854 A | 10/2000 | Gould et al. | |
| 6,134,154 A | 10/2000 | Iwaki et al. | |
| 6,140,839 A | 10/2000 | Kaviani et al. | |
| 6,150,838 A | 11/2000 | Wittig et al. | |
| 6,163,168 A | 12/2000 | Nguyen et al. | |
| 6,172,521 B1 | 1/2001 | Motomura | |
| 6,173,379 B1 | 1/2001 | Poplingher et al. | |
| 6,175,247 B1 | 1/2001 | Scalera et al. | |
| 6,184,707 B1 | 2/2001 | Norman et al. | |
| 6,184,709 B1 * | 2/2001 | New | 326/40 |
| 6,205,076 B1 | 3/2001 | Wakayama et al. | |
| 6,233,191 B1 | 5/2001 | Gould et al. | |
| 6,275,064 B1 | 8/2001 | Agrawal et al. | |
| 6,292,019 B1 | 9/2001 | New et al. | |
| 6,326,807 B1 | 12/2001 | Veenstra et al. | |
| 6,346,824 B1 | 2/2002 | New | |
| 6,348,813 B1 | 2/2002 | Agrawal et al. | |
| 6,381,732 B1 | 4/2002 | Burnham et al. | |
| 6,469,540 B2 | 10/2002 | Nakaya | |
| 6,487,709 B1 | 11/2002 | Keller et al. | |
| 6,490,707 B1 | 12/2002 | Baxter | |
| 6,496,918 B1 | 12/2002 | DeHon et al. | |
| 6,515,509 B1 | 2/2003 | Baxter | |
| 6,526,559 B2 | 2/2003 | Schiefele et al. | |
| 6,529,040 B1 | 3/2003 | Carberry et al. | |
| 6,545,501 B1 | 4/2003 | Bailis et al. | |
| 6,593,771 B2 | 7/2003 | Bailis et al. | |
| 6,601,227 B1 | 7/2003 | Trimberger | |
| 6,603,330 B1 | 8/2003 | Snyder | |
| 6,629,308 B1 | 9/2003 | Baxter | |
| 6,636,070 B1 | 10/2003 | Altaf | |
| 6,642,744 B2 | 11/2003 | Or-Bach et al. | |
| 6,650,142 B1 | 11/2003 | Agrawal et al. | |
| 6,667,635 B1 | 12/2003 | Pi et al. | |
| 6,668,361 B2 | 12/2003 | Bailis et al. | |
| 6,675,309 B1 | 1/2004 | Baxter | |
| 6,714,041 B1 | 3/2004 | Darling et al. | |
| 6,732,068 B2 | 5/2004 | Sample et al. | |
| 6,806,730 B2 | 10/2004 | Bailis et al. | |
| 6,809,979 B1 | 10/2004 | Tang | |
| 6,831,479 B2 | 12/2004 | Lo | |
| 6,838,902 B1 | 1/2005 | Elftmann et al. | |
| 6,920,627 B2 | 7/2005 | Blodget et al. | |
| 6,924,663 B2 | 8/2005 | Masui et al. | |
| 6,937,535 B2 | 8/2005 | Ahn et al. | |
| 6,956,399 B1 | 10/2005 | Bauer | |
| 6,992,505 B1 | 1/2006 | Zhou | |
| 6,998,872 B1 | 2/2006 | Chirania et al. | |
| 7,010,667 B2 | 3/2006 | Vorbach et al. | |
| 7,028,281 B1 | 4/2006 | Agrawal et al. | |
| 7,075,333 B1 | 7/2006 | Chaudhary et al. | |
| 7,126,372 B2 | 10/2006 | Vadi et al. | |
| 7,126,856 B2 | 10/2006 | Sun et al. | |
| 7,129,746 B1 | 10/2006 | Balasubramanian et al. | |
| 2001/0007428 A1 | 7/2001 | Young et al. | |
| 2002/0008541 A1 | 1/2002 | Young et al. | |
| 2002/0113619 A1 | 8/2002 | Wong | |
| 2002/0125914 A1 | 9/2002 | Kim | |
| 2002/0161568 A1 | 10/2002 | Sample et al. | |
| 2002/0163357 A1 | 11/2002 | Ting | |
| 2003/0042931 A1 | 3/2003 | Ting | |
| 2003/0080777 A1 | 5/2003 | Baxter | |
| 2003/0110430 A1 | 6/2003 | Bailis et al. | |
| 2004/0010767 A1 | 1/2004 | Agrawal et al. | |
| 2004/0103265 A1 | 5/2004 | Smith | |
| 2004/0196066 A1 | 10/2004 | Ting | |
| 2004/0233758 A1 | 11/2004 | Kim et al. | |
| 2005/0007155 A1* | 1/2005 | Young | 327/47 |
| 2005/0134308 A1 | 6/2005 | Okada et al. | |

OTHER PUBLICATIONS

Quicklogic Corp., "Ultra-Low Power FPGA Combining Performance, Density, and Embedded RAM," *Eclipse II Family Data Sheet*, 2005, pp. 1-92, QuickLogic Corporation, US??, no month.

Cong, J., et al., "Combinational Logic Synthesis for LUT Based Field Programmable Gate Arrays," *ACM Transactions on Design Automation of Electronic Systems*, Apr. 1996, pp. 145-204, vol. 1, No. 2, ACM, Inc.

Snider, G., "Performance-Constrained Pipelining of Software Loops onto Reconfigurable Hardware," *FPGA '02*, Feb. 24-26, 2002, pp. 177-186, ACM, Monterey, California, USA.

Singh, A., et al., "PITIA: An FPGA for Throughput-Intensive Applications," *IEEE Transactions on Very Large Scale Integration (VLSI) Systems*, Jun. 2003, pp. 354-363, vol. 11, No. 3, IEEE.

Singh, A., et al., "Interconnect Pipelining in a Throughput-Intensive FPGA Architecture," *FPGA 2001*, Feb. 11-13, 2001, pp. 153-160, ACM, Monterey, CA, USA.

Markovskiy, Y., et al., "Analysis of Quasi-Static Scheduling Techniques in a Virtualized Reconfigurable Machine," *FPGA '02*, Feb. 24-26, 2002, ACM, Monterey, California, USA.

Caspi, E., et al., "Stream Computations Organized for Reconfigurable Execution (SCORE): Introduction and Tutorial," Aug. 25, 2000, pp. 1-31, Version 1.0.

Camposano, R., "The Growing Semiconductor Zoo: ASICs, CSSP, ASSP, ASIP, Structured Arrays, FPGAs, Processor Arrays, Platforms . . . and Other Animalia," 2003, pp. 1-74, Synopsys, Inc., no month.

Ohkura, J., et al., "Dataflow in the Adaptive Computing Machine (ACM)," *A Technology Application Whitepaper*, Apr. 28, 2004 but © 2003, pp. 1-9, QuickSilver Technology, Inc., San Jose, California.

Heidari, G., et al., "Introducing a Paradigm Shift in the Design and Implementation of Wireless Devices," *A Wireless Devices Whitepaper*, Apr. 28, 2004 but © 2003, pp. 1-10, QuickSilver Technology, Inc., San Jose, California.

Plunkett, B., "In Search of the SDR Holy Grail, " *A Technology Application Whitepaper*, Apr. 28, 2004 but © 2003, pp. 1-7, QuickSilver Technology, Inc., San Jose, California.

Sambhwani, S., et al., "Implementing W-CDMA Transciever Structure on an Adaptive Computing Platform," *A Technology Application Whitepaper*, Apr. 28, 2004 but © 2003, pp. 1-12, QuickSilver Technology, Inc., San Jose, California.

Master, P., "The Next Big Leap in Reconfigurable Systems," *A Technology Vision Whitepaper*, Apr. 28, 2004 but © 2003, pp. 1-8, QuickSilver Technology, Inc., San Jose, California.

QuickSilver Technology, Inc., "Adapt2000 ACM System Platform," Apr. 2004, pp. 1-39, QuickSilver Technology, Inc., San Jose, California.

Gayasen, A., et al., "Reducing Leakage Energy in FPGAs Using Region-Constrained Placement," *FPGA '04*, Feb. 22-24, 2004, pp. 51-58, ACM, Monterey, California, USA.

Davare, A., et al., "The Best of Both Worlds: The Efficient Asynchronous Implementation of Synchronous Specifications," *DAC '04*, Jun. 7-11, 2004, ACM, San Diego, California, USA.

Morris, K., "Rationalizing Reconfigurability: The Importance of Being Programmable," *FPGA and Structured ASIC Journal*, Sep. 27, 2005.

Parhami, B., "Part IV: Low-Diameter Architectures," ECE 254B: *Advanced Computer Archtiecture Parallel Processing, UCSB*, Spring 2005, slides 1-93, Behrooz Parhami, Santa Barabara, Ca, no month.

Tom, M., et al., "Logic Block Clustering of Large Designs for Channel-Width Constrained FPGAs," *DAC 2005*, Jun. 13-17, 2005, pp. 726-731, ACM, Anaheim, California, USA.

Nelson, B.E., "Reconfigurable Computing: An Introduction and Overview," Sep. 23, 1998, pp. 1-43.

Dehon, A., et al., "Reconfigurable Computing: What, Why, and Implications for Design Automation," *DAC 99, New Orleans, Louisiana*, 1999, ACM, no month.

Dehon, A., "The Density Advantage of Configurable Computing," Apr. 2000, pp. 41-49, IEEE.

Butts, M., "Future Directions of Dynamically Reprogrammable Systems," *IEEE 1995 Custom Integrated Circuits Conference*, 1995, pp. 487-494, IEEE, no month.

Hofstee, H.P., "Cell Braodband Engine Architecture from 20,000 Feet," Aug. 24, 2005, pp. 1-6.

IBM, "SPU C/C++ Language Extensions, Version 2.0" *CBEA JSRE Series*, Aug. 1, 2005, pp. iv-84, USA.

IBM, "Synergistic Processor Unit Instruction Set Architecture, Version 1.0," Aug. 1, 2005, pp. 1-257, USA.

IBM, "SPU Assembly Language Specification, Version 1.2," *CBEA JSRE Series*, Aug. 1, 2005, pp. iii-22, USA.

IBM, "SPU Application Binary Interface Specification, Version 1.3," *CBEA JSRE Series*, Aug. 1, 2005, pp. iv-26, USA.

Backus, J., "Can Programmable be Liberated from the Von Neumann Style? A Functional Style and its Algebra of Programs," *Communications of the ACM*, Aug. 1978, pp. 613-641, vol. 21, No. 8, ACM.

Xing, S., et al., "FPGA Adders: Performance Evaluation and Optimal Design," *IEEE Design & Test of Computers*, Jan.-Mar. 1998, pp. 24-29, IEEE.

Chiricescu, S., et al., "Morphable Multipliers," *FPL 2002, LNCS 2438*, 2002, pp. 647-656, Springer-Verlag Berlin Heidelberg, no month.

Andraka Consulting Group, Inc., "Multiplication in FPGAs," http://www.andraka.com/multipli.htm, Jan. 25, 2006, pp. 1-7.

Hauck, S., et al., "High-Performance Carry Chains for FPGAs," *FPGA 98*, 1998, pp. 223-233, ACM, Monterey, CA, USA, no month.

Schmit, H., "Extra-Dimensional Island-Style FPGAs," 2003, no month.

Ling, A., "The Search for the Optimal FPGA Logic Block," 2001, ACM, no month.

Rahman, A., et al., "Wiring Requirement and Three-Dimensional Integration Technology for Field Programmable Gate Arrays," *IEEE Transactions on Very Large Scale Integration (VLSI) Systems*, Feb. 2003, pp. 44-54, vol. 11, No. 1, IEEE.

Morris, K., "Lattice Launches XP: Non-Volatility at the Forefront of FPGA," *FPGA and Programmable Logic Journal*, 2005, pp. 1-5, Techfocus Media, Inc., no month.

Ahmed, E., et al., "The Effect of LUT and Cluster Size on Deep-Submicron FPGA Performance and Density," *FPGA 2000*, 2000, ACM, Monterey, CA, USA, no month.

Weaver, N., et al., "The SFRA: A Corner-Turn FPGA Architecture," *FPGA '04*, Feb. 22-24, 2004, ACM, Monterey, California, USA.

Xilinx, Inc., "Virtex-4 Family Overview," *Advance Product Specification*, Sep. 10, 2004, pp. 21-30, v1.1, Xilinx, Inc.

M2000, "FlexEOS Embedded FPGA Cores," 2003, M2000, no month.

Schmit, H., et al., "FPGA Switch Block Layout and Evaluaion," *FPGA '02*, Feb. 24-26, 2002, ACM, Monterey, California, USA.

Lemieux, G., et al., "Generating Highly-Routable Sparse Crossbars for PLDs," *FPGA 2000*, 2000, ACM, Monterey, California, USA, no month.

Lemieux, G., et al., "Using Sparse Crossbars within LUT Clusters," *FPGA 2001*, Feb. 11-13, 2001, ACM, Monterey, CA.

George, V., "Low Energy Field-Programmable Gate Array," *A Dissertation Submitted in Partial Satisfaction o the Requirements for the Degree of Doctor of Philosophy in Engineering-Electrical Engineering and Computer Sciences in the Graduate Division of the University of California*, Berkeley, Fall 2000, pp. 1-190, no month.

Hauck, S., et al., "Montage: An FPGA for Synchronous and Asynchronous Circuits," pp. 1-4. (Applicants believe that this article also appears in *Field-Programmable Gate Arrays: Architectures and Tools for Rapid Prototyping*, 1993, pp. 44-51, Springer-Verlag, Berlin.), no month.

Caspi, E., et al., "A Streaming Multi-Threaded Model," *MSP-3*, Dec. 2, 2001, pp. 1-23.

Ochotta, E.S., et al., "A Novel Predictable Segmented FPGA Routing Archtiecture," *FPGA 98*, 1998, pp. 3-11, ACM, Monterey, CA, USA, no month.

Wilton, S.J.E., "Memory-to-Memory Connection Structures in FPGAs with Embedded Memory Arrays," *FPGA 97*, 1997, pp. 10-16, ACM, Monterey, California, USA, no month.

Agrawal, O., et al., "An Innovative, Segmented High Performance FPGA Family with Variable-Grain-Architecture and Wide-gating Functions," *FPGA 99*, 1999, pp. 17-26, ACM, Monterey, CA, USA, no month.

Trimberger, S., "Effects of FPGA Architecture on FPGA Routing," *32nd ACM/IEEE Design Automation Conference*, 1995, ACM, no month.

Altera Corp., "6. DSP Blocks in Stratix II Devices," *SII52006-1.0*, Feb. 2004, pp. 1-32.

Altera, "Stratix II DSP Performance," *White Paper*, Feb. 2004, pp. 1-9, ver. 1.0, Altera Corporation, San Jose, CA.

Zuchowski, P.S., "A Hybrid ASIC and FPGA Architecture," 2002, IEEE, no month.

Goldstein, S.C., et al., "PipeRench: A Reconfigurable Architecture and Complier," 2000, pp. 70-77, IEEE, no month.

Dehon, A., et al., "DPGA-Coupled Microprocessors: Commodity ICs for the Early 21st Century," *FCCM '94-IEEE Workshop on FPGAs for Custom Computing Machines*, Apr. 10-13, no year.

Mathstar, Inc., "MathStar FPOA Architecture: A New Approach to High Throughput, Scalable, and Reprogrammable Design," *Technology Overview*, 2003, MathStar, Inc., no month.

Compton, K., et al., "Reconfigurable Computing: A Survey of Systems and Software," *ACM Computing Surveys*, Jun. 2002, pp. 171-210, vol. 34, No. 2, ACM, New York, NY.

Huang, A.S., "Tao: An Architecturally Balanced Reconfigurable Hardware Processor," *Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology*, May 23, 1997, pp. 1-86, 107-109.

Tau, E., et al., "Transit Note #114: A First Generation DPGA Implementation," *M.I.T. Transit Project*, Jan. 1995, pp. 1-8.

Dehon, A., "Transit Note #121: Notes on Programmable Interconnect," *M.I.T. Transit Project*, Feb. 1995, pp. 1-13.

Perissakis, S., et al., "Embedded DRAM for a Reconfigurable Array," *Proceedings of the 1999 Symposium on VLSI Circuits*, Jun. 1999.

Dehon, A., Balancing Interconnect and Computation in a Reconfigurable Computing Array (or, why don't you really want 100% LUT utilization). pp. 1-10. (Applicants believe that this article also appears in *Proceedings of the International Symposium on Field Programmable Gate Arrays*, Feb. 1999, pp. 125-134.)

Tsu, W., et al., "HSRA: High-Speed, Hierarchical Synchronous Reconfigurable Array," pp. 1-10. (Applicants believe that this also appears in *Proceesdings of the International Symposium on Field Programmable Gate Arrays*, Feb. 1999, pp. 69-78.).

Mirsky, E., et al., "MATRIX: A Reconfigurable Computing Device with Configurable Instruction Distribution and Deployable Resources," *Hot Chips Symposium 1997*, 1997, no month.

Dehon, A., "Dynamically Programmable Gate Arrays: A Step Toward Increased Computational Density," *Proceedings of the Fourth Canadian Workshop on Field-Programmable Devices*, May 1996, pp. 47-54.

Mirsky, E., et al., "MATRIX: A Reconfigurable Computing Architecture with Configurable Instruction Distribution and Deployable Resources," *Proceedings of the IEEE Workshop on FPGAs for Custom Computing Machines*, Apr. 1996.

Tau, E., et al., "A First Generation DPGA Implementation," *Proceedings of the Third Canadian Workshop on Field-Programmable Devices*, May 1995, pp. 138-143.

Dehon, A., et al., "Design Patterns for Reconfigurable Computing," *Proceedings of the IEEE Symposium on Field-Programmable Custom Computing Machines*, Apr. 2004.

Wawrzynek, J., "EECS150-Digital Design: Lecture 5—Field Programmable Gate Arrays (FPGAs)," Feb. 4, 2002, pp. 1-4, slides 1-20, multiple slides per page.

"The Xilinx Virtex Series FPGA," Jan. 22, 2001, slides 1-22.

Dehon, A., "Reconfigurable Architectures for General-Purpose Computing," *A.I. Technical Report No. 1586*, Oct. 1996, pp. i-353.

U.S. Appl. No. 11/082,193, filed Mar. 15, 2005, Schmit.
U.S. Appl. No. 11/082,222, filed Mar. 15, 2005, Schmit.
U.S. Appl. No. 11/082,220, filed Mar. 15, 2005, Teig.
U.S. Appl. No. 11/082,219, filed Mar. 15, 2005, Redgrave.
U.S. Appl. No. 11/081,867, filed Mar. 15, 2005, Schmit.
U.S. Appl. No. 11/082,225, filed Mar. 15, 2005, Schmit.
U.S. Appl. No. 11/081,861, filed Mar. 15, 2005, Schmit.
U.S. Appl. No. 11/081,878, filed Mar. 15, 2005, Redgrave.
U.S. Appl. No. 11/082,228, filed Mar. 15, 2005, Schmit.

"§3 Programmable Logic Devices," *Digital System Design*, 2001, pp. 3.1-3.28, no month.

IBM, "Cell Broadband Engine Architecture, Version 1.0," Aug. 8, 2005, pp. 1-319, USA.

U.S. Appl. No. 11/082,193, filed Mar. 15, 2005, Schmit et al.
U.S. Appl. No. 11/081,867, filed Mar. 15, 2005, Schmit et al.
U.S. Appl. No. 11/082,228, filed Mar. 15, 2005, Schmit et al.

"The Effect of SRAM Table Sharing and Cluster Size on FPGA Area", NPL Date Unknown, pp. 1-10.

"Unifying Sequential and Spatial Computing with a Single Instruction Set Architechture," *ISCA '04*, Jun. 19-23, 2004, ACM, Munchen, Oberbayern, Germany.

Barker, R., "QuickSilver ACM SilverStream Design Methodology with the Inspire SDK Tool Set," *A Technology Application Whitepaper*, Jan. 26, 2004, pp. 1-8, QuickSilver Technology, Inc., San Jose, California, USA.

Compton, K., et al., "An Introduction to Reconfigurable Computing," *IEEE Computer*, Apr. 2000.

Dehon, A., "DPGA Utilization and Application," *Proceedings of the 1996 ACM Fourth International Symposium on Field-Programmable Gate Arrays FPGA*, Feb. 11-13, 1996, Monterey, California, USA.

Enzler, R., et al., "Virtualizing Hardware with Mulit-Context Reconfigurable Arrays," *Lecture Notes in Computer Science*, Sep. 2003, pp. 151-160.

Giraud-Carrier, C., "a Reconfigurable Data Flow Machine for Implementing Functional Programming Languages," *SIGPLAN Notices*, Sep. 1994, vol. 29 (9): 22-28.

Goldstein, S.C., et al., "PipeRench: A Coprocessor for Streaming Multimedia Acceleration," *International Symposium on Computer Architecture (ISCA)*, May 1999, pp. 28-39.

Hauck, S., et al., "Totem: Domain-Specific Reconfigurable Logic," *IEEE Transactions on VLSI Systems*, 2006 Month N/A, pp. 1-25.

Kaviani, A., et al., "Computational Field Programmable Architecture," *Custom Integrated Circuits Conference, 1998, Proceedings of the IEEE 1998*, May 11-14, 1998.

Kaviani, A., et al., "Hybrid FPGA Architecture," *Proceedings of the 1996 ACM Fourth International Symposium on Field-Programmable Gate Arrays*, Feb. 11-13, 1996, pp. 3-9, Monterey, California, USA.

Keutzer, K., "Overview of *configurable* architectures," Feb. 28, 2002, slides 1-29.

Kocan, F., et al., "Logic Modules with Shared SRAM Tables for Field-Programmable Gate Arrays," *FPL 2004*, Aug./Sep. 2004, pp. 289-300, Springer-Verlag, Berlin Heidelberg.

Lehn, D.I., et al., "Evaluation of Rapid Context Switching on a CSRC Device," *Proceedings of the International Conference on Engineering of Reconfigurable Systems and Algorithms*, Jun. 24-27, 2002.

Lertora, F., et al., "Handling Different Computational Granularity by a Reconfigurable IC Featuring Embedded FPGAs and a Network-On-Chip," *13th Annual IEEE Symposium on Field-Programmable Custom Computing Machines (FCCM 2005) 2005*, Apr. 18-20, 2005.

Lewis, D., et al., "The Stratix-II Routing and Logic Architecture," *Proceedings of the 2005 ACM/SIGDA 13th International Symposium on Field-Programmable Gate Arrays*, Feb. 20-22, 2005, pp. 1-22, Monterey, California, USA.

Niedzielski, D., "An Overview of Reconfigurable Computing," NPL Date Unknown.

Pedram, M., "IEEE Circuits and Systems Society Distinguished Lecturer Program," NPL Date Unknown.

Perissakis, S., et al., "Embedded DRAM for a Reconfigurable Array," Jun. 17-19, 1999.

Plunkett, B., et al., "Adapt2400 ACm Architecture Overview," *A Technology Whitepaper*, 2004 Month N/A, pp. 1-9, QuickSilver Technology, Inc.

Quicksilver Technology, Inc., "InSpire SDK Tool Set," *Product Brief*, 2004 Month N/A, QuickSilver Technology, Inc., San Jose, California, USA.

Quicksilver Technology, Inc., "QS2412 Adaptive Computing Machine," *Product Brief*, 2004 Month N/A, QuickSilver Technology, Inc., San Jose, California, USA.

Rose, J., "Hard vs. Soft: The Central Question of Pre-Fabricated Silicon," *34th International Symposium on Multiple-Valued Logic (ISMVL '04)*, May 2004, pp. 2-5.

Scalera, S.M., et al., "A Mathematical Benefit Analysis of Context Switching Reconfigurable Computing," *Proceedings of the 5th Reconfigurable Architectures Workshop (RAW), Mar. 30, 1998, vol. 1388 of Lecture Notes in Computer Science*, pp. 73-78.

Schaumont, P., et al., "A Quick Safari Through the Reconfiguration Jungle," *38th Design Automation Conference*, Jun. 2001, pp. 172-177, Las Vegas, Nevada, USA.

Schmit, H., "Extra-dimensional Island-Style FPGAs," *Field Programmable Logic and Application (FPL 2003)*, Sep. 2003, pp. 406-415.

Schmit, H., "Incremental Reconfiguration for Pipelined Applications," *Proceedings of the 5th IEEE Symposium of FPGA-Based Custom Computing Machines*, Apr. 16-18, 1997.

Schmit, H., et al., "PipeRench: A Virtualized Programmable Datapath in 0.18 Micron Technology," *Proceedings of the IEEE 2002 Custom Integrated Circuits Conference*, May 12-15, 2002, pp. 63-66.

Schmit, H., et al., "Queue Machines: Hardware Compilation in Hardware," *Proceedings of the 10th Annual IEEE Symposium on Field-Progammable Custom Computing Machines*, Apr. 22-24, 2002.

Sharma, A., et al., "Accelerating FPGA Routing Using Architecture-Adaptive A* Techniques," *Proceedings of the IEEE Conference on Field-Programmable Technology 2005*, Dec. 11-14, 2005.

Sheeran, M., "Generating Fast Multipliers Using Clever Circuits," *Formal Methods in Computer-Aided Design, 5th International Conference, FMCAD 2004*, Nov. 2004.

Slade, A.L., et al., "Reconfigurable Computing Application Frameworks," *11th Annual IEE Symposium on Field-Programmable Custom Computer Machines*, Apr. 9-11, 2003.

Teifel, J., et al., "Highly Pipelined Asynchronous FPGAs," *Proceedings of the 2004 ACM/SIDDA 12th International Symposium on Field Programmable Gate Arrays*, Feb. 22-24, 2004, Monterey, California, USA.

Tessier, R., et al., "Balancing Logic Utilization and Area Efficiency in FPGAs," *Proceeding of the Roadmap to Reconfigurable Com-

*puting, 10th International Workshop on Field Programmable Logic and Applicaitions*, Aug. 27-30, 2000, pp. 535-544.

Tom, M., et al., "Clustering of Large Designs for Channel-Width Constrained FPGAs," *University of British Columbia, Department of Electrical and Computer Engineering*, Jun. 2005, slides 1-39, Vancouver, BC, Canada.

Zilic, Z. et al., "Using BDDs to Design ULMs for FPGAs," *Proceedings of the 1996 ACM Fourth International Symposium on Field-Programmable Gate Arrays (FPGA '96)*, Feb. 11-13, 1996, pp. 1-10, Monterey, California, USA.

\* cited by examiner

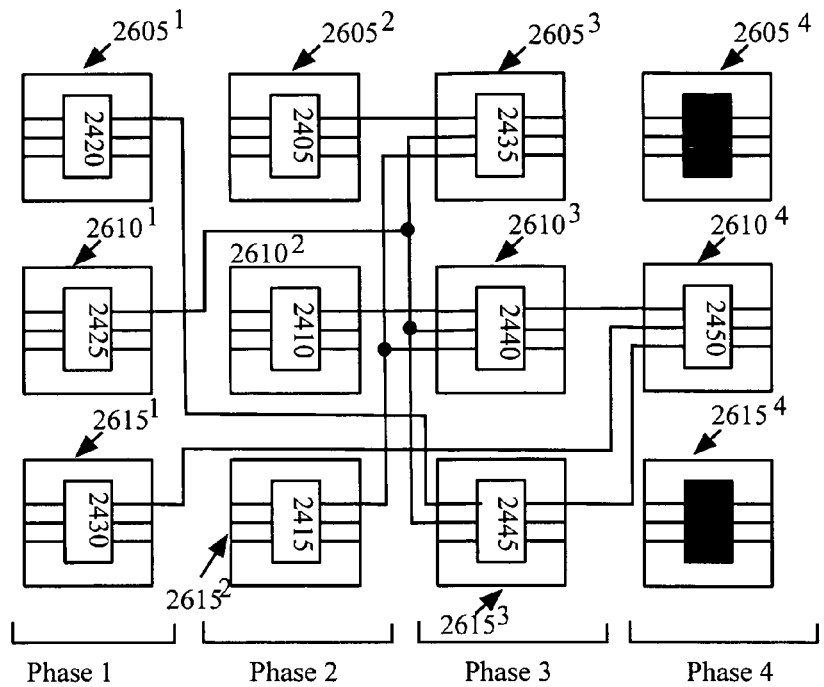
*Figure 26*
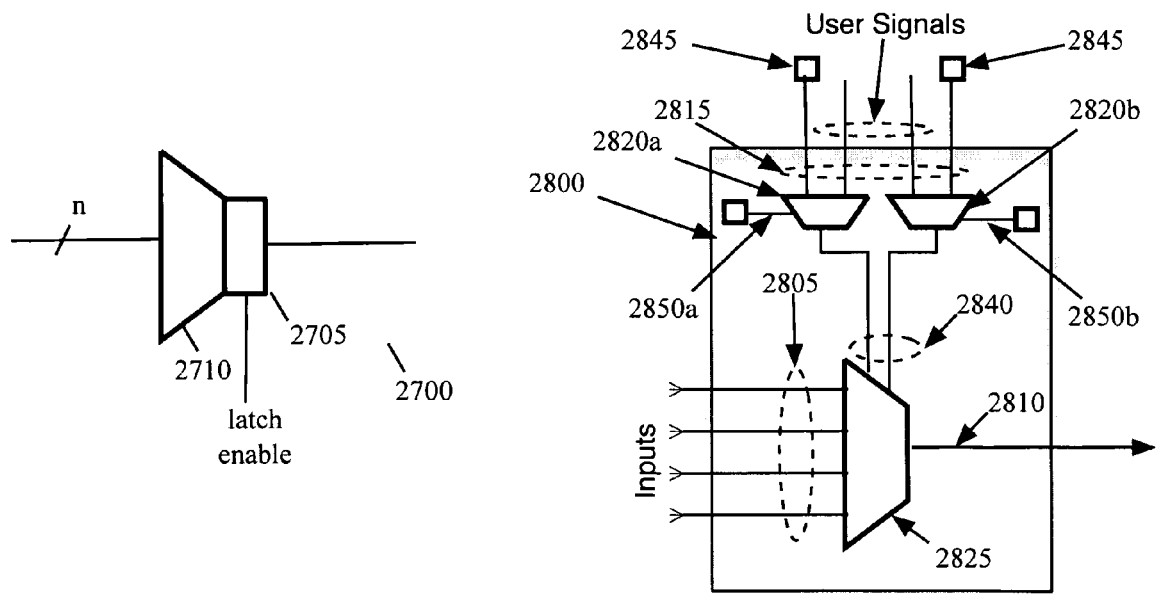
*Figure 27*
*Figure 28*

EMBEDDING MEMORY BETWEEN TILE ARRANGEMENT OF A CONFIGURABLE IC

CLAIM OF BENEFIT TO PRIOR APPLICATION

This application claims benefit of an earlier-filed U.S. Provisional Patent Application 60/626,322, entitled "Configurable Circuits, IC's and Systems," filed Nov. 8, 2004, which is incorporated herein by reference.

CROSS REFERENCE TO RELATED APPLICATIONS

This application is related to the following applications with the same filing date: U.S. patent application Ser. No. 11/082,193, filed Mar. 15, 2005; U.S. patent application Ser. No. 11/082,222, filed Mar. 15, 2005; U.S. patent application Ser. No. 11/082,220, filed Mar. 15, 2005; U.S. patent application Ser. No. 11/082,219, filed Mar. 15, 2005; U.S. patent application Ser. No. 11/081,867, filed Mar. 15, 2005; U.S. patent application Ser. No. 11/082,225, filed Mar. 15, 2005; U.S. patent application Ser. No. 11/081,861, filed Mar. 15, 2005; U.S. patent application Ser. No. 11/081,878, filed Mar. 15, 2005; and U.S. patent application Ser. No. 11/082,228, filed Mar. 15, 2005.

FIELD OF THE INVENTION

The present invention is directed towards embedding memory between tile arrangements of a configurable IC.

BACKGROUND OF THE INVENTION

The use of configurable integrated circuits ("IC's") has dramatically increased in recent years. One example of a configurable IC is a field programmable gate array ("FPGA"). An FPGA is a field programmable IC that usually has logic circuits, interconnect circuits, and input/output (i/o) circuits. The logic circuits (also called logic blocks) are typically arranged as an internal array of circuits. These logic circuits are connected together through numerous interconnect circuits (also called interconnects). The logic and interconnect circuits are typically surrounded by the I/O circuits.

FIG. 1 illustrates an example of a configurable logic circuit 100. This logic circuit can be configured to perform a number of different functions. As shown in FIG. 1, the logic circuit 100 receives a set of input data 105 and a set of configuration data 110. The configuration data set can be stored in a set of SRAM cells 115. From the set of functions that the logic circuit 100 can perform, the configuration data set specifies a particular function that this circuit is to perform on the input data set. Once the logic circuit performs its function on the input data set, it provides the output of this function on a set of output lines 120. The logic circuit 100 is said to be configurable, as the configuration data set "configures" the logic circuit to perform a particular function, and this configuration data set can be modified by writing new data in the SRAM cells. Multiplexers and look-up tables are two examples of configurable logic circuits.

FIG. 2 illustrates an example of a configurable interconnect circuit 200. This interconnect circuit 200 connects a set of input data 205 to a set of output data 210. This circuit receives configuration data bits 215 that are stored in a set of SRAM cells 220. The configuration bits specify how the interconnect circuit should connect the input data set to the output data set. The interconnect circuit 200 is said to be configurable, as the configuration data set "configures" the interconnect circuit to use a particular connection scheme that connects the input data set to the output data set in a desired manner. Moreover, this configuration data set can be modified by writing new data in the SRAM cells. Multiplexers are one example of interconnect circuits.

FIG. 3 illustrates a portion of a prior art configurable IC 300. As shown in this figure, the IC 300 includes an array of configurable logic circuits 305 and configurable interconnect circuits 310. The IC 300 has two types of interconnect circuits 310a and 310b. Interconnect circuits 310a connect interconnect circuits 310b and logic circuits 305, while interconnect circuits 310b connect interconnect circuits 310a to other interconnect circuits 310a. In some cases, the IC 300 includes hundreds or thousands of logic circuits 305 and interconnect circuits 310.

In some configurable IC architectures, an interconnect circuit 310b can connect to interconnect circuits 310b that are several columns or several rows away from it in the array. FIG. 4 illustrates several such connections in a prior configurable IC architecture 400. In the architecture 400, each logic circuit 305 forms a configurable computational tile 405 in conjunction with two neighboring interconnect circuits 310a and one neighboring interconnect circuit 310b. In each particular tile, each interconnect circuit 310a can receive inputs from the interconnect circuit 310b in the tile and supply a sub-set of the received input signals (e.g., one input signal) to the logic circuit 305 of the tile.

The interconnect circuits 310b in each particular tile serve as switchboxes that connect to other interconnect circuits 310b through intervening interconnect circuits 310a. As shown in FIG. 4, these switchboxes 310b can also connect to other switchboxes 310b that are two or more rows or columns away but in the same column or row. For instance, each switchbox can connect to switchboxes that are one, two, three and six rows above and below it, and to switchboxes that are one, two, three, and six columns to its right and left.

In the architecture of FIG. 4, a particular logic circuit 305 connects to logic circuits that are in the four tiles that are diagonally adjacent to the particular logic circuit's tile, through four connection boxes 310a in these tiles. For instance, FIG. 4 illustrates that the logic circuit 305 in tile 405a connects to the logic circuits 305 in tiles 405b–e through a connection box 310a in these tiles.

The advantage of the connection architecture illustrated in FIG. 4 is that it allows one computation tile to connect to another computational tile that is not a neighboring tile. On the other hand, this architecture requires the use of multiple connections to connect two tiles that are not diagonally adjacent and that are in two different rows and columns. This requirement makes the connection architecture illustrated in FIG. 4 inefficient and expensive as each connection requires the use of transistor switching logic.

Also, the connection architecture illustrated in FIG. 4 employs the same set of long connection schemes for each tile. Hence, as shown in FIG. 5, this architecture can result in a loop between two tiles 505 and 510 in the same column, or two tiles 515 and 520 in the same row. Such cycles are undesirable as they come at the expense of reachability of other tiles. The uniform connection architecture of FIG. 4 is also inefficient as it provides more ways than necessary for reaching one tile from another tile. This redundancy is illustrated in FIG. 5, which illustrates that the tile 525 can connect to tile 530 through two different sets of connections, one that goes through tile 535 and one that goes through tile 540. This redundancy is undesirable as it comes at the expense of reachability of other tiles.

Therefore, there is a need in the art for a configurable IC that has a wiring architecture that increases the interconnectivity between its configurable circuits.

SUMMARY OF THE INVENTION

Some embodiments of the invention provide a configurable IC that includes several configurable computational tiles and several memory tiles. These tiles are arranged in a particular tile arrangement. Each computational tile has a set of configurable logic circuits for configurably performing a plurality of computations and a set of configurable routing circuits. The routing circuits of the tiles configurably route signals between configurable logic circuits. The configurable IC also has several memory arrays for storing data on which the logic circuit perform computation. The memory arrays are embedded in the tile arrangement between two sets of memory tiles, where each set of memory tiles includes a set of routing circuits. In this IC, at least a first memory tile has the same set of configurable routing circuits as at least a second computational tile.

In some embodiments, each particular computational tile also includes several input-select interconnects. Each input-select interconnect is for receiving several signals and supplying a set of the received signals to a logic circuit in the particular computational tile. In these embodiments, each particular memory tile also includes several input select interconnects for receiving a plurality of signals and supplying a set of the received signals to the memory array adjacent to the particular memory tile. In these embodiments, the first memory tile has the same set of input select interconnects as the second computational tile.

Two sets of input select interconnects are defined to be the same in some cases, when the two sets includes the same number of input select interconnects and the input select interconnects receives the same number of signals. Also, in some cases, two sets of interconnects are said to be the same when the relative positions of the interconnects of one set are the same as the relative positions of the interconnects of the other set.

Some embodiments have routing circuits within a particular tile connect to the input select interconnects within the particular tile and within other tiles. In some embodiments, the connections between the routing circuits and input select interconnect in the first memory tile are identical to the connections between the routing circuits and input select interconnects in the second computational tile.

Two sets of routing circuits are said to be the same when the two sets includes the same number of routing circuits and the routing circuits receives the same number of signals. Also, in some cases, two sets of routing circuits are defined to be the same when the relative positions of the routing circuits of one set are the same as the relative positions of the routing circuits of the other set.

In some embodiments, the routing circuits form a routing network (also called a routing fabric) for routing signals between logic circuits and between logic circuits and memory arrays. The embedded memory arrays do not create a discontinuity in the routing network. For instance, the routing network in a section about the configurable IC that contains a memory array embedded adjacent to a memory tile is the same as the routing network in a section that does not contain the memory array.

BRIEF DESCRIPTION OF THE DRAWINGS

The novel features of the invention are set forth in the appended claims. However, for purpose of explanation, several embodiments of the invention are set forth in the following figures.

FIG. 26 illustrates another representation of the design of FIG. 24.

FIG. 27 illustrates a circuit representation of an interconnect/storage circuit that can be used to implement the routing multiplexer of some embodiments.

FIG. 28 illustrates an HUMUX that includes two two-to-one multiplexers, a four-to-one multiplexer, a set of input terminals, an output terminal, and a set of select terminals.

DETAILED DESCRIPTION OF THE INVENTION

Figure 1:
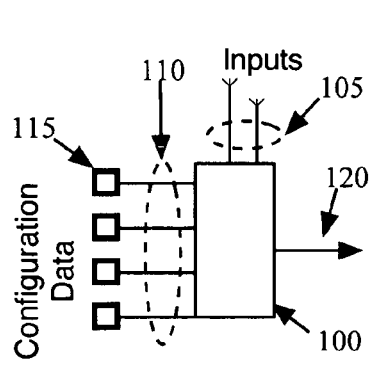
FIG. 1 illustrates an example of a configurable logic circuit.
Figure 2:
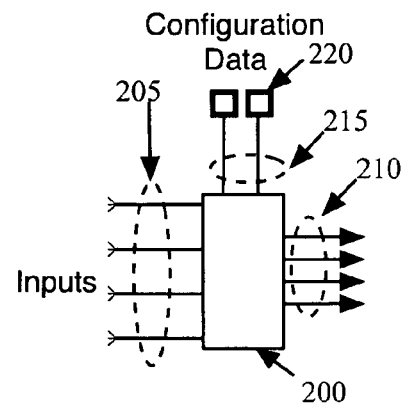
FIG. 2 illustrates an example of a configurable interconnect circuit.
Figure 3:
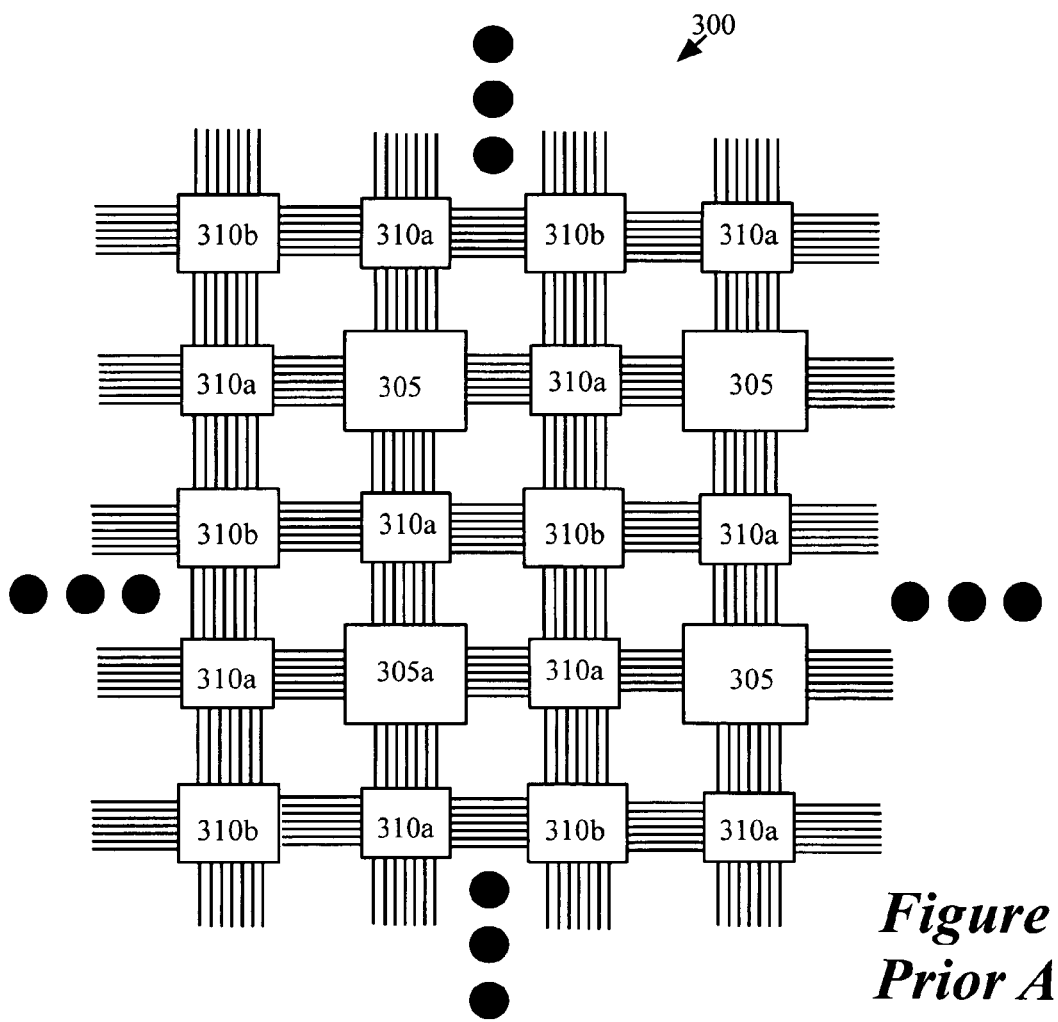
FIG. 3 illustrates a portion of a prior art configurable IC.
Figure 4:
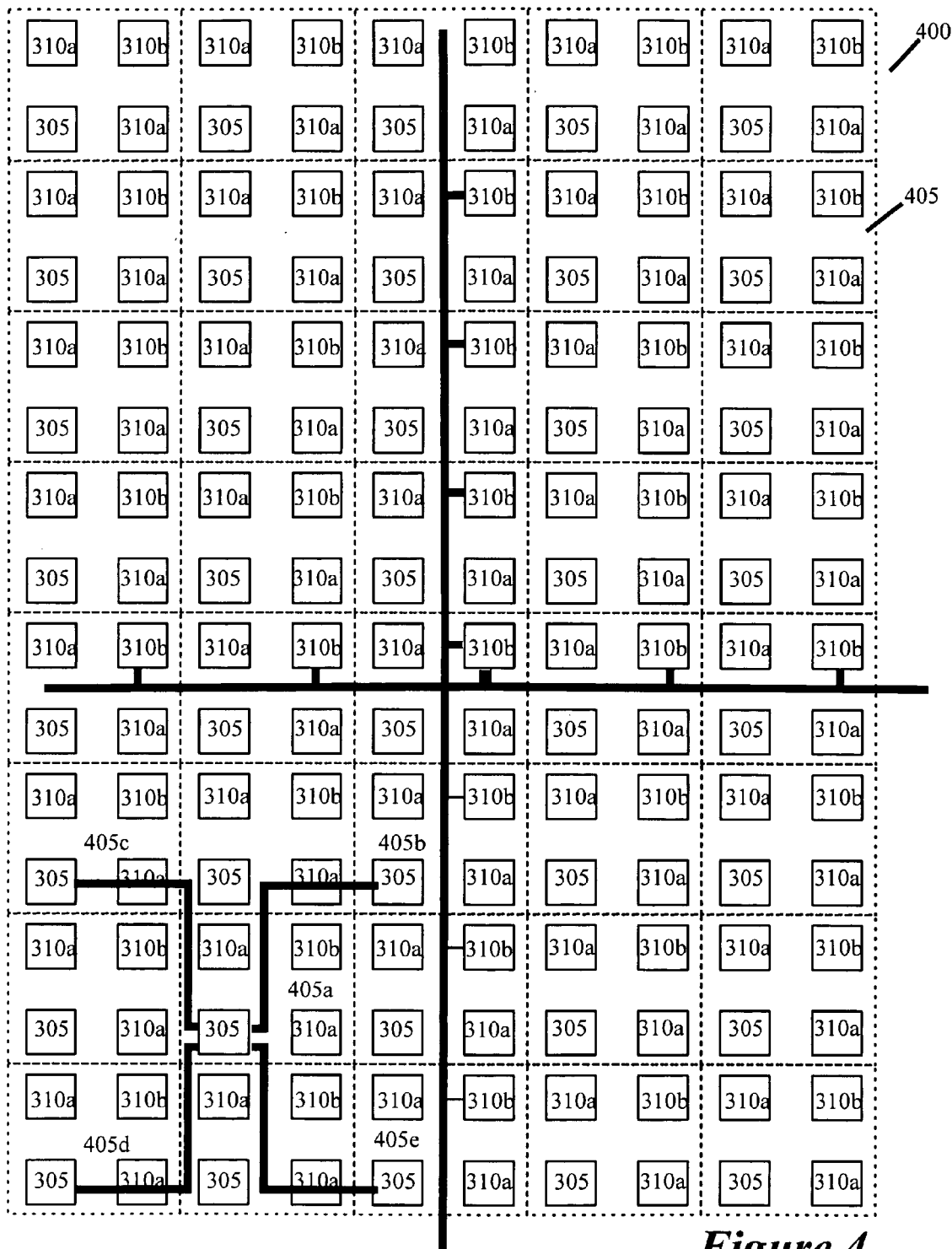
FIG. 4 illustrates several connections in a prior configurable IC architecture.
Figure 5:
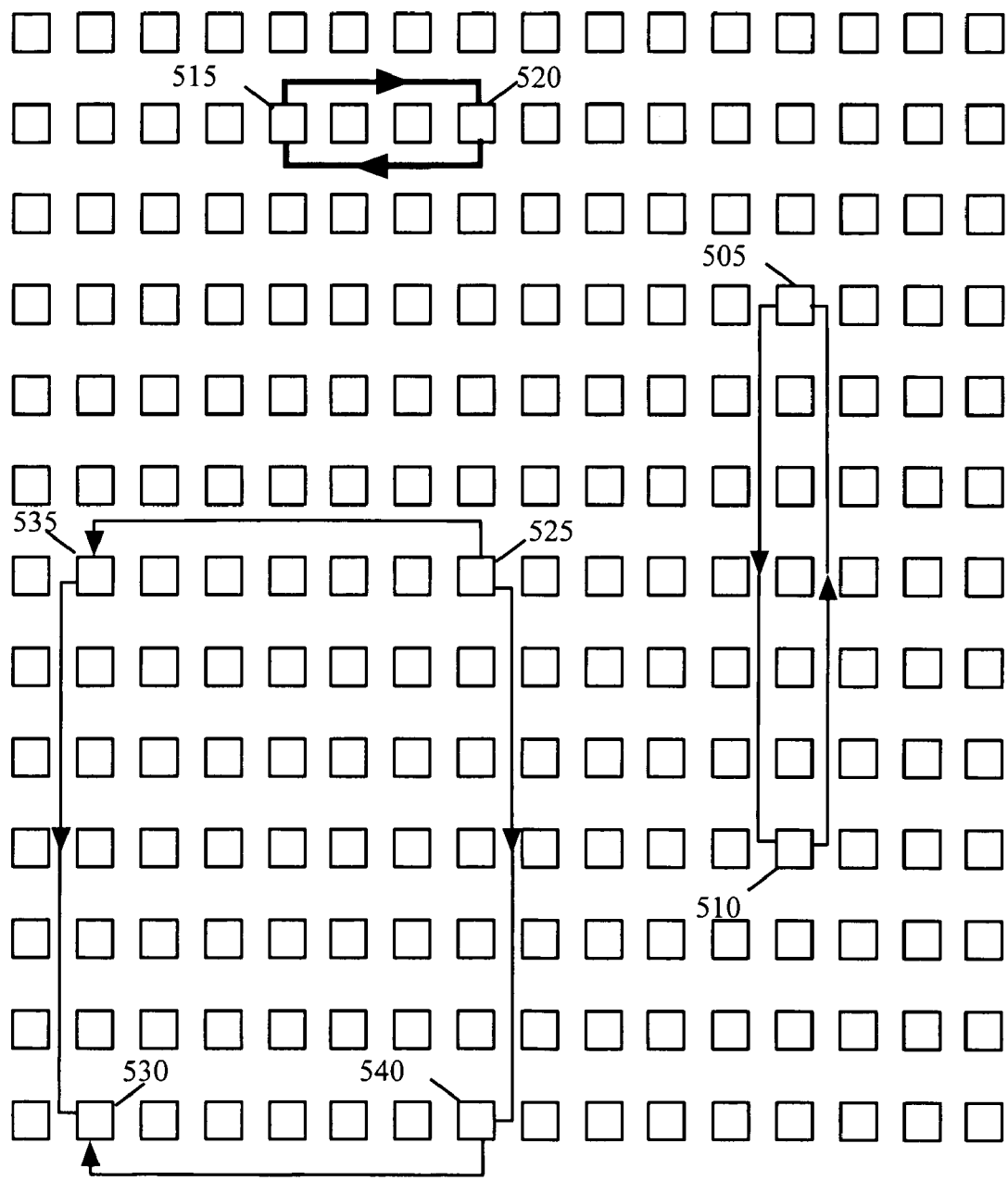
FIG. 5 illustrates an IC architecture that results in a loop between two tiles in the same column, or two tiles in the same row.

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., multiplexers) referred to below. In other instances, well-known structures and devices are shown in block diagram form in order not to obscure the description of the invention with unnecessary detail.

Some embodiments of the invention provide architectures for configurable IC's that have configurable computational units (e.g., configurable logic circuits) and configurable routing circuits for configurably routing signals between the configurable computational units. For instance, some embodiments provide a configurable IC that includes numerous configurable computational tiles (e.g., hundreds, thousands, hundreds of thousands, etc. of tiles) that are laid out on the IC according to a particular arrangement. In some embodiments, the configurable computational tiles include configurable logic circuits and configurable interconnect circuits. In other embodiments, the only configurable circuits in the configurable computational tiles are configurable logic circuits or configurable interconnect circuits.

The computational tiles in some embodiments are arranged in numerous rows and columns that form a tile array. Also, the tile arrangement in some embodiments result in one or more sets of the configurable circuits (e.g., the configurable logic circuits and/or configurable interconnect circuits) being arranged in an array with several aligned rows and columns. Alternatively, some embodiments might organize the configurable circuits in an arrangement that is not an array.

Accordingly, instead of referring to configurable circuit arrays or configurable tile arrays, the discussion below refers to configurable circuit arrangements and configurable tile arrangements. Some arrangements may have configurable circuits or tiles arranged in one or more arrays, while other arrangements may not have the configurable circuits or tiles arranged in an array. In the tile or circuit arrangement, some embodiments intersperse several other circuits, such as memory blocks, processors, macro blocks, IP blocks, SERDES controllers, clock management units, etc. Alternatively, some embodiments arrange some of these other circuits (e.g., memory blocks) within the tile structure.

Each computation tile in some embodiments includes a set of configurable logic circuits and a set of configurable routing circuits (also called configurable routing fabric or resources). In some embodiments, the set of configurable logic circuits in each computational tile includes a set of input select interconnect circuits associated with the set of configurable logic circuits.

In some embodiments, each routing interconnect circuit can receive several input signals and distribute output signals to several different types of circuits, such as input select interconnect(s) of the same computational tile, or routing and input-select interconnects of other tiles. In some embodiments, at least one routing interconnect of a particular computational tile can receive signals from, and supply signals to, only circuits outside of the particular tile. In some embodiments, one routing interconnect in a particular computational tile is not connected to any other circuit in its own tile or in any tile that neighbors its own tile. Also, routing interconnects can have fan out greater than one in some embodiments.

Alternatively, in some embodiments, the input select interconnects of a computational tile supply their output signals to only the logic circuits of the particular tile. Specifically, each input select interconnect of these embodiments receives input signals for at least one logic circuit and supplies a sub-set of the received inputs to the particular logic circuit set. In some of these embodiments, each input select interconnect of a computational tile provides its output to only one logic circuit (i.e., each such input select interconnect has a fan out of one).

In some embodiments, one or more input select interconnects of a particular computational tile directly receives input from one or more circuits outside of the particular tile. As further described below, a direct connection between two circuits is an electrical connection between the two circuits that is achieved by (1) a set of wire segments that traverse through a set of the wiring layers of the IC, and (2) a set of vias when two or more wiring layers are involved. In some embodiments, a direct connection between two circuits might also include a set of buffer circuits.

Through its direct connections with circuits outside of its particular computational tile, a particular computational tile's input select interconnects can receive input signals from the circuits outside of the particular tile, and pass a set of these received signals to a logic circuit in the particular computational tile. In some of these embodiments, the particular computational tile's input select interconnects have direct connections with circuits in tiles that are several tiles away from the particular tile. In some of these embodiments, one or more of these other tiles are not vertically or horizontally aligned with the particular computational tile in the tile arrangement. In other words, some embodiments have several long direct offset connections for connecting the inputs of some input select interconnects with circuits that are in computational tiles that are offset from the particular computational tile by several rows and/or columns.

Some embodiments also have several offset connections between interconnects in different computational tiles. For instance, in some embodiments, the output of a routing interconnect in a particular computational tile can be supplied through an offset connection to the input of the routing interconnect of another computational tile. Such an offset connect can also be used to provide the output of a routing interconnect in one computational tile to the input select interconnect in another computational tile. Some embodiments use long offset connections to connect two interconnects that are neither in neighboring computational tiles, nor in vertically or horizontally aligned computational tiles. Some embodiments also use a long offset connection to provide the output of logic circuits to circuits that are in offset computational tiles that do not neighbor the computational tiles of the logic circuits.

The use of direct offset connections in the configurable IC of some embodiments increases the interconnectivity between the circuits of the configurable IC. In addition to computational tiles, some embodiments include other types of tiles (e.g., tiles that embed memory arrays) that do not include some or all of the circuits of a computational tile. In some embodiments, these other tiles connect to each other and/or to computational tiles in the same manner as was described above for connections between computational tiles. The configurable IC of some embodiments is a reconfigurable IC. In some of these embodiments, the reconfigurable IC is a sub-cycle reconfigurable IC.

Several more detailed embodiments of the invention are described in Sections II–X of the detailed description. However, before this description, several terms and concepts are discussed in Section I.

I. Terms and Concepts

A. Direct Connections Between Circuits

Several figures below illustrate several direct connections between circuits in a configurable circuit arrangement. A direct connection between two circuits in an arrangement is an electrical connection between the two circuits that is achieved by (1) a set of wire segments that traverse through a set of the wiring layers of the IC, and (2) a set of vias when two or more wiring layers are involved.

Figure 6:
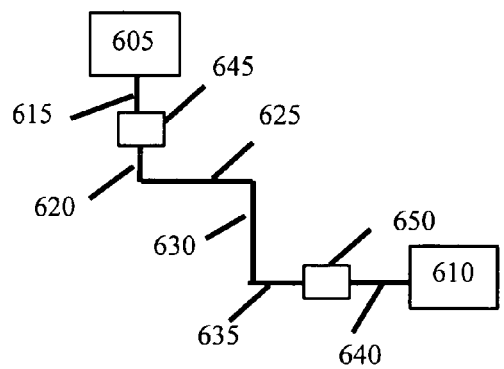
FIG. 6 illustrates an example of a direct connection where all the wire segments that establish a direct connection are on the same layer.

FIGS. 6–9 illustrate several examples of direct connections between two circuits. These examples illustrate actual geometric realization of the direct connections. FIG. 6 illustrates a case where all the wire segments that establish a direct connection are on the same layer. Specifically, this figure illustrates four wire segments 620, 625, 630, and 635 that establish the direct connection between circuits 605 and 610, which are offset in the circuit arrangement of a configurable IC. These four segments might be on a layer (e.g., the second wiring layer) that is different from the layer (e.g., the first wiring layer) that has the input/output terminals 615 and 640 of the circuits 605 and 610. Hence, in these cases, the direct connection between the circuits 605 and 610 also require a set of vias 645 and 650 to connect the wire segments 620 and 635 to the terminals 615 and 640.

Figure 7:
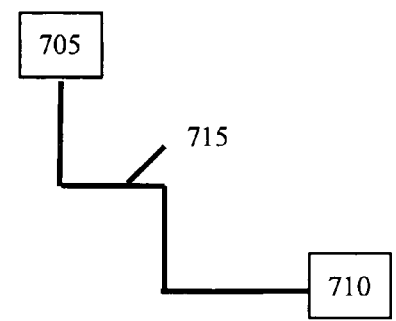
FIG. 7 illustrates an example of a direct connection where the connecting wire segments and the terminals of the connected circuits are all on the same layer.
Figure 8:
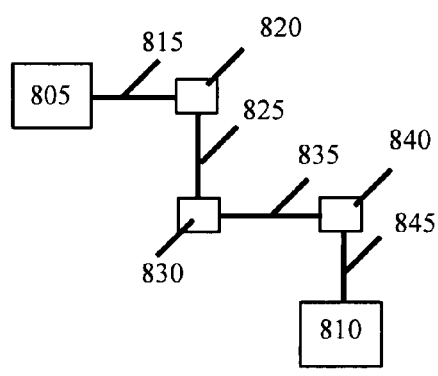
FIG. 8 illustrates an example of a direct connection where the set of wire segments that establish the direct connection between two circuits are on several wiring layers.

FIG. 7 illustrates an example were the connecting wire segments 715 and the terminals of the connected circuits 705 and 710 are all on the same layer. Alternatively, FIG. 8 illustrates a case where the set of wire segments that establish a direct connection between two circuits are on several wiring layers. In this example, a direct connection is established between the two circuits 805 and 810 by (1) a vertical segment 825 (e.g., a segment in the y-direction on layer 2) that connects to a horizontal terminal 815 (e.g., a segment in the x-direction on layer 1) of the circuit 805 through a via connection 820, and (2) a horizontal segment 835 (on layer 3) that connects to a vertical terminal 845 (on layer 1) of the circuit 810 through a stacked via connection 840. The horizontal segment 835 also connects to the vertical segment 825 through a via connection 830.

Figure 9:
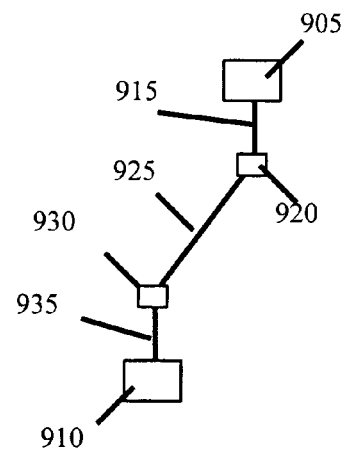
FIG. 9 illustrates an example of a direct connection between two circuits established by one or more diagonal wire segments possibly in conjunction with one or more Manhattan (i.e., horizontal or vertical) segments.

When the IC uses a wiring model that allows occasional or systematic diagonal wiring, a direct connection between two circuits can be established by one or more diagonal wire segments possibly in conjunction with one or more Manhattan (i.e., horizontal or vertical) segments. FIG. 9 illustrates an example of such a direct connection. Specifically, this figure illustrates a 60° diagonal segment 925 (e.g., on a third wiring layer) that connects to the vertical terminal 915 (on layer 1) of circuit 905 and the vertical terminal 935 (on layer 1) of circuit 910 through stacked via connections 920 and 930.

The direct connection illustrated in FIGS. 7–9 are examples of built-in turns used by some embodiments of the invention. Built-in turns allow two offset circuits to be connected by relying on wiring architecture that reduces the number of interconnect circuits necessary for establishing the connection between the two circuits. Built-in turns are further described in U.S. patent application Ser. No. 10/882,845, entitled "Configurable Integrated Circuit with Built-In Turns", and filed Jun. 30, 2004.

Figure 10:
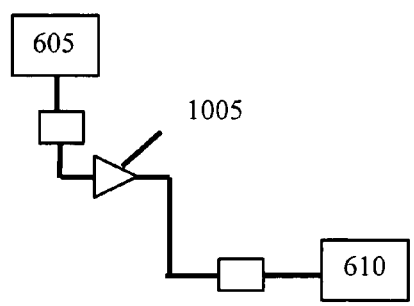
FIG. 10 illustrates an example of using one buffer circuit in the direct connection between circuits.
Figure 11:
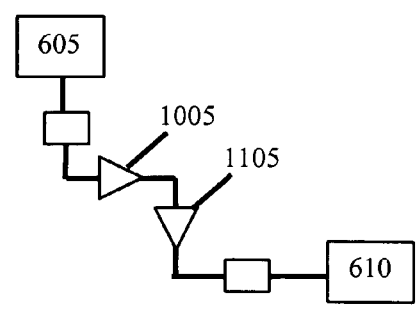
FIG. 11 illustrates an example of using two buffer circuits in the direct connection between circuits.

In some embodiments, a direct connection between two circuits in an arrangement might also include a set of buffer circuits in some cases. In other words, two circuits are connected in some embodiments by a set of wire segments that possibly traverse through a set of buffer circuits and a set of vias. Buffer circuits are not interconnect circuits or configurable logic circuits. In some embodiments, buffer circuits are part of some or all connections. Buffer circuits might be used to achieve one or more objectives (e.g., maintain the signal strength, reduce noise, alter signal delay, etc.) along the wire segments that establish the direct connections. Inverting buffer circuits may also allow an IC design to reconfigure logic circuits less frequently and/or use fewer types of logic circuits. In some embodiments, buffer circuits are formed by one or more inverters (e.g., two or more inverters that are connected in series). FIGS. 10 and 11 illustrate examples of using one or two buffer circuits 1005 and 1105 in the direct connection between circuits 605 and 610 of FIG. 6.

Alternatively, the intermediate buffer circuits between the logic and/or interconnect circuits can be viewed as a part of the devices illustrated in these figures. For instance, the inverters that can be placed after the devices 605 and 610 can be viewed as being part of these devices. Some embodiments use such inverters in order to allow an IC design to reconfigure logic circuits less frequently and/or use fewer types of logic circuits.

Several figures below "topologically" illustrate several direct connections between circuits in an arrangement. A topological illustration is an illustration that is only meant to show a direct connection between two circuits without specifying a particular geometric layout for the wire segments that establish the direct connection.

B. Configurable and Reconfigurable IC's

A configurable IC is an IC that has configurable circuits. In some embodiments, a configurable IC includes configurable computational circuits (e.g., configurable logic circuits) and configurable routing circuits for routing the signals to and from the configurable computation units. In addition to configurable circuits, a configurable IC also typically includes non-configurable circuits (e.g., non-configurable logic circuits, interconnect circuits, memories, etc.).

A configurable circuit is a circuit that can "configurably" perform a set of operations. Specifically, a configurable circuit receives "configuration data" that specifies the operation that the configurable circuit has to perform in the set of operations that it can perform. In some embodiments, configuration data is generated outside of the configurable IC. In these embodiments, a set of software tools typically converts a high-level IC design (e.g., a circuit representation or a hardware description language design) into a set of configuration data that can configure the configurable IC (or more accurately, the configurable IC's configurable circuits) to implement the IC design.

Examples of configurable circuits include configurable interconnect circuits and configurable logic circuits. A logic circuit is a circuit that can perform a function on a set of input data that it receives. A configurable logic circuit is a logic circuit that can be configured to perform different functions on its input data set.

Figure 12:
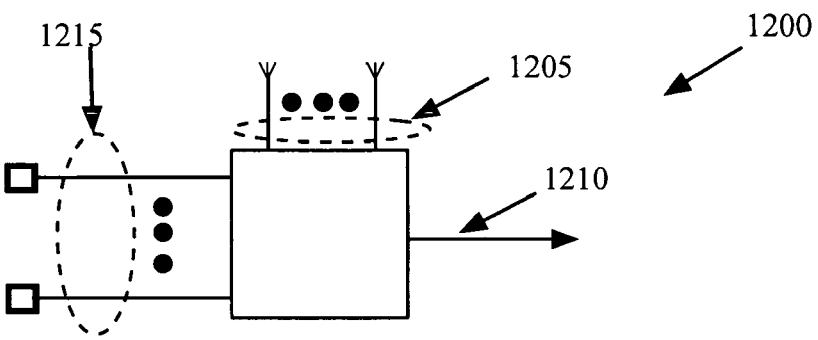
FIG. 12 illustrates an example of a configurable logic circuit that can perform a set of functions.

FIG. 12 illustrates an example of a configurable logic circuit 1200 that can perform a set of functions. As shown in this figure, the logic circuit 1200 has a set of input terminals 1205, a set of output terminals 1210, and a set of configuration terminals 1215. The logic circuit 1200 receives a set of configuration data along its configuration terminals 1215. Based on the configuration data, the logic circuit performs a particular function within its set of functions on the input data that it receives along its input terminals 1205. The logic circuit then outputs the result of this function as a set of output data along its output terminal set 1210. The logic circuit 1200 is said to be configurable as the configuration data set "configures" the logic circuit to perform a particular function.

Figure 13:
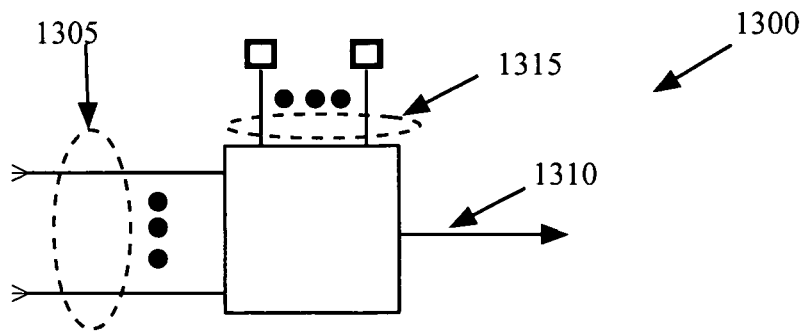
FIG. 13 illustrates an example of a configurable interconnect circuit.

A configurable interconnect circuit is a circuit that can configurably connect an input set to an output set in a variety of ways. FIG. 13 illustrates an example of a configurable interconnect circuit 1300. This interconnect circuit 1300 connects a set of input terminals 1305 to a set of output terminals 1310, based on a set of configuration data 1315 that the interconnect circuit receives. In other words, the configuration data specify how the interconnect circuit should connect the input terminal set 1305 to the output terminal set 1310. The interconnect circuit 1300 is said to be configurable as the configuration data set "configures" the interconnect circuit to use a particular connection scheme that connects the input terminal set to the output terminal set in a desired manner.

An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). In other words, the interconnect circuit of some embodiments implements a logic inversion operation in conjunction to its connection operation. Other embodiments, however, do not build such an inversion operation in some or all of their interconnect circuits.

Figure 14:
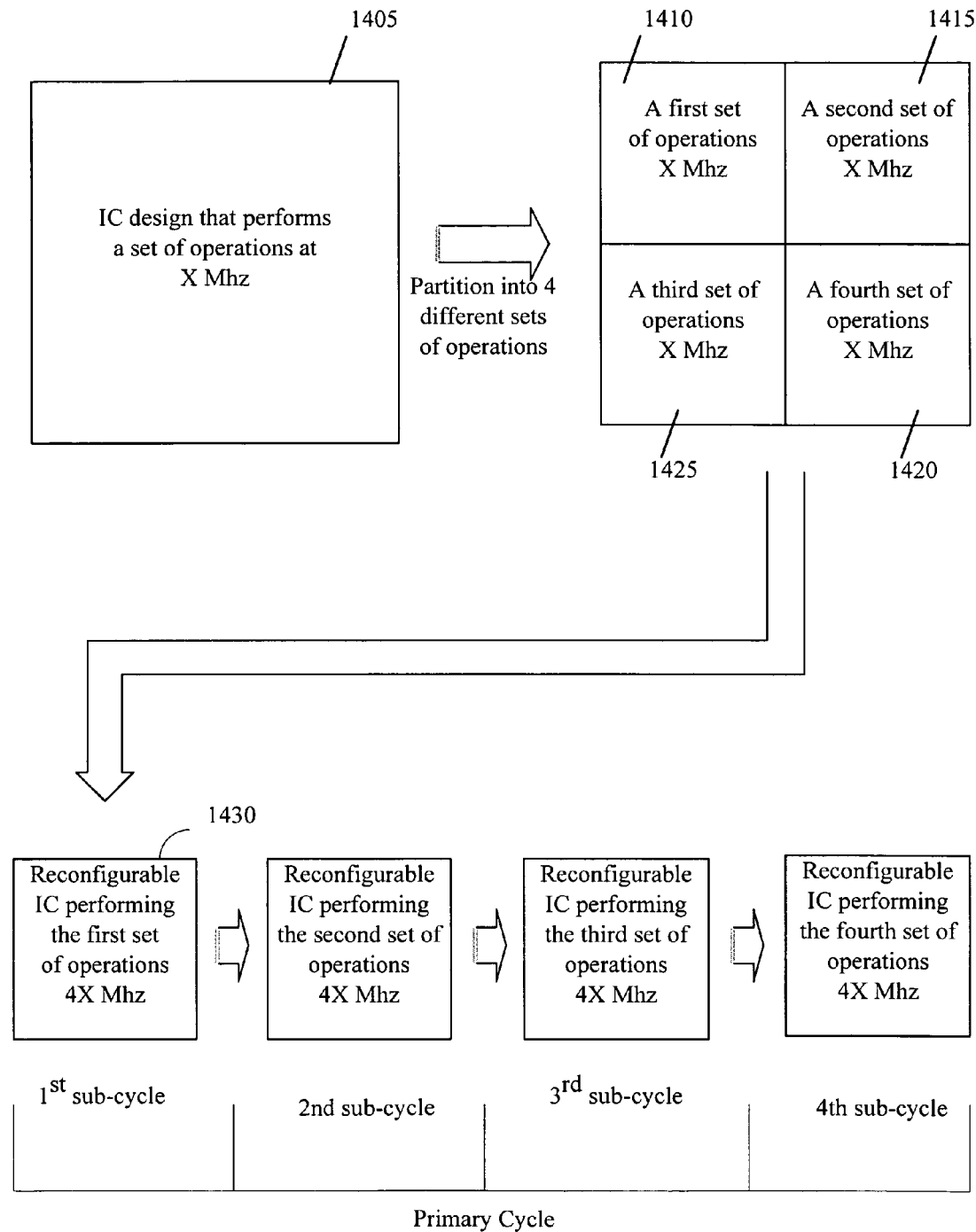
FIG. 14 illustrates an example of a sub-cycle reconfigurable IC.

Reconfigurable IC's are one type of configurable IC's. Specifically, reconfigurable IC's are configurable IC's that can reconfigure during runtime. FIG. 14 conceptually illustrates an example of a sub-cycle reconfigurable IC (i.e., an IC that is reconfigurable on a sub-cycle basis). In this example, the sub-cycle reconfigurable IC implements an IC design 1405 that operates at a clock speed of X MHz. Typically, an IC design is initially specified in a hardware description language (HDL), and a synthesis operation is used to convert this HDL representation into a circuit representation. After the synthesis operation, the IC design includes numerous electronic circuits, which are referred to below as "components." As further illustrated FIG. 14, the operations performed by the components in the IC design 1405 can be partitioned into four sets of operations 1410–1425, with each set of operations being performed at a clock speed of X MHz.

FIG. 14 then illustrates that these four sets of operations 1410–1425 can be performed by one sub-cycle reconfigurable IC 1430 that operates at 4× MHz. In some embodiments, four cycles of the 4× MHz clock correspond to four sub-cycles within a cycle of the X MHz clock. Accordingly, this figure illustrates the reconfigurable IC 1430 reconfiguring four times during four cycles of the 4× MHz clock (i.e., during four sub-cycles of the X MHz clock). During each of these reconfigurations (i.e., during each sub-cycle), the reconfigurable IC 1430 performs one of the identified four sets of operations. In other words, the faster operational speed of the reconfigurable IC 1430 allows this IC to reconfigure four times during each cycle of the X MHz clock, in order to perform the four sets of operations sequentially at a 4× MHz rate instead of performing the four sets of operations in parallel at an X MHz rate.

A reconfigurable IC typically includes reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it bases its operation on a different set of configuration data.

Figure 15:
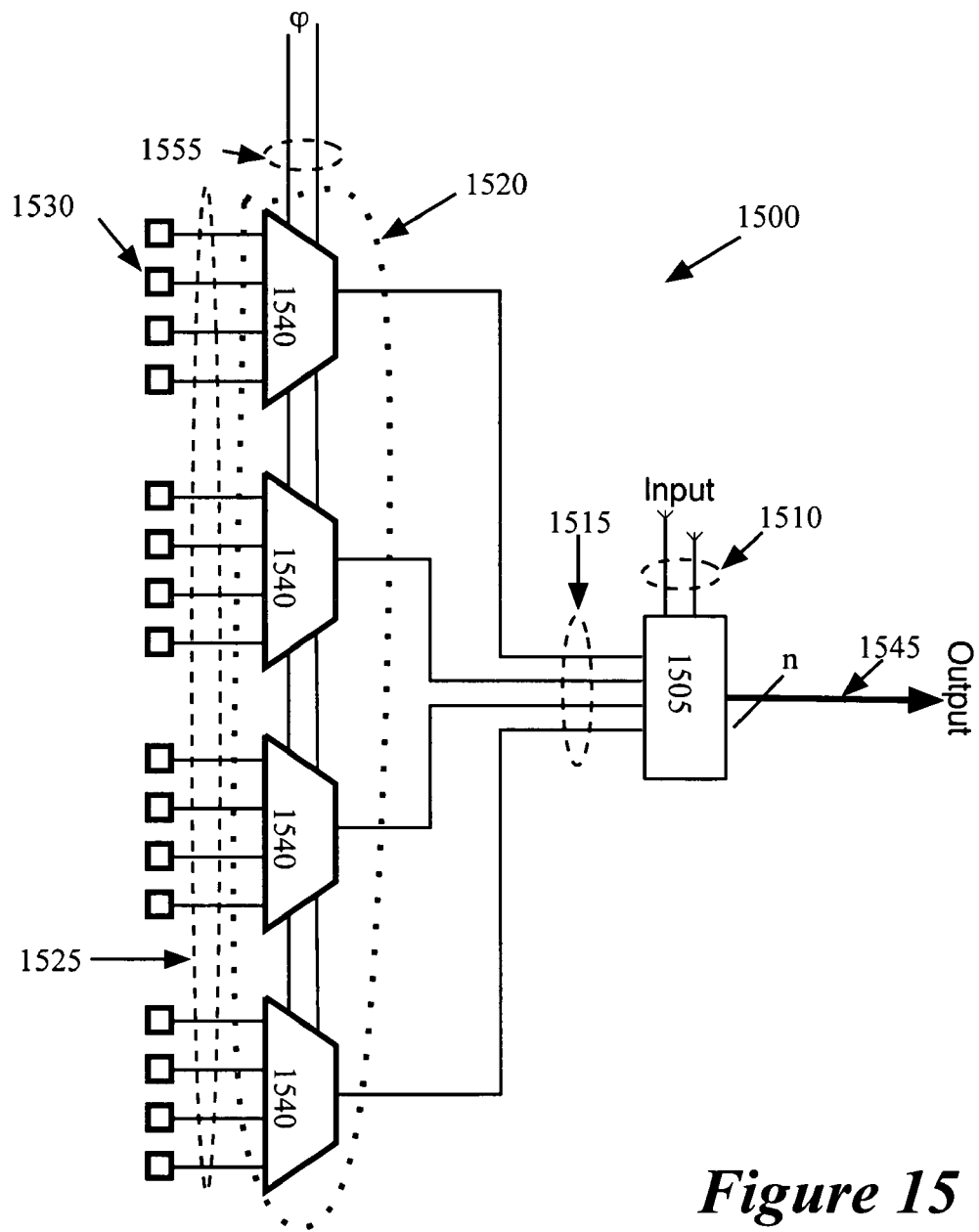
FIG. 15 illustrates an example of a reconfigurable logic circuit.

FIG. 15 illustrates an example of a reconfigurable logic circuit 1500. This logic circuit includes a core logic circuit 1505 that can perform a variety of functions on a set of input data 1510 that it receives. The core logic circuit 1505 also receives a set of four configuration data bits 1515 through a switching circuit 1520, which in this case is formed by four four-to-one multiplexers 1540. The switching circuit receives a larger set of sixteen configuration data bits 1525 that, in some cases, are stored in a set of storage elements 1530 (e.g., a set of memory cells, such as SRAM cells). This switching circuit is controlled by a two-bit reconfiguration signal φ through two select lines 1555. Whenever the reconfiguration signal changes, the switching circuit supplies a different set of four configuration data bits to the core logic circuit 1505. The configuration data bits then determine the function that the logic circuit 1505 performs on its input data. The core logic circuit 1505 then outputs the result of this function on the output terminal set 1545.

Any number of known logic circuits (also called logic blocks) can be used in conjunction with the invention. Examples of such known logic circuits include look-up tables (LUT's), universal logic modules (ULM's), sub-ULM's, multiplexers, and PAL's/PLA's. In addition, logic circuits can be complex logic circuits formed by multiple logic and interconnect circuits. Examples of simple and complex logic circuits can be found in Architecture and CAD for Deep-Submicron FPGAs, Betz, et al., ISBN 0792384601, 1999; and in Design of Interconnection Networks for Programmable Logic, Lemieux, et al., ISBN 1-4020-7700-9, 2003. Other examples of reconfigurable logic circuits are provided in U.S. patent application Ser. No. 10/882,583, entitled "Configurable Circuits, IC's, and Systems," filed on Jun. 30, 2004. This Application is incorporated in the present application by reference.

Figure 16:
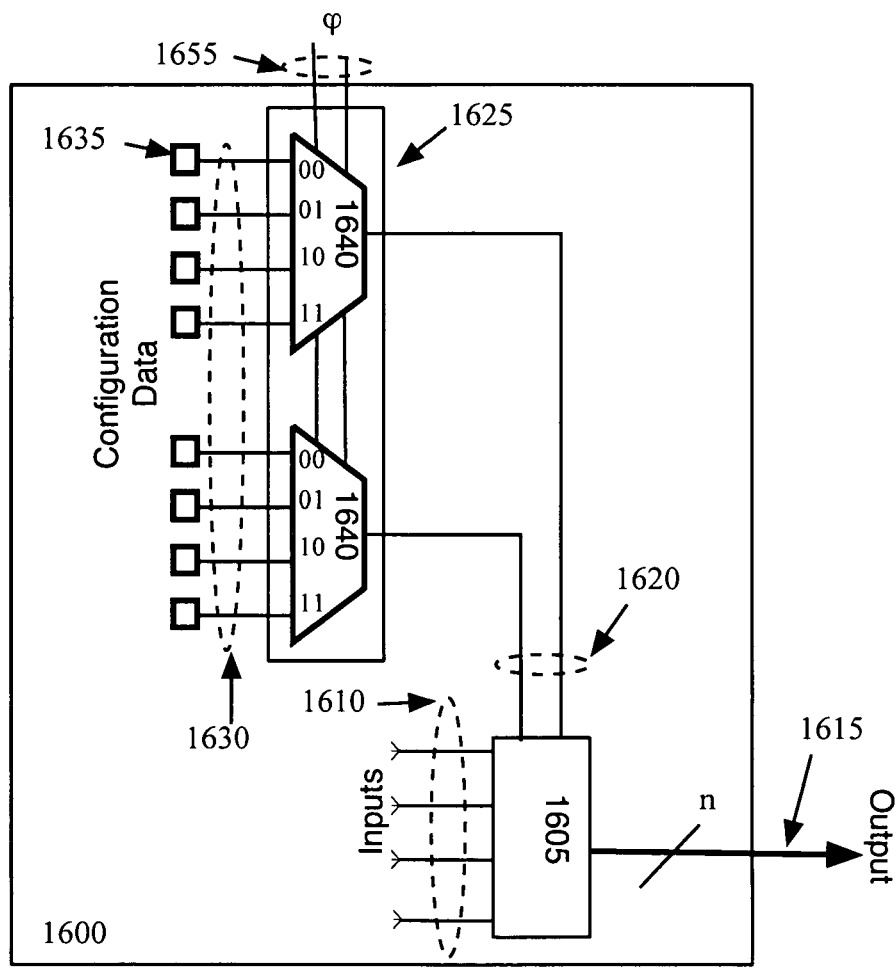
FIG. 16 illustrates an example of a reconfigurable interconnect circuit.

FIG. 16 illustrates an example of a reconfigurable interconnect circuit 1600. This interconnect circuit includes a core interconnect circuit 1605 that connects input data terminals 1610 to an output data terminal set 1615 based on a configuration data set 1620 that it receives from a switching circuit 1625, which in this example is formed by two four to one multiplexers 1640. The switching circuit 1625 receives a larger set of configuration data bits 1630 that, in some embodiments, are stored in a set of storage elements 1635 (e.g., a set of memory cells, such as SRAM cells). This switching circuit is controlled by a two-bit reconfiguration signal φ through two select lines 1655. Whenever the reconfiguration signal changes, the switching circuit supplies a different set of two configuration data bits to the core interconnect circuit 1605. The configuration data bits then determine the connection scheme that the interconnect circuit 1605 uses to connect the input and output terminals 1610 and 1615.

Any number of known interconnect circuits (also called interconnects or programmable interconnects) can be used in conjunction with the invention. Examples of such interconnect circuits include switch boxes, connection boxes, switching or routing matrices, full- or partial-cross bars, etc. Such interconnects can be implemented by using a variety of known techniques and structures. Examples of interconnect circuits can be found in Architecture and CAD for Deep-Submicron FPGAs, Betz, et al., ISBN 0792384601, 1999, and in Design of Interconnection Networks for Programmable Logic, Lemieux, et al., ISBN 1-4020-7700-9, 2003. Other examples of reconfigurable interconnect circuits are provided in the U.S. patent application Ser. No. 10/882,583.

As mentioned above, the logic and interconnect circuits 1500 and 1600 each receive a reconfiguration signal φ. In some embodiments, this signal is a sub-cycle signal that allows the circuits 1500 and 1600 to reconfigure on a sub-cycle basis; i.e., to reconfigure one or more times within a cycle of a primary clock. The primary clock might be a design clock that is specified by a design (e.g., it is specified by the design in the RTL or a hardware description language (HDL)), or an interface clock that defines an i/o rate.

Several novel techniques for distributing reconfiguration clocking signals φ are described in U.S. patent application entitled "Configurable IC with Interconnect Circuits that also Perform Storage Operations", which is filed concurrently with the present application, with the Ser. No. 11/081,859. This application is incorporated herein by reference. In conjunction with these clock distribution techniques, this application discloses several novel circuits for supplying configuration data to configurable circuits on a sub-cycle basis, based on the distributed clock signals.

II. Configurable IC Architecture with Long Offset Direct Connections

Figure 17:
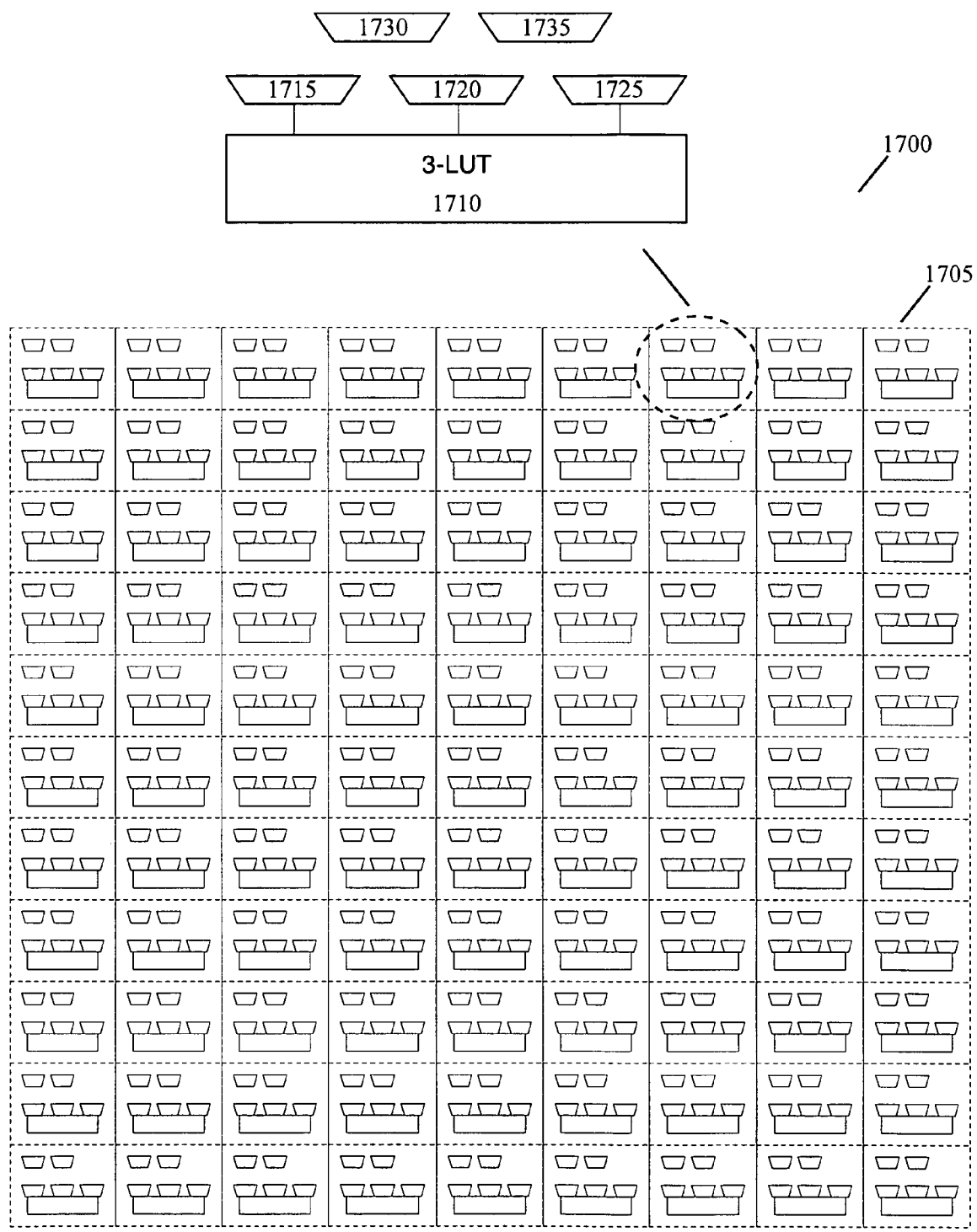
FIG. 17 illustrates an IC architecture that is formed by numerous rectangular configurable tiles that are arranged in an array with multiple rows and columns.

FIGS. 17–22 illustrate one example of the invention's architecture for a configurable or reconfigurable IC. As shown in FIG. 17, this architecture is formed by numerous rectangular configurable tiles 1705 that are arranged in an array with multiple rows and columns. One of ordinary skill will realize that in other embodiments the tiles can have different shapes and can arranged the configurable tiles in other arrangements (e.g., the tiles might not have rectangular shapes in some embodiments).

In FIGS. 17–22, each configurable tile includes a three-input logic circuit 1710, three input-select interconnects 1715, 1720, and 1725, and two routing interconnects 1730 and 1735. As further described below, other configurable tiles can include other types of circuits, such as memory arrays instead of logic circuits.

In the arrangement 1700 of FIG. 17, the logic circuit 1710 in each tile is a LUT, and the interconnect circuits are multiplexers. Other embodiments, however, might use other logic and/or interconnect circuits instead of or in conjunction with the LUT's and multiplexers. An input-select interconnect in some embodiments is an interconnect that has a fan out of one (i.e., its output is only provided to one circuit). In the arrangement 1700, a particular tile's input-select multiplexer (IMUX) is a multiplexer that supplies one input signal of the three-input LUT 1710 in the particular tile. In other words, in the arrangement 1700, an input select multiplexer receives several input signals for the LUT 1710 in its tile, and passes one of these input signals to its LUT.

A routing multiplexer (RMUX) in the arrangement 1700 is an interconnect circuit that can receive signals from and supply signals to interconnect and logic circuits in other tiles in the arrangement. Unlike an input select multiplexer that only provides its output to a single logic circuit (i.e., that only has a fan out of one), a routing multiplexer in some embodiments either provides its output to several logic and/or interconnect circuits (i.e., has a fan out greater than one), or provides its output to other interconnect circuits.

The arrangement 1700 of FIG. 17 includes numerous long offset direct connections that allow an input-select or routing multiplexer in a particular tile to receive directly signals from a routing multiplexer or a logic circuit of another tile that (1) is not a neighbor of the particular tile, and (2) is not in the same row or column in the arrangement 1700 as the particular tile. Each such direct connection provides the output of a routing multiplexer or logic circuit in a first particular tile to a multiplexer (IMUX or RMUX) of a second particular tile that is separated from the first particular tile in the array either (1) by more than one row and at least one column, or (2) by more than one column and at least one row.

For the arrangement 1700, FIGS. 18–22 illustrate one example of a direct connection scheme with numerous such direct long offset direct connections. This direct connection scheme is shown for connecting the multiplexers of one tile with the LUT's and multiplexers of other tiles. This same direct connection scheme can be used for all tiles in the array, with the exception the certain provisions need to be made for tiles on or close to the boundary of the array.

Figure 18:
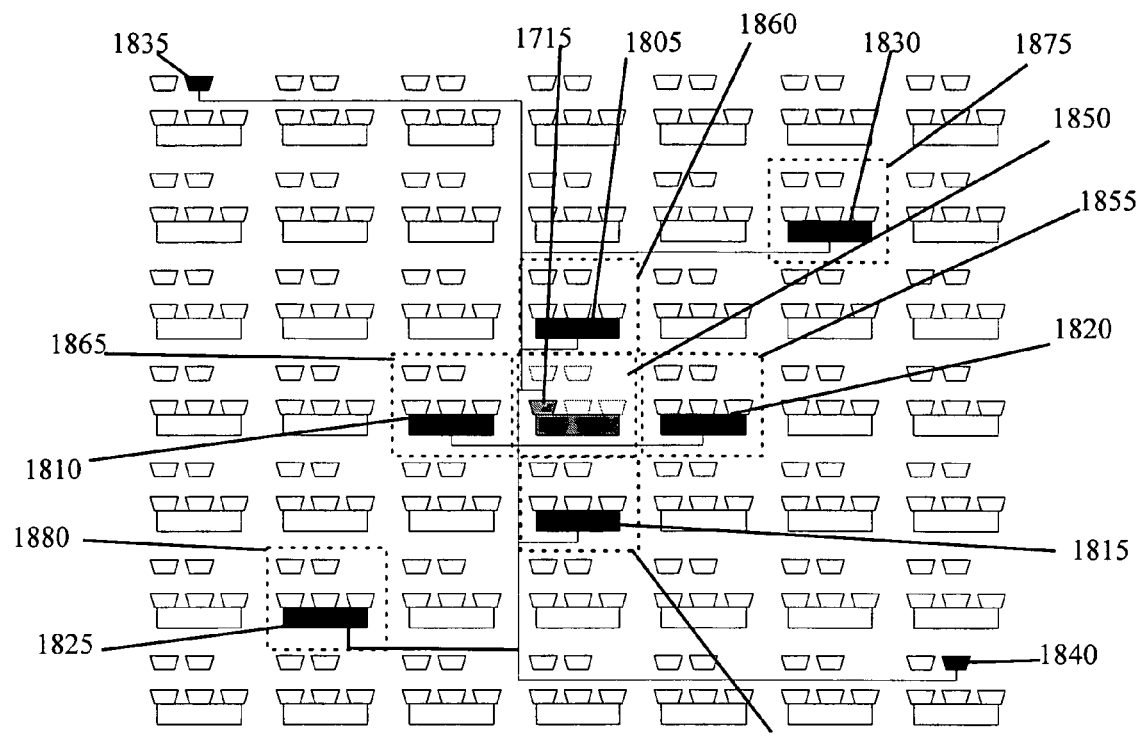
FIG. 18 illustrates a first input select multiplexer connected to four neighboring LUT's, two offset LUT'S, and two offset routing multiplexers.
Figure 19:
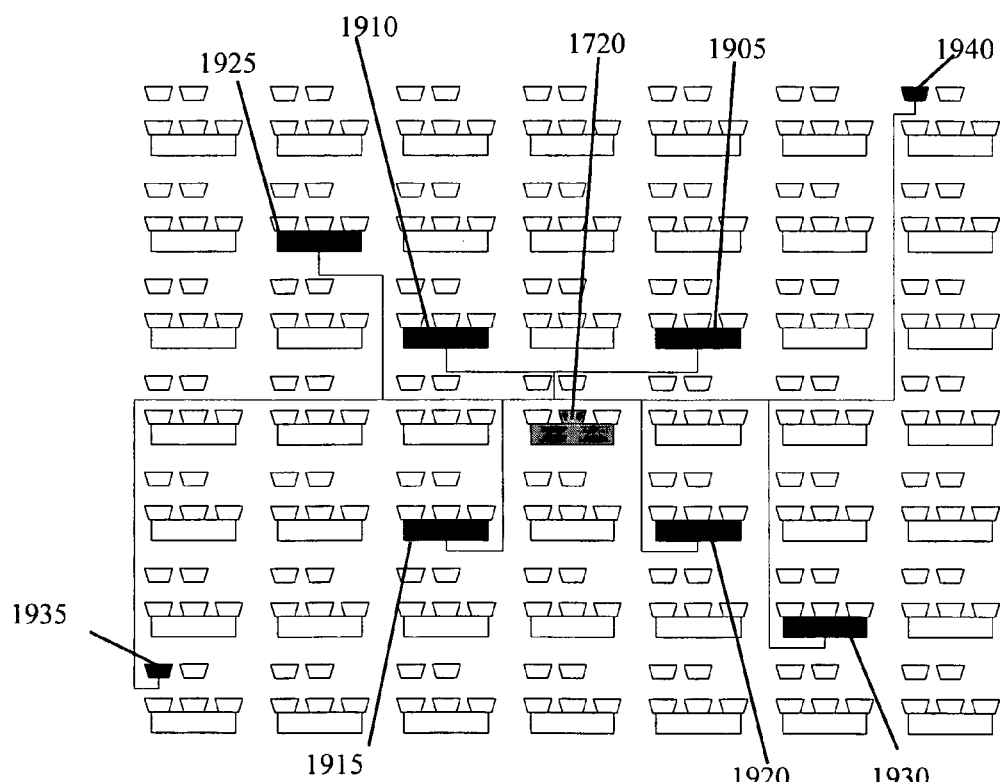
FIG. 19 illustrates a second input select multiplexer connected to four neighboring offset LUT's, two other offset LUT's, and two offset routing multiplexers.

FIG. 18 illustrates that the first input select multiplexer 1715 connects to four neighboring LUT's 1805, 1810, 1815, and 1820, two offset LUT's 1825 and 1830, and two offset routing multiplexers 1835 and 1840. FIG. 19 illustrates that the second input select multiplexer 1720 connects to four neighboring offset LUT's 1905, 1910, 1915, and 1920, two other offset LUT's 1925 and 1930, and two offset routing multiplexers 1935 and 1940.

Figure 20:
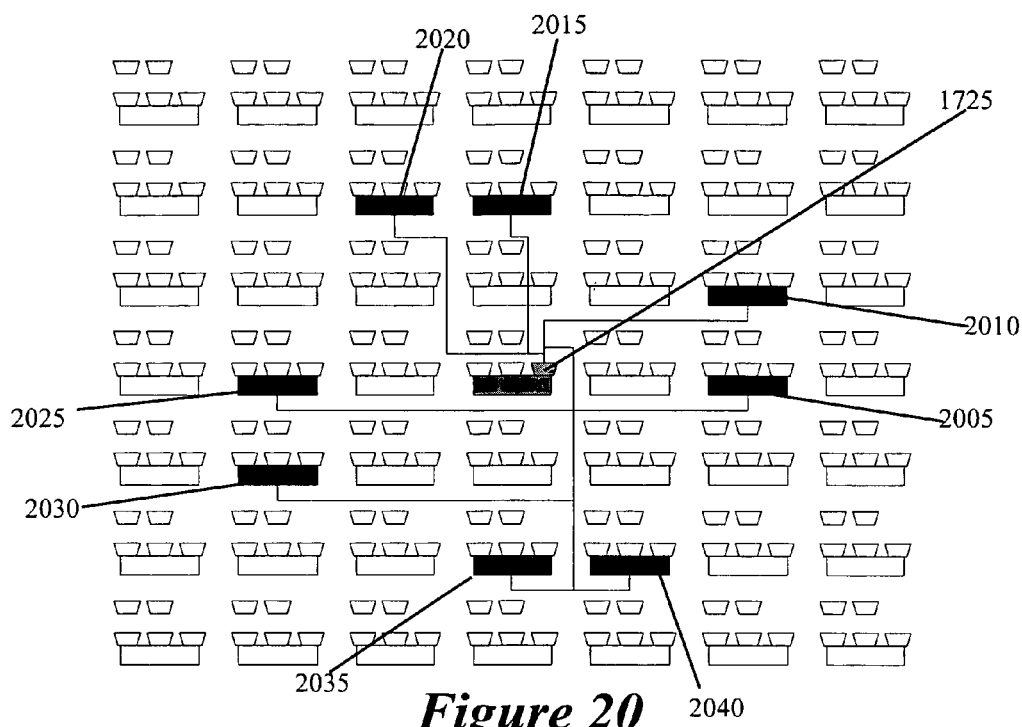
FIG. 20 illustrates a third input select multiplexer connected to eight neighboring offset LUT's.
Figure 21:
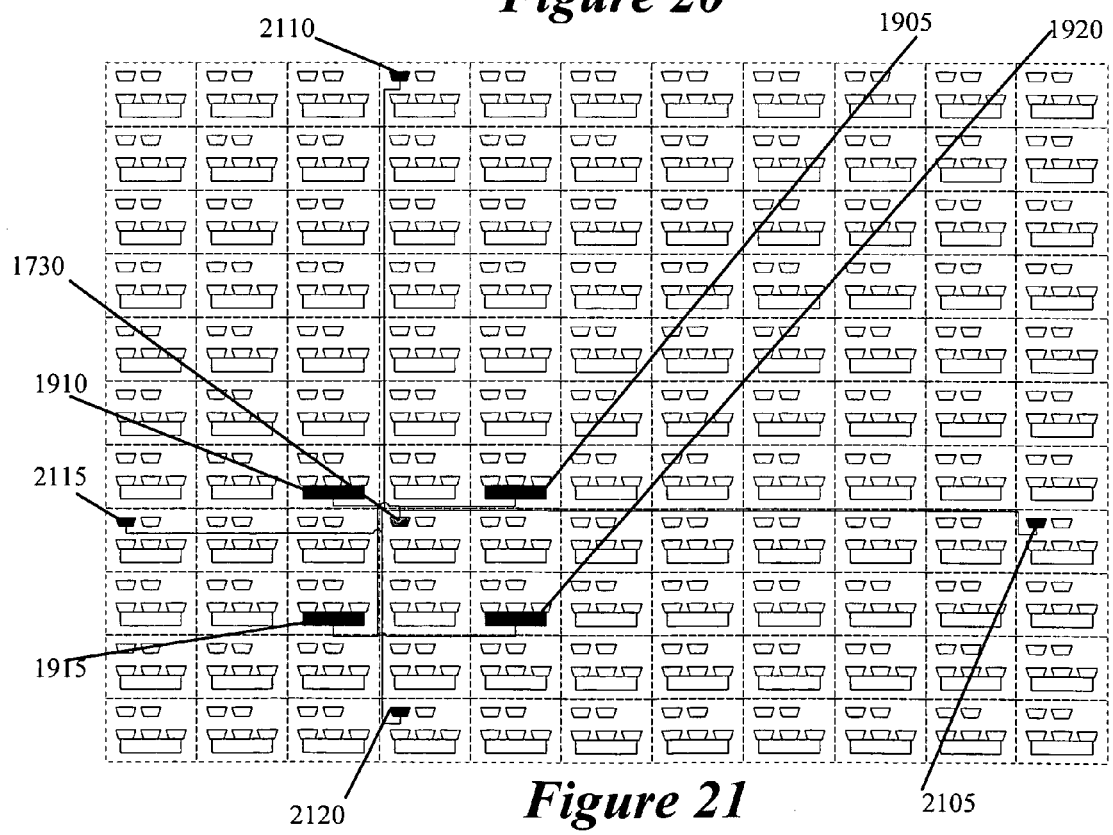
FIG. 21 illustrates a first routing multiplexer connected to four neighboring LUT's and to four horizontally or vertically aligned routing multiplexers.
Figure 22:
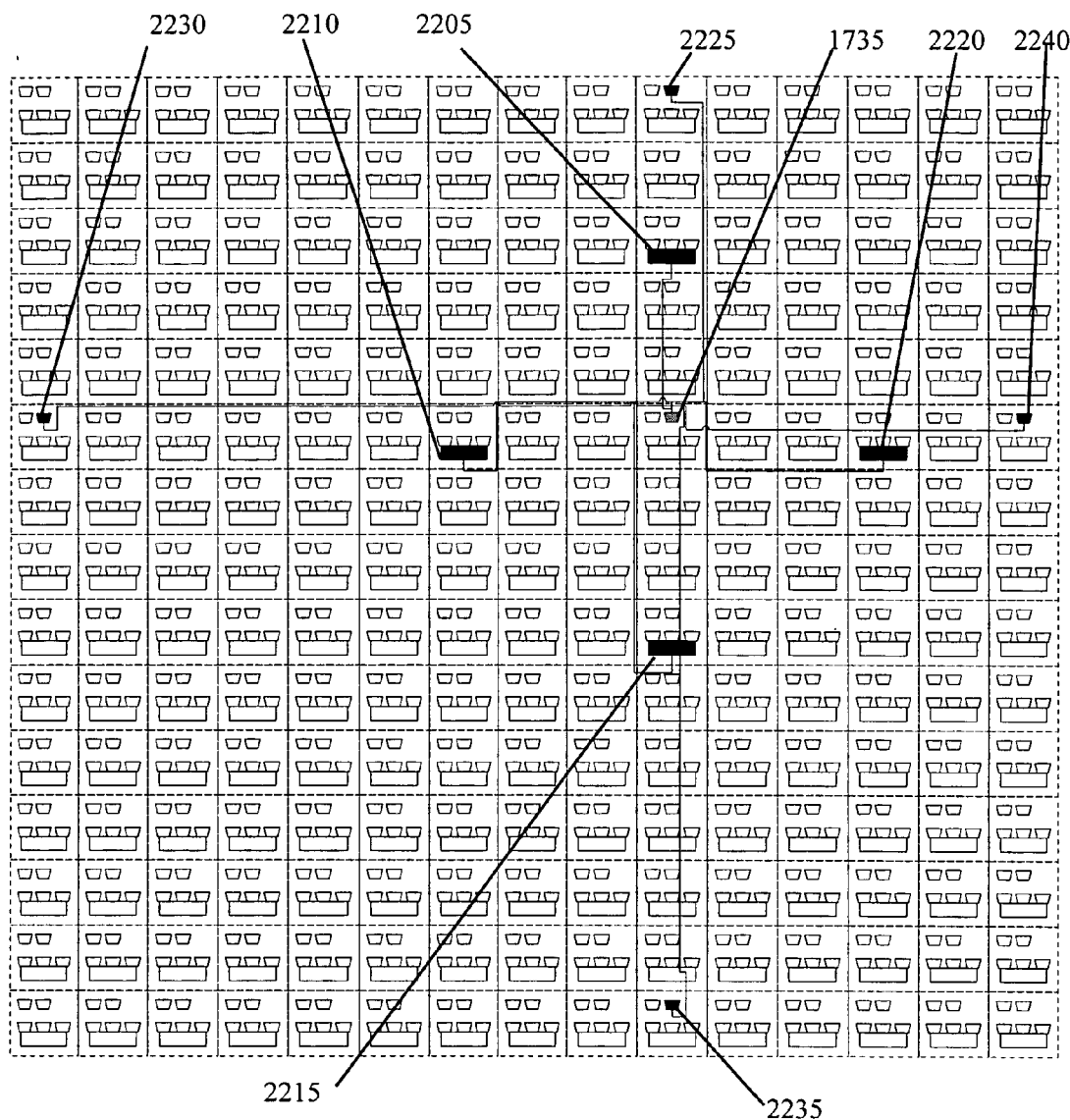
FIG. 22 illustrates a second routing multiplexer connects to the four LUT's and to four horizontally or vertically aligned routing multiplexers.

FIG. 20 illustrates that the third input select multiplexer 1725 connects to eight neighboring offset LUT's 2005–2040. FIG. 21 illustrates that the first routing multiplexer 1730 connects to the four neighboring LUT's 1905, 1910, 1915, and 1920 and to four horizontally or vertically aligned routing multiplexers 2105, 2110, 2115, and 2120. FIG. 22 illustrates that the second routing multiplexer 1735 connects to the four LUT's 2205, 2210, 2215, and 2220 and to four horizontally or vertically aligned routing multiplexers 2225, 2230, 2235, and 2240.

In the architecture illustrated in FIGS. 17–22, each tile includes one three-input LUT, three input-select multiplexers, and two routing multiplexers. Other embodiments, however, might have a different number of LUT's in each tile, a different number of inputs for each LUT, a different number of input-select multiplexers, and/or a different number of routing multiplexers.

For instance, some embodiments might employ an architecture that has in each tile: one three-input LUT, three input-select multiplexers, and eight routing multiplexers. Table 1 below specifies one such architecture for a configurable or reconfigurable IC. Table 1 specifies the architecture by listing the inputs of the multiplexers in a particular tile and providing the source of the inputs.

TABLE 1

| Type of Multiplexer | Identity of the Multiplexer | Input of the Multiplexer | Source of Input (In terms of position of corresponding tile) |
|---|---|---|---|
| Routing | 0 | 0 | Routing multiplexer 3 of the tile at position 0, −2 with respect to current tile |
| Routing | 0 | 1 | The LUT of the tile at position −2, 1 with respect to current tile |
| Routing | 0 | 2 | Routing multiplexer 3 of the current tile |
| Routing | 1 | 0 | The LUT of the tile at position 4, −3 with respect to current tile |
| Routing | 1 | 1 | The LUT of the tile at position −2, −2 with respect to current tile |
| Routing | 1 | 2 | The LUT of the tile at position 2, 2 with respect to current tile |

TABLE 1-continued

| Type of Multiplexer | Identity of the Multiplexer | Input of the Multiplexer | Source of Input (In terms of position of corresponding tile) |
|---|---|---|---|
| Routing | 2 | 0 | The LUT of the tile at position 4, 0 with respect to current tile |
| Routing | 2 | 1 | The LUT of the tile at position 0, 1 with respect to current tile |
| Routing | 2 | 2 | Routing multiplexer 1 of the tile at position 0, 1 with respect to current tile |
| Routing | 2 | 3 | The LUT of the current tile |
| Routing | 2 | 4 | Routing multiplexer 1 of the current tile |
| Routing | 2 | 5 | The LUT of the tile at position 0, −1 with respect to current tile |
| Routing | 2 | 6 | Routing multiplexer 2 of the tile at position −1, 0 with respect to current tile |
| Routing | 3 | 0 | The LUT of the tile at position 0, 3 with respect to current tile |
| Routing | 3 | 1 | The LUT of the tile at position 0, 4 with respect to current tile |
| Routing | 3 | 2 | The LUT of the tile at position 2, 0 with respect to current tile |
| Routing | 3 | 3 | Routing multiplexer 2 of the tile at position −1, 0 with respect to current tile |
| Routing | 3 | 4 | The LUT of the tile at position 4, 4 with respect to current tile |
| Routing | 3 | 5 | Routing multiplexer 3 of the tile at position 0, −2 with respect to current tile |
| Routing | 3 | 6 | The LUT of the tile at position 0, −2 with respect to current tile |
| Routing | 3 | 7 | Routing multiplexer 5 of the current tile |
| Routing | 4 | 0 | Routing multiplexer 3 of the tile at position 0, 2 with respect to current tile |
| Routing | 4 | 1 | The LUT of the current tile |
| Routing | 4 | 2 | Routing multiplexer 6 of the tile at position −1, 0 with respect to current tile |
| Routing | 4 | 3 | Routing multiplexer 0 of the current tile |
| Routing | 4 | 4 | Routing multiplexer 7 of the tile at position 0, 1 with respect to current tile |
| Routing | 5 | 0 | Routing multiplexer 3 of the tile at position 0, −4 with respect to current tile |
| Routing | 5 | 1 | The LUT of the tile at position −2, 0 with respect to current tile |
| Routing | 5 | 2 | Routing multiplexer 2 of the current tile |
| Routing | 6 | 0 | The LUT of the tile at position 2, 0 with respect to current tile |
| Routing | 6 | 1 | Routing multiplexer 1 of the tile at position 0, 1 with respect to current tile |
| Routing | 7 | 0 | Routing multiplexer 2 of the tile at position −2, 0 with respect to current tile |
| Routing | 7 | 1 | Routing multiplexer 2 of the tile at position −1, 0 with respect to current tile |

TABLE 1-continued

| Type of Multiplexer | Identity of the Multiplexer | Input of the Multiplexer | Source of Input (In terms of position of corresponding tile) |
|---|---|---|---|
| Input-Select | 0 | 0 | Routing multiplexer 5 of the tile at position 0, 1 with respect to current tile |
| Input-Select | 0 | 1 | Routing multiplexer 5 of the current tile |
| Input-Select | 0 | 2 | Routing multiplexer 2 of the tile at position −2, 0 with respect to current tile |
| Input-Select | 0 | 3 | Routing multiplexer 4 of the tile at position −8, 0 with respect to current tile |
| Input-Select | 0 | 4 | Routing multiplexer 4 of the tile at position 5, 3 with respect to current tile |
| Input-Select | 0 | 5 | Routing multiplexer 4 of the tile at position −7, 0 with respect to current tile |
| Input-Select | 0 | 6 | Routing multiplexer 4 of the tile at position 8, 0 with respect to current tile |
| Input-Select | 0 | 7 | Routing multiplexer 4 of the tile at position 2, 0 with respect to current tile |
| Input-Select | 1 | 0 | Routing multiplexer 4 of the tile at position 0, 2 with respect to current tile |
| Input-Select | 1 | 1 | Routing multiplexer 4 of the tile at position −4, 0 with respect to current tile |
| Input-Select | 1 | 2 | Routing multiplexer 3 of the tile at position 0, −4 with respect to current tile |
| Input-Select | 1 | 3 | Routing multiplexer 4 of the tile at position −4, 3 with respect to current tile |
| Input-Select | 1 | 4 | Routing multiplexer 2 of the current tile |
| Input-Select | 1 | 5 | Routing multiplexer 4 of the tile at position 7, 0 with respect to current tile |
| Input-Select | 1 | 6 | Routing multiplexer 4 of the tile at position 7, −1 with respect to current tile |
| Input-Select | 1 | 7 | Routing multiplexer 4 of the tile at position 4, 4 with respect to current tile |
| Input-Select | 2 | 0 | Routing multiplexer 0 of the current tile |
| Input-Select | 2 | 1 | LUT of the tile at position −2, 0 with respect to current tile |
| Input-Select | 2 | 2 | LUT of the tile at position 2, −2 with respect to current tile |
| Input-Select | 2 | 3 | Routing multiplexer 2 of the tile at position −2, 0 with respect to current tile |
| Input-Select | 2 | 4 | Routing multiplexer 5 of the tile at position 0, 1 with respect to current tile |
| Input-Select | 2 | 5 | Routing multiplexer 6 of the current tile |
| Input-Select | 2 | 6 | Routing multiplexer 4 of the tile at position −2, 0 with respect to current tile |
| Input-Select | 2 | 7 | LUT of the tile at position 4, −2 with respect to current tile |

As mentioned above, Table 1 specifies the architecture by listing the inputs of the multiplexers in a particular tile and providing the source of the inputs. The source of each input is expressed as (1) a component in the particular tile, or (2) a component in another tile, which is identified in terms of two coordinates (a,b) that express the location of the other tile by reference to the location of the particular tile. These two coordinates are defined in a coordinate system that has the particular tile as its origin. In this coordinate system, each unit along its x- or y-axis is one tile. For instance, using this notation, the tile 1850 in FIG. 18 is connected to the following tiles: (1) tile 1855 at location 1,0, (2) tile 1860 at location 0,1, (3) tile 1865 at location −1,0, (4) tile 1870 at location 0,−1, (5) tile 1875 at location 2,2, and (6) tile 1880 at location −2,−2.

Table 2 specifies another embodiment's architecture for a configurable or reconfigurable IC. In this embodiment, each tile has one three-input LUT, three input-select multiplexers, and six routing multiplexers. Table 2 specifies the IC architecture by using the same nomenclature as Table 1.

TABLE 2

| Type of Multiplexer | Identity of the Multiplexer | Input of the Multiplexer | Source of Input (In terms of position of corresponding tile) |
|---|---|---|---|
| Routing | 0 | 0 | The LUT of the tile at position 2, −1 with respect to current tile |
| Routing | 0 | 1 | The LUT of the tile at position −4, 3 with respect to current tile |
| Routing | 0 | 2 | Routing multiplexer 1 of the tile at position −4, 0 with respect to current tile |
| Routing | 0 | 3 | Routing multiplexer 5 of the tile at position 0, −1 with respect to current tile |
| Routing | 0 | 4 | Routing multiplexer 0 of the tile at position 7, 0 with respect to current tile |
| Routing | 0 | 5 | Routing multiplexer 4 of the tile at position 0, −2 with respect to current tile |
| Routing | 0 | 6 | Routing multiplexer 0 of the tile at position −4, 0 with respect to current tile |
| Routing | 0 | 7 | Routing multiplexer 3 of the tile at position −3, 0 with respect to current tile |
| Routing | 1 | 0 | The LUT of the tile at position −2, −1 with respect to current tile |
| Routing | 1 | 1 | The LUT of the tile at position −5, 3 with respect to current tile |
| Routing | 1 | 2 | The LUT of the tile at position 5, −2 with respect to current tile |
| Routing | 1 | 3 | Routing multiplexer 1 of the tile at position 0, 3 with respect to current tile |
| Routing | 1 | 4 | Routing multiplexer 3 of the tile at position 0, −1 with respect to current tile |
| Routing | 1 | 5 | Routing multiplexer 3 of the tile at position −5, 3 with respect to current tile |
| Routing | 1 | 6 | Routing multiplexer 4 of the tile at position 0, 1 with respect to current tile |
| Routing | 1 | 7 | Routing multiplexer 4 of the tile at position 0, −2 with respect to current tile |
| Routing | 2 | 0 | The LUT of the tile at position −1, −1 with respect to current tile |
| Routing | 2 | 1 | The LUT of the tile at position −1, 3 with respect to current tile |

TABLE 2-continued

| Type of Multiplexer | Identity of the Multiplexer | Input of the Multiplexer | Source of Input (In terms of position of corresponding tile) |
|---|---|---|---|
| Routing | 2 | 2 | Routing multiplexer 2 of the tile at position −1, 0 with respect to current tile |
| Routing | 2 | 3 | Routing multiplexer 3 of the tile at position −3, 2 with respect to current tile |
| Routing | 2 | 4 | Routing multiplexer 0 of the tile at position −1, 1 with respect to current tile |
| Routing | 2 | 5 | Routing multiplexer 4 of the tile at position −8, 0 with respect to current tile |
| Routing | 2 | 6 | Routing multiplexer 2 of the tile at position 0, −1 with respect to current tile |
| Routing | 2 | 7 | The LUT of the tile at position 5, −2 with respect to current tile |
| Routing | 3 | 0 | The LUT of the tile at position −2, −1 with respect to current tile |
| Routing | 3 | 1 | The LUT of the tile at position 1, 3 with respect to current tile |
| Routing | 3 | 2 | The LUT of the tile at position −3, −2 with respect to current tile |
| Routing | 3 | 3 | Routing multiplexer 1 of the tile at position −2, 0 with respect to current tile |
| Routing | 3 | 4 | Routing multiplexer 0 of the current tile |
| Routing | 3 | 5 | Routing multiplexer 1 of the tile at position 6, −1 with respect to current tile |
| Routing | 3 | 6 | Routing multiplexer 4 of the tile at position 0, −1 with respect to current tile |
| Routing | 3 | 7 | Routing multiplexer 0 of the tile at position 1, −5 with respect to current tile |
| Routing | 4 | 0 | Routing multiplexer 4 of the tile at position −4, 0 with respect to current tile |
| Routing | 4 | 1 | Routing multiplexer 4 of the tile at position 4, 0 with respect to current tile |
| Routing | 4 | 2 | Routing multiplexer 3 of the tile at position −2, 0 with respect to current tile |
| Routing | 4 | 3 | Routing multiplexer 3 of the tile at position −1, −3 with respect to current tile |
| Routing | 4 | 4 | Routing multiplexer 0 of the tile at position 7, 0 with respect to current tile |
| Routing | 4 | 5 | Routing multiplexer 3 of the tile at position −6, −1 with respect to current tile |
| Routing | 4 | 6 | Routing multiplexer 5 of the tile at position 4, 2 with respect to current tile |
| Routing | 4 | 7 | The LUT of the tile at position 0, 2 with respect to current tile |
| Routing | 5 | 0 | Constant Input |
| Routing | 5 | 1 | Constant Input |
| Routing | 5 | 2 | Routing multiplexer 4 of the tile at position 1, 0 with respect to current tile |
| Routing | 5 | 3 | Routing multiplexer 3 of the tile at position 6, 2 with respect to current tile |
| Routing | 5 | 4 | Routing multiplexer 1 of the tile at position −4, 0 with respect to current tile |
| Routing | 5 | 5 | Routing multiplexer 1 of the tile at position −1, −1 with respect to current tile |
| Routing | 5 | 6 | Routing multiplexer 0 of the tile at position 1, 0 with respect to current tile |
| Routing | 5 | 7 | Routing multiplexer 0 of the tile at position 7, 0 with respect to current tile |
| Input-Select | 0 | 0 | Routing multiplexer 4 of current tile |
| Input-Select | 0 | 1 | Routing multiplexer 4 of the current tile |
| Input-Select | 0 | 2 | Routing multiplexer 1 of the tile at position 0, 1 with respect to current tile |
| Input-Select | 0 | 3 | Routing multiplexer 5 of the tile at position 1, 1 with respect to current tile |
| Input-Select | 0 | 4 | Routing multiplexer 5 of the tile at position 0, −5 with respect to current tile |
| Input-Select | 0 | 5 | Routing multiplexer 3 of the tile at position 0, 2 with respect to current tile |
| Input-Select | 0 | 6 | Routing multiplexer 1 of the tile at position −3, 0 with respect to current tile |
| Input-Select | 0 | 7 | The LUT of the tile at position 0, −1 with respect to current tile |
| Input-Select | 1 | 0 | Routing multiplexer 0 of the tile at position 4, 0 with respect to current tile |
| Input-Select | 1 | 1 | Routing multiplexer 1 of the tile at position 4, 0 with respect to current tile |
| Input-Select | 1 | 2 | The LUT of the tile at position −2, −2 with respect to current tile |
| Input-Select | 1 | 3 | Routing multiplexer 5 of the tile at position 0, −3 with respect to current tile |
| Input-Select | 1 | 4 | Routing multiplexer 4 of the tile at position 0, −1 with respect to current tile |
| Input-Select | 1 | 5 | Routing multiplexer 4 of the tile at position 1, 0 with respect to current tile |
| Input-Select | 1 | 6 | Routing multiplexer 4 of the current tile |
| Input-Select | 1 | 7 | Routing multiplexer 1 of the tile at position −1, 5 with respect to current tile |
| Input-Select | 2 | 0 | Routing multiplexer 2 of the tile at position −1, 0 with respect to current tile |
| Input-Select | 2 | 1 | Routing multiplexer 3 of the tile at position −4, 0 with respect to current tile |
| Input-Select | 2 | 2 | Routing multiplexer 0 of the tile at position −1, 3 with respect to current tile |
| Input-Select | 2 | 3 | Routing multiplexer 1 of the tile at position −1, 9 with respect to current tile |
| Input-Select | 2 | 4 | Routing multiplexer 3 of the tile at position 0, −7 with respect to current tile |
| Input-Select | 2 | 5 | Routing multiplexer 0 of the tile at position 0, −4 with respect to current tile |

TABLE 2-continued

| Type of Multiplexer | Identity of the Multiplexer | Input of the Multiplexer | Source of Input (In terms of position of corresponding tile) |
|---|---|---|---|
| Input-Select | 2 | 6 | The LUT of the tile at position 1, −1 with respect to current tile |
| Input-Select | 2 | 7 | The LUT of the tile at position −1, 2 with respect to current tile |

In some embodiments, each particular tile has the same exact direct connections listed above in Table 1 or 2, with the exception perhaps of tiles at or close to the boundary of the tile arrangement. In some embodiments, the tiles at or close to the boundary do not have some of the direct connections that extend past the boundary. Some embodiments "stitch" together tiles that are at or close to the tile array boundary, by defining unique direct connections between such tiles, where these unique direct connections take the place of the direct connections that would otherwise extend past the tile array boundary.

In other embodiments, the tiles at or close to the boundary do have the same direct connection but these direct connections wrap around to the other side of the tile arrangement. For instance, when a tile is on the top of the tile array and it has a routing multiplexer that is suppose to connect to a tile above it, the direct connection might be eliminated or it might be made with a tile at the bottom of the tile array.

In some embodiments, the direct connections illustrated in FIGS. 17–22, and in Table 1 or 2, are the direct connections of each computational tile (with the possible exception of computational tiles at the boundary), but not the direct connection of the non-computational tiles (e.g., a tile that includes a memory). In other embodiments, the direct connections illustrated in Table 1 or 2 are the direct connections of some or all computational and non-computational tiles.

The architecture of some embodiments includes one or more loops between the output of a LUT in a particular computational tile and its input. For instance, the architecture defined by Table 2 includes three such loops, one for each input of the 3-input LUT. Each such loop is established through two routing multiplexers of two other tiles and the input select multiplexer of the LUT. In this manner, the output of the LUT can be stored in a user register formed by routing multiplexers that can be enabled to serve as latches, and this output can be fedback to the LUT's input.

Routing multiplexer 5 in the architecture specified by Table 2 receives two constant values (e.g., receives a "0" and a "1"). This routing multiplexer has connections with routing multiplexers 1, 3, and 4. These routing multiplexers 1, 3, and 4 have good connectivity with the input select multiplexers. As further mentioned below in Section IV, the input select multiplexers are hybrid logic/interconnect circuits in some embodiments. Some embodiments use these hybrid structures to decompose and implement logic functions, as described in U.S. patent application entitled "Hybrid Configurable Circuit for Configurable IC", filed concurrently with the present application, with the Ser. No. 11/082,221. As described in this application, these hybrid structures need to receive constant values in some instances when they are decomposing and implementing logic functions. Hence, the architecture illustrated in Table 2 feeds constant values to each routing multiplexer 5 of some or all computational tiles. These constant values can then be selectively routed to input-select hybrid multiplexers (through the multiplexers 5, and multiplexers 1, 3, and 4), which then use them during their decompose and implement logic functions.

In some embodiments, the LUT's, IMUX's, and RMUX's in all the tiles are configurable circuits. Also, in some embodiments, all these circuits are sub-cycle configurable circuits that receive their configuration data on a sub-cycle basis. For instance, each sub-cycle configurable LUT or multiplexer receives its configuration data on a sub-cycle basis through a novel two-tier multiplexer structure described in the above-mentioned U.S. patent application entitled "Configurable IC with Interconnect Circuits that also Perform Storage Operations", which is filed concurrently with the present application, with the Ser. No. 11/081,859.

In other embodiments, not all the LUT's, IMUX's, and RMUX's of a configurable IC are configurable or sub-cycle reconfigurable. For instance, in some embodiments, only the IMUX's and RMUX's are configurable or sub-cycle reconfigurable, while the LUT's are only configurable and not sub-cycle reconfigurable.

Also, tiles were described above to include LUT's, IMUX's, and RMUX's. In some embodiments, tiles also include other circuits as further described below. Also, as further described in the above-incorporated U.S. patent application entitled "Configurable IC with Interconnect Circuits that also Perform Storage Operations" (which is filed concurrently with the present application, with the Ser. No. 11/081,859) these tiles include local sub-cycle signal generators in some embodiments. Such sub-cycle signal generators generate sub-cycle signals for retrieving configuration data sets from memory storage. In some embodiments, these generators generate their sub-cycle signals based on globally distributed clock signals.

Tiles can also include memory arrays in conjunction with the LUT's, IMUX's, and RMUX's, or instead of some of these circuits (e.g., the LUT's). Several such tiles will be further described below.

III. Asymmetric Architecture

Some embodiments provide an asymmetric architecture for a configurable IC. In a tile-based architecture that includes routing interconnects, input-select interconnects, and logic circuits, the architecture can be asymmetric when it comes to the inputs of the routing interconnects, the outputs of the routing interconnects, the inputs of the input-select interconnects, or the output of the logic circuits. The architecture of the configurable IC of some embodiments is asymmetric with respect to all these conditions, while the architecture of other embodiments is asymmetric with respect to only some of these conditions.

For instance, an architecture can be asymmetric with respect to the inputs of the routing interconnects when at least one input of the routing interconnect in a particular tile is not "symmetric" with any other input of the routing interconnects of the particular tile. Two inputs are symmetric when they originate from two tiles that have a symmetric relationship with respect to each other when viewed from the position of the particular tile. Some embodiments define two tiles as having a symmetric relationship with respect to the position of a third tile when the two tiles can swap positions when they are flipped about an origin that is defined at the position of the third tile. Instead of, or in conjunction with, this definition, some embodiments define two tiles as having a symmetric relationship when one tile can take the position of the other tile if the two tiles are rotated about the origin that is defined at the position of the third tile.

Figure 23:
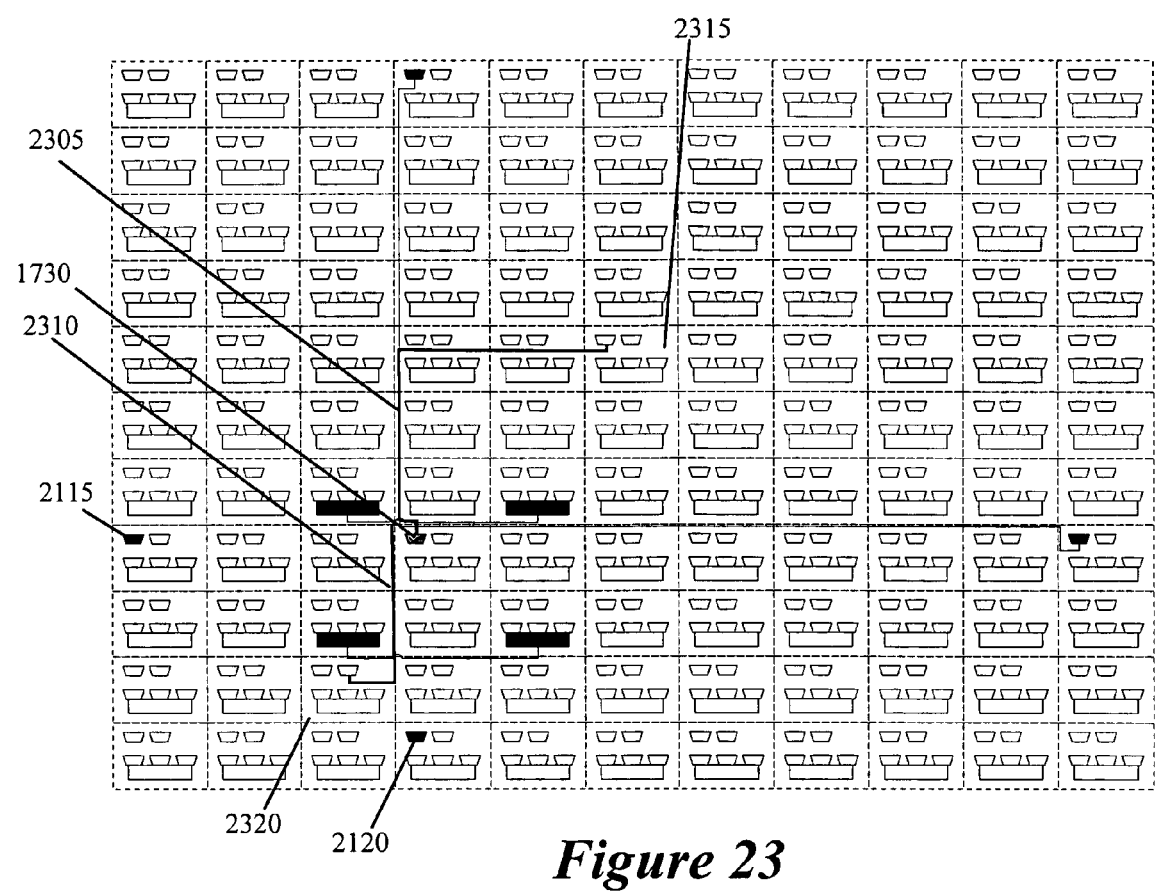
FIG. 23 illustrates an example of an architecture that is asymmetric with respect to the inputs of the routing interconnects.

FIG. 23 illustrates an example of an architecture 2300 that is asymmetric with respect to the inputs of the routing interconnects. This architecture is similar to the architecture illustrated in FIGS. 17–22, except that it includes two routing-interconnect inputs 2305 and 2310 that are not symmetric with any of the other inputs to the routing interconnect 1730. The input 2305 comes from a routing multiplexer in tile 2315 at (2,3), while the input 2310 comes from a routing multiplexer in tile 2320 at (−1,−2). These two inputs take the place of the inputs illustrated in FIG. 21 from the routing multiplexers 2115 and 2120.

Similarly, an architecture can be asymmetric with respect to the outputs of the routing interconnects of a tile when at least one output of the routing interconnect in a particular tile is not "symmetric" with any other output of the routing interconnects of the particular tile. Two outputs of one or two routing interconnects in a particular tile are asymmetric when they are supplied to two circuits at two locations in the tile arrangement that do not have a symmetric relationship with respect to each other in the configurable IC when viewed from the position of the particular tile.

An architecture can also be asymmetric with respect to the inputs of the input-select interconnects when at least one input of the input-select interconnect in a particular tile is not "symmetric" with any other input of the input-select interconnects of the particular tile. Two inputs of one or two input-select interconnects in a particular tile are asymmetric when they are received from two circuits at two locations in the tile arrangement that do not have a symmetric relationship with respect to each other in the configurable IC when viewed from the position of the particular tile.

An architecture can also be asymmetric with respect to the outputs of the set of logic circuits of a tile when at least one output of a logic circuit in a particular tile is not "symmetric" with any other output of the logic circuit set of the particular tile. Two outputs of one or two logic circuits in a particular tile are asymmetric when they are supplied to two circuits at two locations in the tile arrangement that do not have a symmetric relationship with respect to each other in the configurable IC when viewed from the position of the particular tile.

As mentioned above, each tile in some embodiments has the same set of asymmetric connections (e.g., asymmetric inputs to RMUX's, asymmetric inputs to IMUX's, etc.) with other tiles, except for tiles that are at or close to the boundary of the tile arrangement that need to address boundary conditions. In other embodiments, different tiles have different sets of connections with other tiles. However, in some of these embodiments, large sets of tiles (e.g., hundreds, thousands, etc.) have the same set of asymmetric connections with other tiles. The tiles in such large sets might all be interior tiles, or they might be tiles at or close to the boundary that need to have special connections defined to address boundary issues as mentioned above. By avoiding symmetric sets of direct connections, or using only a few of them, some embodiments reduce the number of redundant cyclic direct connections in a design. Moreover, the use of direct asymmetric offset connections in these architectures increases the interconnectivity between the circuits of the IC.

In some embodiments, the outputs or inputs of a particular tile's routing interconnects, input-select interconnects, or logic circuits are not physically symmetric as they include at least one output or one input that is not symmetric with respect to any of the other outputs or inputs. However, in some of these embodiments, the outputs or inputs of the particular tile routing interconnects, input-select interconnects, or logic circuits are isotropic or approximately isotropic. Each output or input connection can be represented in terms of a vector that is defined in terms of the start and end points of the connection. For instance, an output connection from a first routing interconnect in a first tile might take the output of the first routing interconnect to an input of a second routing interconnect in a second tile that is two tiles above and three tiles to the right of the first tile. This connection can be represented by a vector representation (3,2). A set of outputs or inputs connections is isotropic when the sum of the vectors that these connections represent equals a vector (0,0).

IV. Routing and Input Multiplexers as Interconnect/Storage Circuits and as Hybrid Interconnect/Logic Circuits A. Interconnect/Storage Circuits Numerous of the above-described architectures use routing multiplexers. In some embodiments, some or all of these routing multiplexers are interconnect/storage circuits that are useful for maintaining state information in a configurable IC. To illustrate the need for such state elements, FIGS. 24–27 present an example of implementing an IC design with a sub-cycle reconfigurable IC.

Figure 24:
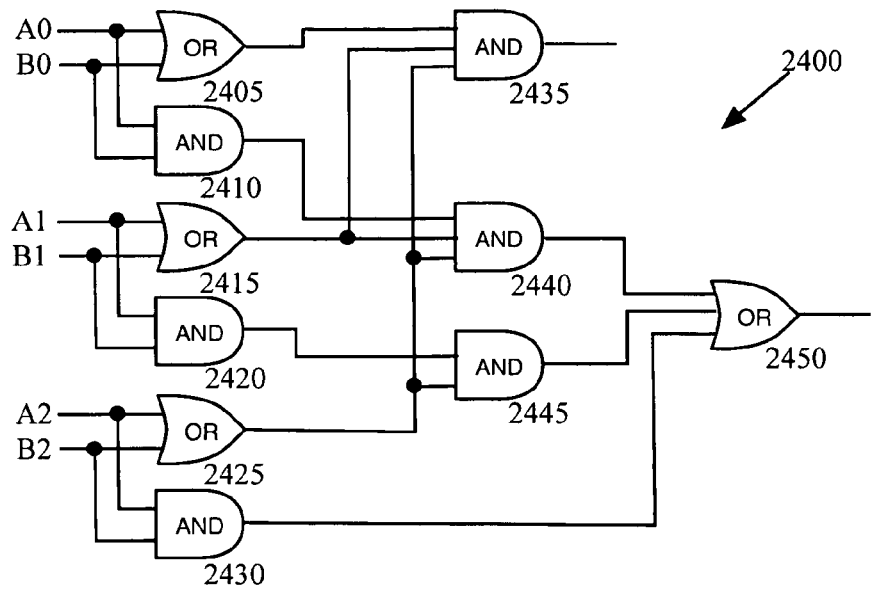
FIG. 24 illustrates a set of Boolean gates that compute two functions based on a set of inputs.

FIG. 24 illustrates a set of Boolean gates that compute two functions based on a set of inputs A0, B0, A1, B1, A2, and B2. The set of Boolean gates has to compute these two functions based on the received input set in one design cycle. In this example, one design cycle lasts 10 ns, as the design clock's frequency is 100 MHz. However, in this example, each gate can operate at 400 MHz. Hence, each design cycle can be broken down into four sub-cycles of 2.5 ns duration, in order to allow meet the design clock frequency of 100 MHz.

Figure 25:
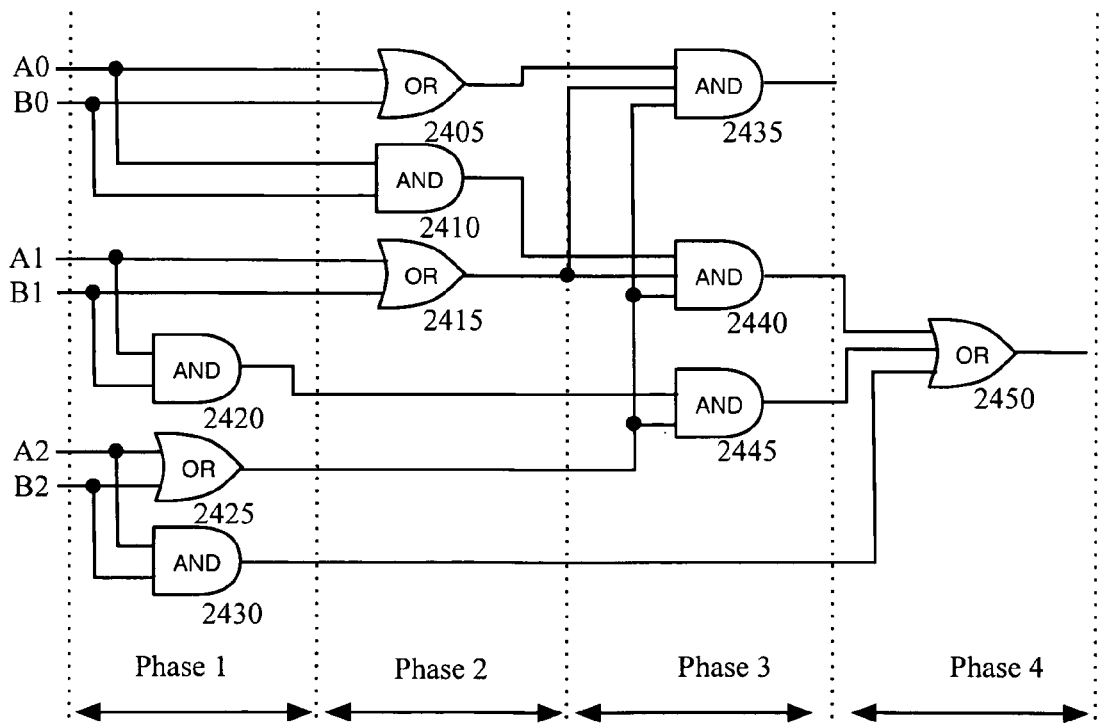
FIG. 25 illustrates the design of FIG. 24 after its gates have been placed into four groups.

FIG. 25 illustrates the design 2400 of FIG. 24 after its gates have been placed into four groups. These gates have been placed into four groups in order to break down the design 2400 into four separate groups of gates that can be configured and executed in four sub-cycles by a smaller group of gates. The groupings illustrated in FIG. 25 are designed to separate out the computation of different sets of gates while respecting the operational dependencies of other gates. For instance, gates 2405, 2410, and 2415 are defined as a separate group from gates 2420, 2425, and 2430, as these two sets of gates have no operational dependencies (i.e., the output of the gates in one set is not dependent on the output of the gates in the other set). As these two sets of gates have no operational dependencies, one set is selected for computation during the first sub-cycle (i.e., during phase 1), while the other set is selected for computation during the second sub-cycle (i.e., during phase 2). On the other hand, gates 2435, 2440, and 2445 are dependent on the outputs of the first two sets of gates. Hence, they are designated for configuration and execution during the third sub-cycle (i.e., during phase 3). Finally, the gate 2450 is dependent on the output of the first and third sets of gates, and thus it is designated for configuration and execution during the fourth sub-cycle (i.e., during phase 4).

FIG. 26 illustrates another representation of the design 2400 of FIG. 24. Like FIG. 25, the schematic in FIG. 26 illustrates four phases of operation. However, now, each gate in the design 2400 has been replaced by a sub-cycle configurable logic circuit 2605, 2610, or 2615. Also, only three logic circuits 2605, 2610, and 2615 are used in FIG. 26, as each of the gates in FIG. 24 can be implemented by one logic circuit, and the groupings illustrated in FIGS. 25 and 26 require at most three gates to execute during any given phase. (In FIG. 26, each logic circuit's operation during a particular phase is identified by a superscript; so, for example, reference numbers $2605^1$, $2605^2$, and $2605^3$, respectively, identify the operation of the logic circuit 2605 during phases 1, 2, and 3.)

As shown in FIG. 26, the outputs of certain logic circuits in earlier phases need to be supplied to logic circuit operations in the later phases. Such earlier outputs can be preserved for later computations by using state elements (such as registers or latches). Such state elements (not shown) can be standalone circuits or can be part of one or more interconnect circuits.

As mentioned above, the state elements in some embodiments are routing multiplexers that can serve as both storage and interconnect circuits. Specifically, each such routing multiplexer is a configurable interconnect/storage circuit that can be configured to act as an interconnect circuit or as a storage circuit. In some embodiments, all the routing multiplexers of a configurable or reconfigurable IC are configurable interconnect/storage circuits, while in other embodiments only some of the routing multiplexers of the IC are configurable interconnect/storage circuits.

FIG. 27 illustrates a circuit representation of an interconnect/storage circuit 2700 that can be used to implement the routing multiplexer of some embodiments. This circuit 2700 is formed by placing a latch 2705 at the output stage of a multiplexer 2710. The latch 2705 receives a latch enable signal. When the latch enable signal is inactive, the circuit simply acts as an interconnect circuit. On the other hand, when the latch enable signal is active, the circuit acts as a latch that outputs the value that the circuit was previously outputting while serving as an interconnect circuit. Accordingly, when a second circuit in a second later configuration cycle needs to receive the value of a first circuit in a first earlier configuration cycle, the circuit 2700 can be used to receive the value in a cycle before the second later configuration cycle (e.g., in the first earlier cycle) and to latch and output the value to the second circuit in the second later sub-cycle. The circuit 2700 and other interconnect/storage circuits are further described in the above-mentioned U.S. patent application entitled "Configurable IC with Interconnect Circuits that also Perform Storage Operations", which is filed concurrently with the present application, with the Ser. No. 11/081,859.

Some embodiments do not use the interconnect/storage circuits (such as the circuit 2700 of FIG. 27) for any of the input-select multiplexers. Other embodiments, however, use such interconnect/storage circuits for some or all of the input-select multiplexers. Yet other embodiments might use the interconnect/storage circuits for only the input-select multiplexers, and not for the routing multiplexers.

B. Hybrid Circuits

The configurable IC's of some embodiments include numerous input select multiplexers that are hybrid multiplexers, called HUMUX's. An HUMUX is a multiplexer that can receive "user-design signals", configuration data, or both user-design signals and configuration data for its select signals. A user-design signal within a configurable IC is a signal that is generated by a circuit (e.g., a logic circuit) of the configurable IC. The word "user" in the term "user-design signal" connotes that the signal is a signal that the configurable IC generates for a particular user application. User-design signal is abbreviated to user signal in some of the discussion below.

In some embodiments, a user signal is not a configuration or clock signal that is generated by or supplied to the configurable IC. In some embodiments, a user signal is a signal that is a function of at least a portion of the configuration data received by the configurable IC and at least a portion of the inputs to the configurable IC. In these embodiments, the user signal can also be dependent on (i.e., can also be a function of) the state of the configurable IC. The initial state of a configurable IC is a function of the configuration data received by the configurable IC and the inputs to the configurable IC. Subsequent states of the configurable IC are functions of the configuration data received by the configurable IC, the inputs to the configurable IC, and the prior states of the configurable IC.

FIG. 28 illustrates an HUMUX 2800. This HUMUX includes two two-to-one multiplexers 2820, a four-to-one multiplexer 2825, a set of input terminals 2805, an output terminal 2810, and a set of select terminals 2815. From the outside, the HUMUX looks like a four-to-one multiplexer that has four data inputs 2805, one data output 2810, and four select terminals 2815. Also, from the outside, the HUMUX looks like it passes one of its four data inputs 2805 to its one data output 2810 based on the value of two of the four signals that it receives along its four select lines 2815.

Internally, the two two-to-one multiplexers 2820 pass two of the signals from the four select lines 2815 to the two select terminals 2840 of the four-to-one multiplexer 2825. As shown in FIG. 28, each two-to-one multiplexer 2820 receives two input signals, which include one user-design signal and one stored configuration signal stored in a storage element 2845. Each of the two-to-one multiplexers 2820 outputs one of the two input signals that it receives based on the configuration bit that it receives along its select line 2850.

Although FIG. 28 illustrates two configuration bits stored in two storage elements, some embodiments drive both multiplexers 2820 off one configuration bit that is stored in one storage element. Also, some embodiments have a subset of the select lines 2840 always driven by configuration data. In other words, these embodiments drive only one of the select lines 2840 potentially with a user signal; the other select line 2840 would always be driven by configuration data. These and other HUMUX structures are described in U.S. patent application entitled "Hybrid Configurable Circuit for Configurable IC", filed concurrently with the present application, with the Ser. No. 11/082,221. This application is incorporated herein by reference.

The two signals output by the two multiplexers 2820 then serve as the select signals of the multiplexer 2825, and thereby direct this multiplexer 2825 to output on line 2810 one of the four input signals that it receives on lines 2805. The two multiplexers 2820 can output on lines 2840 either two user-design signals, two configuration signals, or one user-design signal and one configuration signal. Accordingly, through the two multiplexers 2820, the operation of the multiplexer 2825 can be controlled by two user-design signals, two configuration signals, or a mix of user/configuration signals.

HUMUX's are hybrid interconnect/logic circuits. In other words, HUMUX's can serve as logic and interconnect circuits in a configurable IC. This hybrid quality is especially advantageous since, as logic circuits, HUMUX's can be used to decompose and implement functions. In order to decompose and implement functions with HUMUX's, some embodiments define one input of some or all HUMUX's to be a permanently inverting input. The use of an HUMUX to decompose functions is further described in the above-incorporated U.S. patent application entitled "Hybrid Configurable Circuit for Configurable IC", filed concurrently with the present application, with the Ser. No. 11/082,221.

This incorporated application also further describes the use of HUMUX's for some or all of the input select multiplexers. It further describes the use of HUMUX's as some or all of the routing multiplexers. Some embodiments, however, use HUMUX's only for some or all of the input select multiplexers, while using the interconnect/storage circuit of FIG. 27 for some or all of the routing multiplexers.

V. Architecture with Fast Carry Chains

In some embodiments, the examples illustrated in FIGS. 17–22 and Tables 1 and 2 define the physical architecture of a configurable IC. In other embodiments, these examples topologically illustrate the architecture of a configurable IC. Specifically, in these embodiments, the direct connections illustrated and defined in FIGS. 18–22 and Tables 1 and 2 are only meant to show direct connections between the circuits in the configurable IC, without specifying (1) a particular geometric layout for the wire segments that establish the direct connections, or even (2) a particular position of the circuits.

In some embodiments, the position and orientation of the circuits in the actual physical architecture of a configurable IC is different from the position and orientation of the circuits in the topological architecture of the configurable IC. Accordingly, in these embodiments, the IC's physical architecture appears quite different from its topological architecture.

Figure 29:
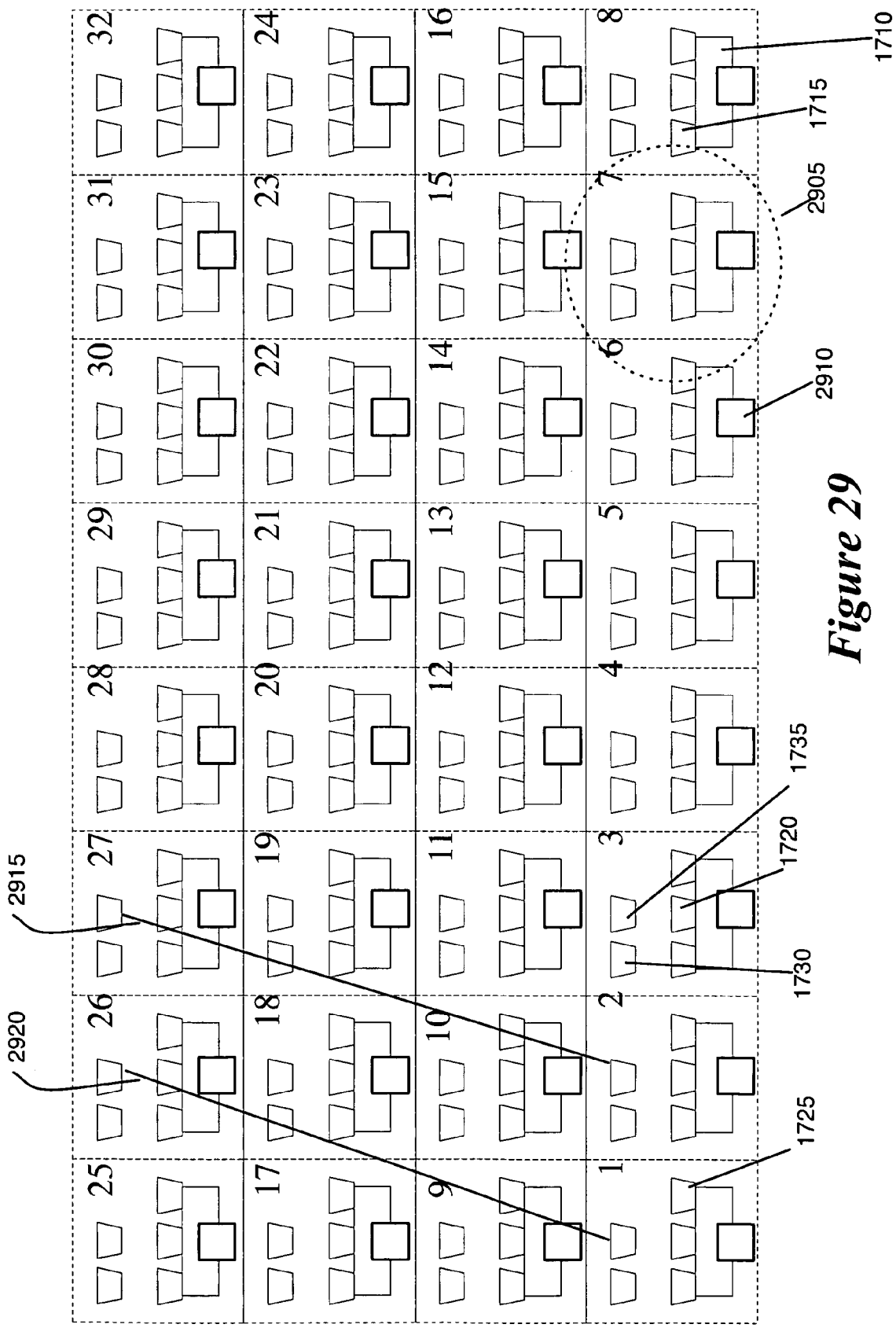
FIG. 29 illustrates a portion of the architecture of a configurable IC.
Figure 30:
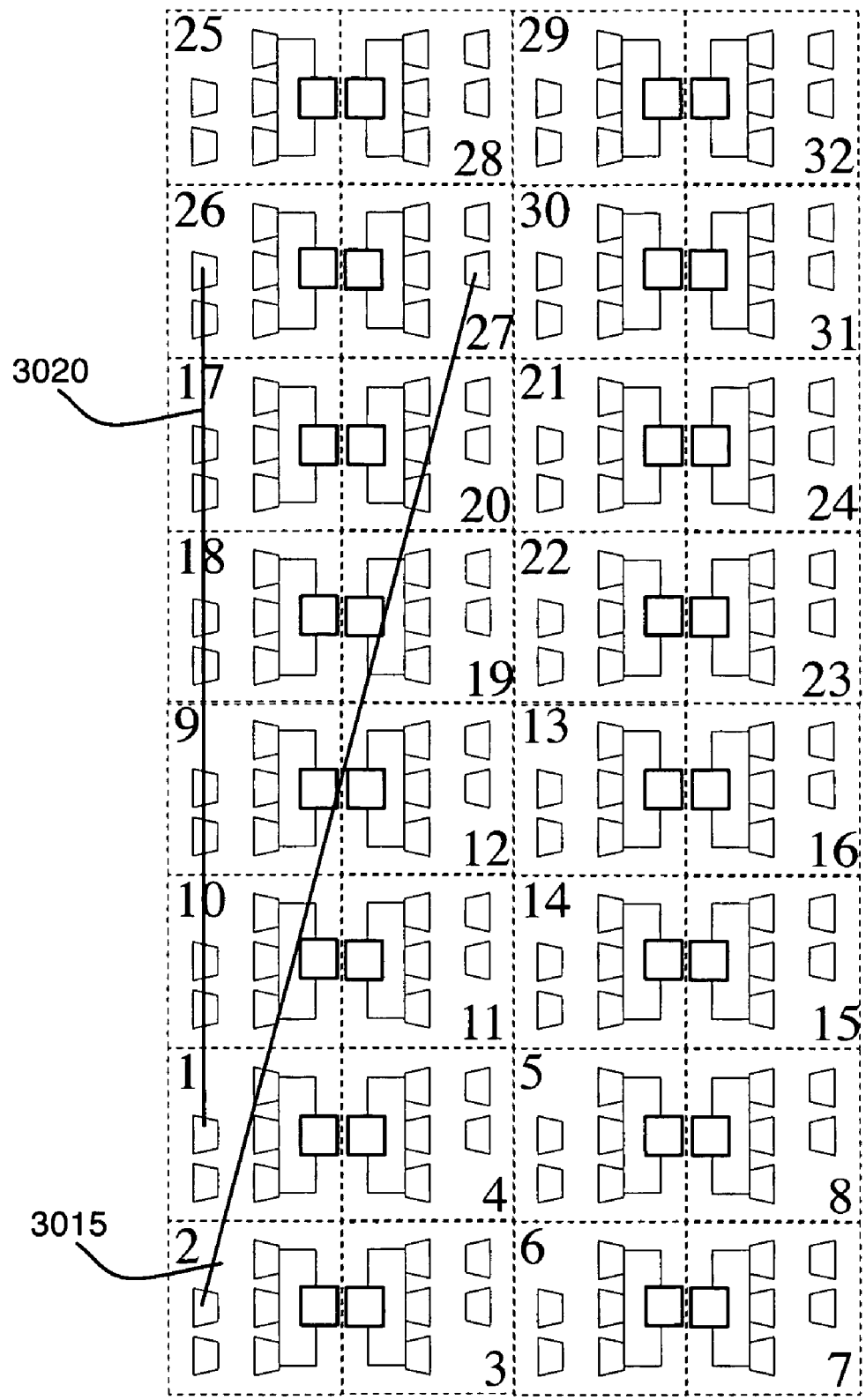
FIG. 30 illustrates a portion of the actual physical architecture of the configurable IC.

FIGS. 29 and 30 provide one example that illustrates such a difference. Specifically, FIG. 29 topologically illustrates a portion of the architecture of a configurable IC 2900. This IC's architecture in FIG. 29 is formed by a series of tiles that are arranged in multiple topological rows and columns. In FIG. 29, each tile is numbered. Like each tile 1705 in Figure 17, each tile 2905 in FIG. 29 includes two routing multiplexers 1730 and 1735, three input-select multiplexers 1715, 1720, and 1725, and one three input LUT 1710.

However, unlike FIG. 17, FIG. 29 also illustrates a carry logic circuit 2910 in each tile. The LUT and carry logic circuit in each tile form a logic carry block (LCB) that allows the LUT to implement an adder/subtractor, which can perform an add or subtract operation as further described below. FIG. 30 illustrates a portion of the actual physical architecture of the configurable IC 2900. As shown in this figure, the configurable IC 2900 is formed by (1) grouping sets of four topologically adjacent tiles that are in the same topological row in FIG. 29, and (2) aligning the tiles in each group so that their logic carry blocks are adjacent to each other. In each group of aligned tiles, the tiles are rotated by −90° or 90° with respect to the alignment illustrated in FIG. 29. Each set of four aligned tiles forms an aligned tile layout that has four logic circuits and four carry logic circuits that are close to each other.

Specifically, in this example, (1) the first topological row is divided into a first set of tiles 1–4 and a second set of tiles 5–8, (2) the second topological row is divided into a third set of tiles 9–12 and a fourth set of tiles 13–16, (3) the third topological row is divided into a fifth set of tiles 17–20 and a sixth set of tiles 21–24, and (4) the fourth topological row is divided into a seventh set of tiles 25–28 and an eighth set of tiles 29–32. In each set of four tiles, the first two tiles are rotated by −90° with respect to the alignment illustrated in FIG. 29, while the second two tiles are rotated by 90° with respect to the alignment illustrated in FIG. 29. The tiles in each set are aligned in the manner illustrated in FIG. 30, to form aligned tile layouts. For instance, tiles 1–4 form a first aligned tile layout, tiles 5–8 form a second aligned tile layout, and so on.

In some embodiments, the aligned tile layout can be viewed as a layout replica (i.e., unit of architectural regularity) that is defined collectively as a set, and that is repeated across the layout of the configurable IC. In some embodiments, tile layouts can actually be used as layout replicas during the design process to define the layout of a configurable IC, while in other embodiments tile layouts are simply an abstraction for viewing a pattern of circuits that is repeated across the layout.

Having the aligned tile layout with the same circuit elements simplifies the process for designing and fabricating the IC, as it allows the same circuit designs and mask patterns to be repetitively used to design and fabricate the IC. In some embodiments, the similar aligned tile layout not only has the same circuit elements but also have the same exact internal wiring between their circuit elements. Having such a layout further simplifies the design and fabrication processes as it further simplifies the design and mask making processes.

Figure 31:
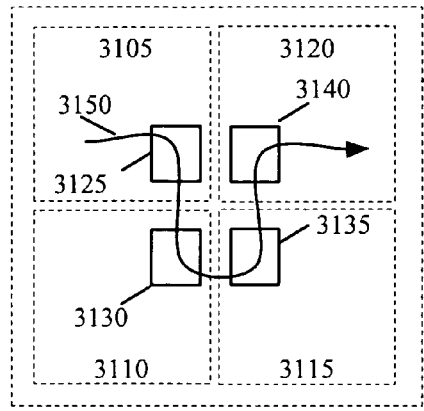
FIG. 31 illustrates an aligned tile layout, which is formed by four tiles that are aligned in the physical architecture.

To further elaborate on the proximity of the logic carry blocks within each aligned tile layout, FIG. 31 provides another illustration of an aligned tile layout 3100, which is formed by four tiles 3105–3120 (in a topological row) that are aligned in the physical architecture. In this illustration, only the logic carry blocks 3125–3140 within each tile is illustrated. As mentioned above, each LCB is formed by a LUT and its associated carry logic circuit in a tile. As shown in FIG. 31, the alignment of the tiles clusters the logic carry blocks 3125–3140 close to each other. This close proximity, in turn, allows the four LCB's to form a fast nibble wide (4-bit) adder/subtractor.

Figure 32:
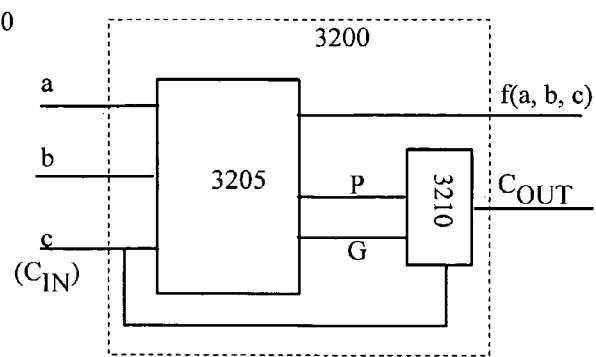
FIG. 32 illustrates a logic carry block (LCB) that is formed by a three-input LUT and its associated carry logic circuit.

To elaborate on this, FIG. 32 provides a simple illustration of an LCB 3200 that is formed by a three-input LUT 3205 and its associated carry logic circuit 3210. When acting as a one-bit adder/subtractor, a three-input LUT 3205 receives (1) two one-bit inputs "a" and "b" to add and (2) a carry signal "c" ($C_{IN}$) that gets factored in the addition. The LCB 3200 of a particular tile can receive (1) a local carry signal from the carry logic circuit of a neighboring tile in the same topological row as the particular tile, or (2) a global carry signal from a carry logic circuit in a different topological row.

Based on the three input signals that it receives, the LUT 3205 expresses the result of its addition operation in terms of a function f(a,b,c), a propagate signal P, and a generate signal G. When the LUT 3205 acts as an adder/subtractor, the function f(a,b,c) expresses the sum of "a" and "b" with "c" ($C_{IN}$) as the carry-in signal. More specifically, when adding two one-bit values, the LUT's output function f(a,b,c) computes the sum as (a⊕b)⊕c. When subtracting a one-bit value, the LUT's output function f(a,b,c) computes a "2's complement" subtraction as $(\overline{a \oplus b}) \oplus c$.

Also, when the LCB 3200 adds two one-bit values, the propagate signal P equals (a⊕b), and the generate signal G equals (a·b). Alternatively, when the LCB 3200 subtracts two one-bit values, the propagate signal P equals $(\overline{a \oplus b})$, and the generate signal G equals (a·$\overline{b}$). The propagate and generate signals are supplied to the carry logic circuit 3210, which, based on these signals, computes a carry signal $C_{OUT}$ that equals G+(P·c). The generate signal directs the carry logic circuit 3210 to generate a carry signal $C_{OUT}$, regardless of whether there is a carry that is being propagated. The propagate signal directs the carry logic circuit 3210 to propagate the carry signal regardless of whether there is a carry that is being generated. The carry signal $C_{OUT}$ computed by the circuit 3210 is the next most significant LCB in a ripple chain of adders that add two multi bit values, is the most significant bit of the resulting add operation, or is the expressed overflow.

Figure 33:
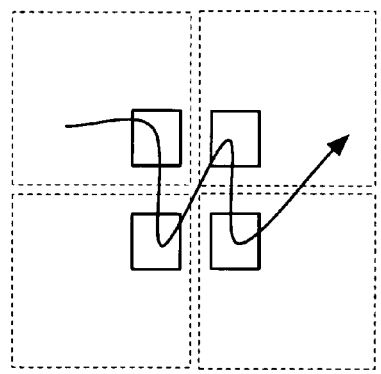
FIG. 33 illustrates an alternative carry-signal flow through four, aligned LCB's.
Figure 34:
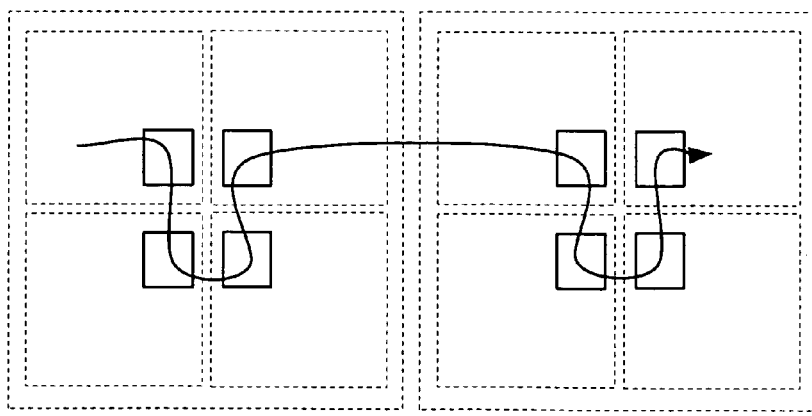
FIG. 34 illustrates two fast nibble wide adders/subtractors that are on the same topological row ganged to form a fast byte-wide adder/subtractor.

Each LCB can form a one-bit adder/subtractor or form larger adders/subtractors when it is used in conjunction with other LCB's. Accordingly, to form fast four-bit adders/subtractors, some embodiments place the four LCB's in an aligned tile layout close to each other, so that the carry signals can be quickly passed between adjacent LCB's. FIG. 31 shows a carry signal trace 3150 that highlights the direction of carry-signal flow through four, aligned LCB's of an aligned tile layout. Alternative carry-signal flows through four, aligned LCB's are also possible, such as the flow illustrated in FIG. 33. Due to the proximity of the LCB's, most of these carry-signal flows allow the four, aligned LCB's to form a fast nibble-wide adder/subtractor. In addition, when ganged with other fast nibble wide adders/subtractors that are on the same topological row, the nibble wide adders/subtractors can form fast byte-wise adders/subtractors (as shown in FIG. 34) or other larger adders/subtractors (sixteen bit adders/subtractors, thirty-two bit adders/subtractors, etc.).

As mentioned above, FIG. 29 provides a topological illustration of a portion of a configurable IC's architecture. The description above highlighted that in some embodiments the position and orientation of the circuits in the actual physical architecture of the configurable IC is different from the position and orientation of the circuits in the topological architecture of the configurable IC. Also, in some embodiments, the topological and/or actual geometric layout of wire segments and/or vias that define the direct connections between the circuits can change once the tiles are grouped and aligned.

To illustrate this, FIG. 29 presents topological illustrations 2915 and 2920 of two direct connections, one between the second routing multiplexers of tiles 1 and 26, and one between the second routing multiplexers of tiles 2 and 27. FIG. 30 presents topological illustrations 3015 and 3020 of the same two direct connections after the tiles have been grouped and aligned. As shown in these two figures, the realignment of the tiles changes the topological direct connections by changing the relative position of the two circuits that are connected in each connected pair of circuits.

The change in the relative position of the connected circuit pairs will typically also result in a change in the actual geometric layout of the direct connection between the connected circuits. As mentioned above, the geometric layout of a direct connection often differs from its topological representation. In addition, as mentioned above, a direct connection between two circuits can be achieved by (1) a set of wire segments that traverse through a set of the wiring layers of the IC, and (2) a set of vias when two or more wiring layers are involved. A direct connection can also include one or more buffers in some embodiments, while such a connection does not include buffers in other embodiments.

VI. Architecture with Shared Carry Logic

Instead of having to group and align tiles, some embodiments define aligned tile layouts from the start and then simply use the notion of tiles within the aligned tile layouts to define the interconnect topology of the circuits. Some of these embodiments specify the position of the four LUT's and four carry logic circuits within each aligned tile layout to be close to each other so that these LUT's and circuits can form fast nibble wide adders/subtractors.

Figure 35:
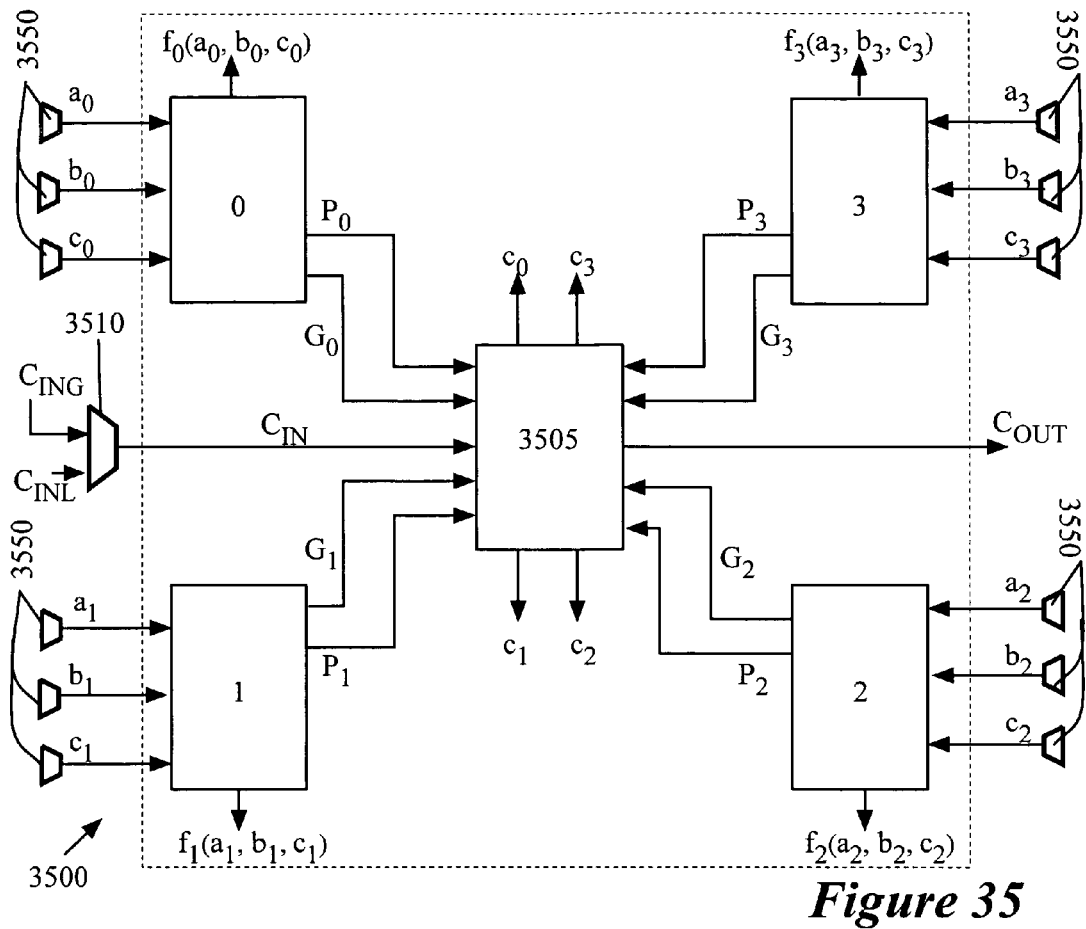
FIG. 35 illustrates an aligned layout that includes one common carry chain that is shared among the four logic circuits in the tile layout.

Alternatively, in an aligned tile layout, some embodiments define one common carry chain that is shared among the four logic circuits in the tile layout. FIG. 35 illustrates one such layout 3500. As shown in this figure, this layout includes four logic circuits (0–3), and a shared carry logic 3505.

Each logic circuit i receives three input signals $a_i$, $b_i$, $c_i$ through three input-select multiplexers 3550. During an add operation, the third input $c_i$ of each LUT is one of the outputs of the carry logic 3505. Based on the three input signals that it receives, each LUT i expresses the result of its addition operation in terms of (1) a function $f_i(a_i, b_i, c_i)$ that is dependent on the three input signals, (2) a propagate signal $P_i$ that equals $(a_i \oplus b_i)$ when $a_i$ and $b_i$ are added and equals $\overline{(a_i \oplus b_i)}$ when $b_i$ is subtracted from $a_i$, and (3) a generate signal $G_i$ that equals $(a_i \oplus b_i)$ when $a_i$ and $b_i$ are added and equals $(a_i \cdot \overline{b_i})$ when $b_i$ is subtracted from $a_i$, Also, during an add or subtract operation, each LUT i provides its propagate signal $P_i$ and generate signal $G_i$ to the carry logic 3505. The carry logic 3505 also receives a carry input $C_{IN}$, which is either a local carry input $C_{INL}$ (i.e., a carry input from a tile in the same topological row) or a global carry input $C_{ING}$ (i.e., a carry input from a tile in a different topological row), as determined by a multiplexer 3510 associated with the aligned tile group.

Based on its input signals, the carry logic 3505 generates four carry signals $c_0$, $c_1$, $c_2$, and $C_3$, which it supplies to the four LUT's 0–3 during an add operation. The first carry signal $c_0$ equals the carry input $C_{IN}$, which the carry logic 3505 receives. In some embodiments, each other carry signal $c_j$ produced by the carry logic 3505 is derived from the propagate, generate, and carry signals from the previous stage LUT. For instance, in some embodiments, the carry signal $c_j$ equals $(P_{i-1} \cdot C_{i-1}) + G_{i-1}$ for cases where i can equal 1, 2, 3, or 4, and the last carry signal $C_{OUT}$ equals the carry signal $C_4$. This carry signal $C_{OUT}$ can be output as a local carry output $C_{OUTL}$ (e.g., a carry output to a tile in the same topological row) and a global carry output $C_{OUTG}$ (e.g., a carry output to a tile in a different topological row) through associated buffer and/or routing circuitry (not shown).

The sharing of the carry logic and the clustering of the logic circuits 0–3 allows the tiles in the aligned tile layout 3500 to form a fast four-bit adder/subtractor. In addition, when ganged with other fast nibble wide adders/subtractors that are on the same topological row, the nibble wide adders/subtractors can form fast byte-wise adders/subtractors (as shown in FIG. 34) or other larger adders/subtractors (sixteen bit adders/subtractors, thirty-two bit adders/subtractors, etc.).

Figure 36:
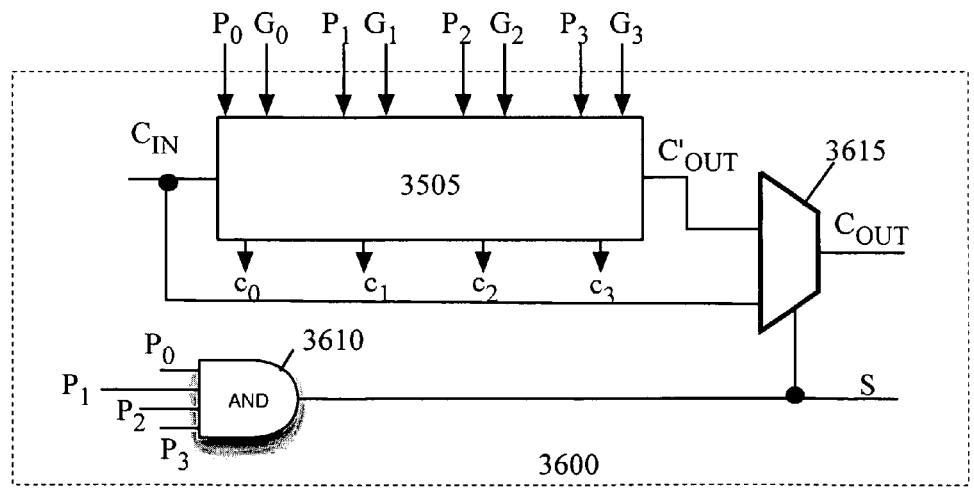
FIG. 36 illustrates a bypass circuitry to bypass the shared carry logic to further speed the carry logic circuitry for larger adders/subtractors.

To further speed the carry logic circuitry for larger adders/subtractors, bypass circuitry can be used to bypass the shared carry logic 3505. FIG. 36 illustrates one such bypass circuitry. As shown in this figure, the bypass circuitry 3600 includes the shared carry logic circuit 3505, an AND gate 3610, and a two-to-one multiplexer 3615. The shared carry logic 3505 generates the carry signals ($c_0$, $c_1$, $c_2$, $c_3$, and $C_{OUT}$) based on the functions that were discussed above while describing FIG. 35. An example of the shared carry logic circuit 3505 will be described below by reference to FIG. 39.

When all the propagate signals generated by the logic circuits (0–3) are "1", the AND gate produces a "1", which directs the multiplexer 3615 to output as $C_{OUT}$ the carry signal $C_{IN}$ that the carry logic 3505 receives. On the other hand, when one of the propagate signals is not 1, the AND gate 3610 produces a "0", which directs the multiplexer 3615 to output the output carry signal $C_{OUT}$ that is produced by the shared carry logic circuit 3505. Bypassing the computations of the shared carry circuit 3505 speeds up the operation of the four-bit adder/subtractor formed by the logic and carry circuits in the aligned tile layout 3500 of FIG. 35.

Some embodiments also use a portion of this bypass circuitry of the carry logic circuit to generate complex functions with the logic and carry circuits in the aligned tile layout 3500, when these circuits are not used to implement an adder/subtractor. For instance, when all the LUT's are configured to add two one-bit values, the output S of the AND gate 3610 can be expressed as follows:

$$S=(a_0 \oplus b_0) \cdot (a_1 \oplus b_1) \cdot (a_2 \oplus b_2) \cdot (a_3 \oplus b_3).$$

As expressed in this equation, the AND gate's output S equals the AND'ing of four XOR operations that can be performed by the four logic circuits 0–3 on their first two inputs "a" and Such a complex function can be used to implement a series of complex functions through NPN operations, where NPN stands for negate input (i.e., invert input), permute input, and negate output. For instance, such a function can be used to determine whether two four-bit signals are identical by inverting the four bits of one of the signals. This inversion will cause the XOR operation to produce a 1, whenever the two corresponding bits in the two signals are identical. Hence, the output of the AND gate 3610 provides the results of a four-bit comparison of two four-bit signals, when the four bits of one of the two signals are inverted, and the inverted signal is provided to the logic circuits of the aligned tile layout along with the other non-inverted signal. In such a situation, an output value of "1" for the AND gate specifies that the two four bit signals are identical, while an output value of "0" specifies a difference between the two signals. Larger comparators can be quickly created by AND'ing the outputs of the AND gates 3610 of several aligned tile layouts. For instance, a sixteen-bit comparator that can compare two sixteen-bit signals can be created by AND'ing the outputs of the AND gates 3610 of four aligned tile layouts.

The output of the AND gate 3610 and the multiplexer 3615 in FIG. 36 is fed to a sub-cycle configurable two-to-one multiplexer (not shown). Based on its configuration, this multiplexer then determines which of the two outputs it should direct to the routing fabric for routing to other circuits in the IC.

Figure 37:
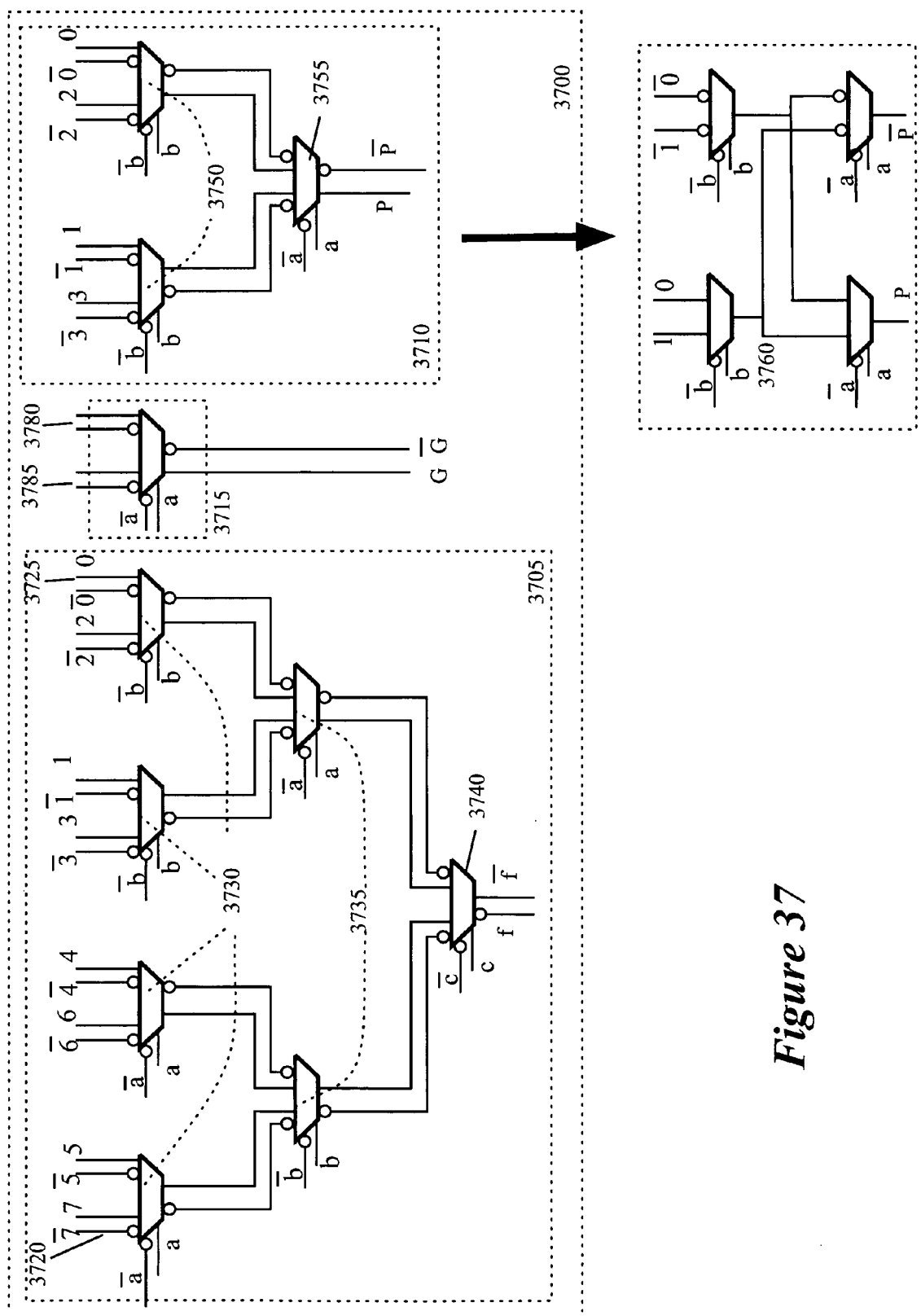
FIG. 37 illustrates an example of a three-input LUT.

VII. Configurable LUT that Serves as an Adder/Subtractor and Manchester Carry Chain FIG. 37 illustrates an example of a three-input LUT 3700 of some embodiments of the invention. This LUT can be used as the LUT 3205 of FIG. 32, or the LUT. During an add or subtract operation, the LUT 3700, like the LUT 3205, (1) performs the actual add or subtract computation, and (2) produces the propagate and generates values that are to be used by the carry logic that will generate the next carry bit and summation.

The LUT 3700 is implemented in complementary pass logic (CPL). In this implementation, a complementary pair of signals represents each logic signal, where an empty circle at the input or output of a circuit denotes the complementary input or output of the circuit in the figures. The LUT has three sections, a core logic section 3705, a propagate section 3710, and a generate section. The core logic section 3705 is formed by three stages 3730, 3735, and 3740 of multiplexers that are controlled by the three input signals a, b, and c. The core logic section 3705 generates the function f(a,b,c) computed by the logic circuit 3700.

Given that the LUT 3700 is a configurable logic circuit, the function that it computes depends on the values of configuration bits supplied to the first stage of multiplexers 3730 of the LUT. For instance, when adding two one-bit values (i.e., computing a+b), the values of the true configuration bits are 10010110, with the most significant bit being supplied to multiplexer input 3720 and the least significant bit being supplied to the multiplexer input 3725. Alternatively, the configuration bits are 01101001, when the LUT subtracts two one-bit values (i.e., computes a−b). The values of the complement configuration bits are the inverted version of their corresponding true configuration bits.

As shown in FIG. 37, half of the first stage multiplexers 3730 are driven by the input "a" and its complement, while the other half of the first stage multiplexers 3730 are driven by the input "b" and its complement. The above-mentioned U.S. patent application entitled "Configurable IC with Interconnect Circuits that also Perform Storage Operations" (which is filed concurrently with the present application, with the Ser. No. 11/081,859) discloses an example of a CPL-implementation of a multiplexer.

The output of the first stage multiplexers 3730 are supplied to the second stage multiplexers 3735, in the manner illustrated in FIG. 37. One of the second-stage multiplexers is driven by the input signal "b", while the other second-stage multiplexer is driven by the input signal "a". The signals for driving the multiplexers in the first stage 3730 and the second stage 3735 are a mixture of the two input signals "a" and "b", in order to balance loading and therefore delay on the signals "a" and "b". However, in other embodiments, all the first stage multiplexers are driven only by the input "a", while all the second stage multiplexers are driven by the input "b", or vice versa.

The outputs of the second stage multiplexers 3735 are supplied to the third stage multiplexer 3740, which is driven by the input signal "c". The output of the third stage multiplexer is the function computed by the LUT 3700. This output is expressed in CPL format, i.e., in terms of the function f and its complement.

The LUT's propagate section 3710 produces the propagate signal P and its complement. This section has two stages of multiplexers 3750 and 3755. The first stage of multiplexers 3750 receive the lowest four significant bits of the configuration data, in the manner indicated in FIG. 37. Specifically, this figure identifies the lowest four significant configuration bits by number, and then illustrates how these four bits are supplied to the first stage multiplexers 3750 of the propagate-generation section 3710.

The first stage multiplexers 3750 are driven by the input signal "b". The output of the first multiplexer stage is supplied to a multiplexer 3755 that forms the second multiplexer stage of the section 3710. This multiplexer 3755 is driven by the input signal "a". The output of the second stage multiplexer 3755 represents the propagate signal P. Instead of the propagate section 3710, the LUT's of some embodiments use the propagate section 3760, which is a circuit equivalent of the section 3710 for the input configuration illustrated in FIG. 37. The output of both sections 3710 and 3760 is expressed in CPL format, i.e., in terms of the propagate signal P and its complement.

The LUT's generate section 3715 produces the generate signal G and its complement. This section includes a two-to-one CPL multiplexer that receives the input "a" and "ā" along its select lines. When adding two one-bit values, the multiplexer in section 3715 receives the signals "0" and "1"

along its first complementary pair 3780 of input lines and the signals "b" and "b̄" along its second complementary pair 3785 of input lines. When subtracting two one-bit values, the multiplexer in section 3715 receives the signals 1 and 0 along its first complementary pair 3780 of input lines and the signals "b" and "b̄" along its second complementary pair 3785 of input lines. Hence, the output of this multiplexer provides the function G (which equals (a·b) when "a" and "b" are added and (a·b̄) when b is subtracted from a), and the complement of this function.

Figure 38:
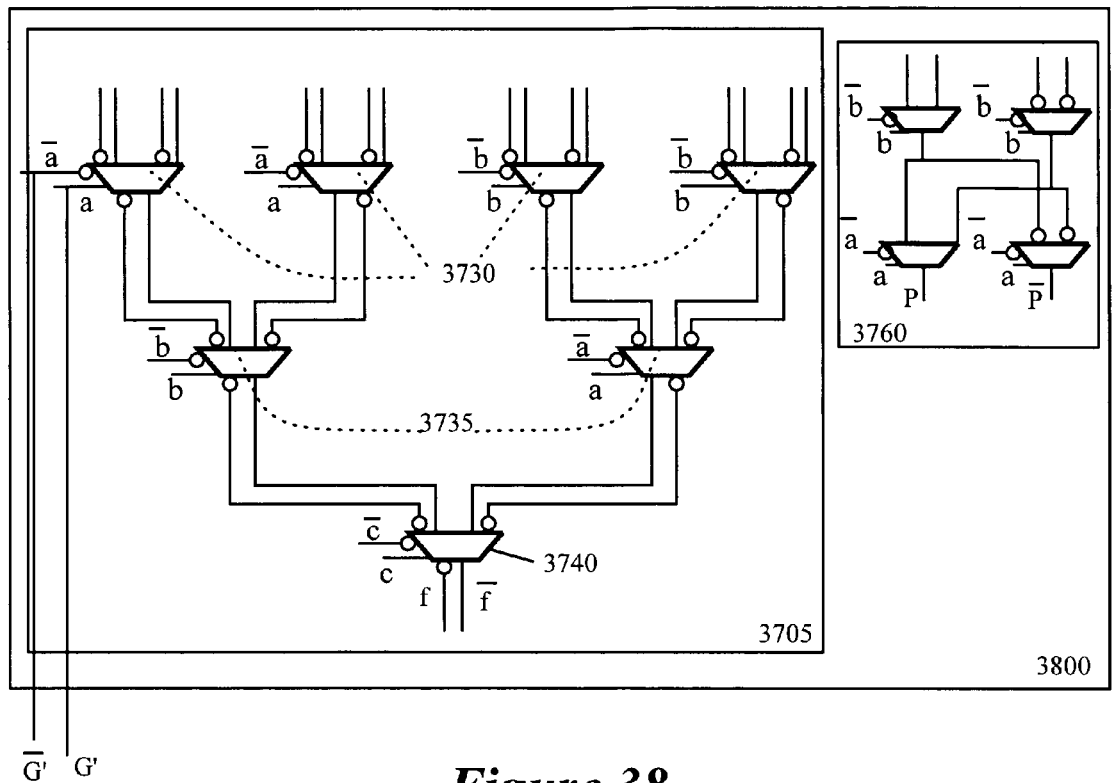
FIG. 38 illustrates a three-input LUT that is an optimized version of the LUT of FIG. 37.

FIG. 38 illustrates a three-input LUT 3800 that is an optimized version of the LUT 3700 of FIG. 37. In LUT 3800, the propagate section 3710 is replaced with the propagate section 3760, which was described above by reference to FIG. 37. Also, in LUT 3800, the generate section 3715 has been eliminated. Instead of producing the generate signal G and its complement, the LUT 3800 produces the generate signal G' and its complement. Unlike the signal G, which equals (a·b) or (a·b̄), the signal G∝ equals "a" while its complement equals ā.

The LUT 3800 produces the signal G' and its complement in such a fashion based on the following observation. As mentioned above, the carry out signal $C_{OUT}$ produced by an LCB (e.g., LCB 3200) equals (P·$C_{in}$)+G, where P and G are the propagate and generate signals produced by the LCB and $C_{IN}$ is the carry in signal received by the LCB. The $C_{OUT}$ equation can be expressed as the $C_{OUT}$ equals the propagate signal when the carry in signal $C_{IN}$ is "1", and equals the generate signal when the carry in signal $C_{IN}$ is "0". In other words, the generate signal can be ignored unless the propagate signal is "0".

However, when the propagate signal is "0", then either both "a" and "b" equal "1", or both "a" and "b" equal "0". When the propagate signal is "0" and the generate signal needs to be examined, the generate signal equals either "a" or "b", both of which are equal. Accordingly, instead of computing (a·b) or (a·b̄) to produce a generate value G, the LUT 3800 outputs a generate value G' that equals "a" and a generate complement value Ḡ that equals "ā."

Figure 39:
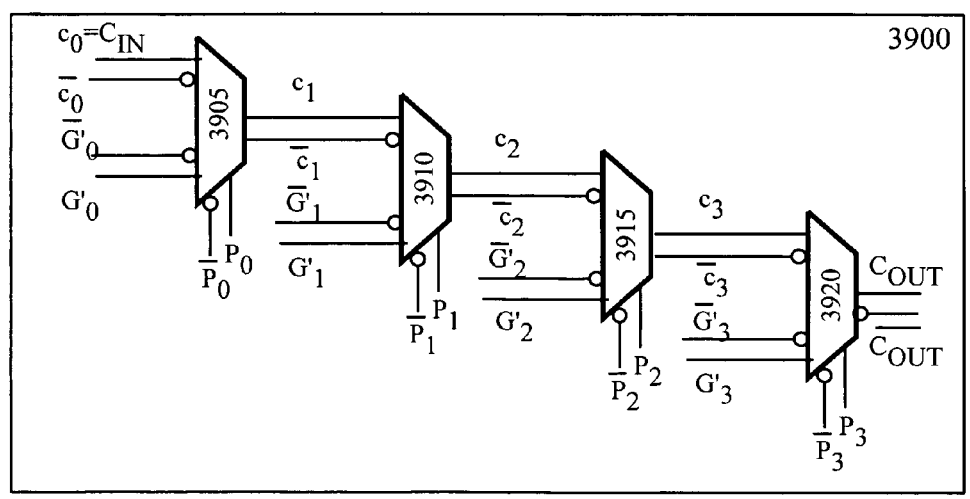
FIG. 39 illustrates a CPL-implementation of a four-stage Manchester carry chain that can serve as the shared carry logic of FIG. 36.

FIG. 39 illustrates a CPL-implementation of a four-stage Manchester carry chain 3900 that can serve as the shared carry logic 3605 of FIG. 36. As shown in FIG. 39, each stage of the chain 3900 includes a two-to-one CPL multiplexer (3905, 3910, 3915, or 3920) that connects two of its four input lines to two output lines based on the two signals that it receives on its select lines.

The multiplexer of each stage produces the carry signal of the next stage, or the output carry signal of a nibble-wide adder/subtractor, based on the propagate and generate signals generated by the LUT of the current stage and the carry out of the previous stage. For instance, the second multiplexer 3910 in this chain produces the carry signal $c_2$ (1) for LUT 2 in a four LUT tile group (like group 3500), and (2) for the third multiplexer 3910 in the carry chain. The second multiplexer 3910 computes the carry signal $c_2$ as ($P_1 \cdot c_1$)+$G_1$. More specifically, the second multiplexer 3910 sets $c_2$ and $\bar{c}_2$ equal to $c_1$ and $\bar{c}_1$ when the $P_1$ equals "1", and sets $c_2$ and $\bar{c}_2$ equal to $G'_1$, and $\bar{G}'_1$ when the $P_1$ equals "0".

This carry chain 3900 is referred to as a Manchester carry chain since each CPL multiplexer is formed by pass transistor logic. As mentioned above, examples of such multiplexers are described in the above-incorporated U.S. patent application entitled "Configurable IC with Interconnect Circuits that also Perform Storage Operations" (which is filed concurrently with the present application, with the Ser. No. 11/081,859). One of ordinary skill will realize that other embodiments might use other types of logic to form the carry chain, such as full complex CMOS, dynamic CMOS, etc. Also, other embodiments might structure the carry chain differently. In addition, FIG. 39 illustrates the carry chain 3900 as receiving the generate signals G' and $\bar{G}'$, which can be produce by LUT's like LUT 3800. This carry chain, however, can also be used with LUT's like LUT 3700 that produce generate signals G' and $\bar{G}'$.

VIII. Dual Carry Chains

Figure 40:
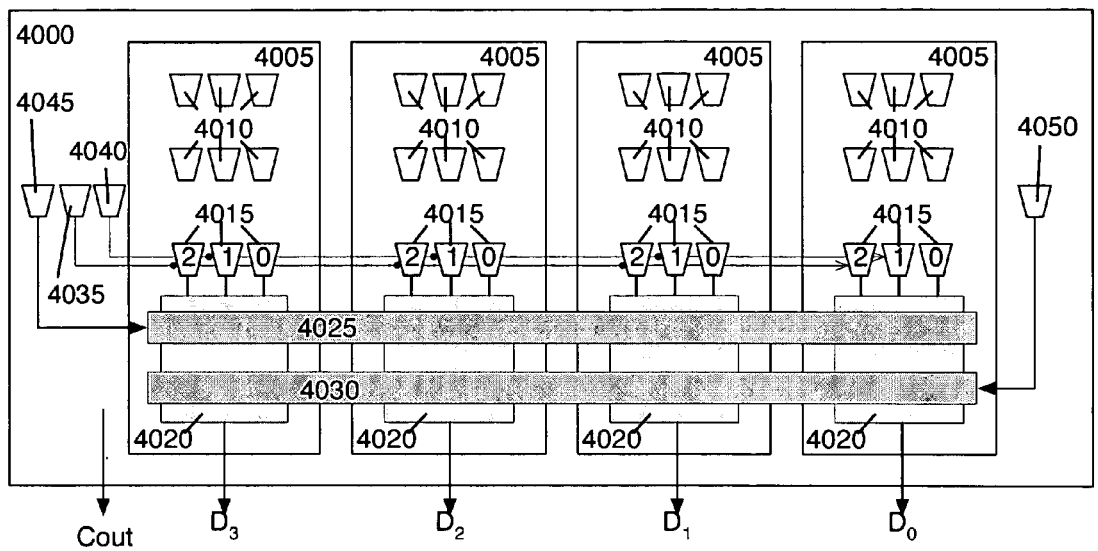
FIG. 40 illustrates a tile group that includes two carry chains, a left-to-right carry chain and a right-to-left carry chain.

Some embodiments of the invention have two carry chains in each aligned tile group to provide the IC designer maximum flexibility in arranging the data paths in the design. FIG. 40 presents a topological illustration of one such tile group 4000. This tile group 4000 includes four tiles 4005, and four routing multiplexers 4035, 4040, 4045, and 4050. Each tile 4005 includes six routing multiplexers 4010, three input select multiplexers 4015, one three-input LUT 4020. In each tile, two input select multiplexers 4015 (labeled as multiplexers 1 and 2) are HUMUX's, which receive user signals through routing multiplexers 4035 and 4040 of the tile group.

As shown in FIG. 40, the tile group 4000 also includes two carry chains, a left-to-right carry chain 4025 and a right-to-left carry chain 4030. These carry chains illustrate the direction of carry signal flow through an adder/subtractor formed by the LUT's and carry logic circuits of the tile group 4000. Each carry chain receives the output of a routing multiplexer 4045 or 4050, which provides a local or global carry in signal. As further described below, the routing multiplexers 4045 and 4050 are interconnect/storage elements in some embodiments.

As mentioned above, each LUT in some embodiments has a separate carry logic circuit, while the LUT's in other embodiments share carry logic circuits. Two carry chains can be defined in each tile group by defining a redundant set of carry logic data paths in the tile group. For instance, some embodiments establish a tile group with two carry logic chains by taking the arranged tile layout 3500 of FIG. 35 and adding a second Manchester carry logic 3505.

Figure 41:
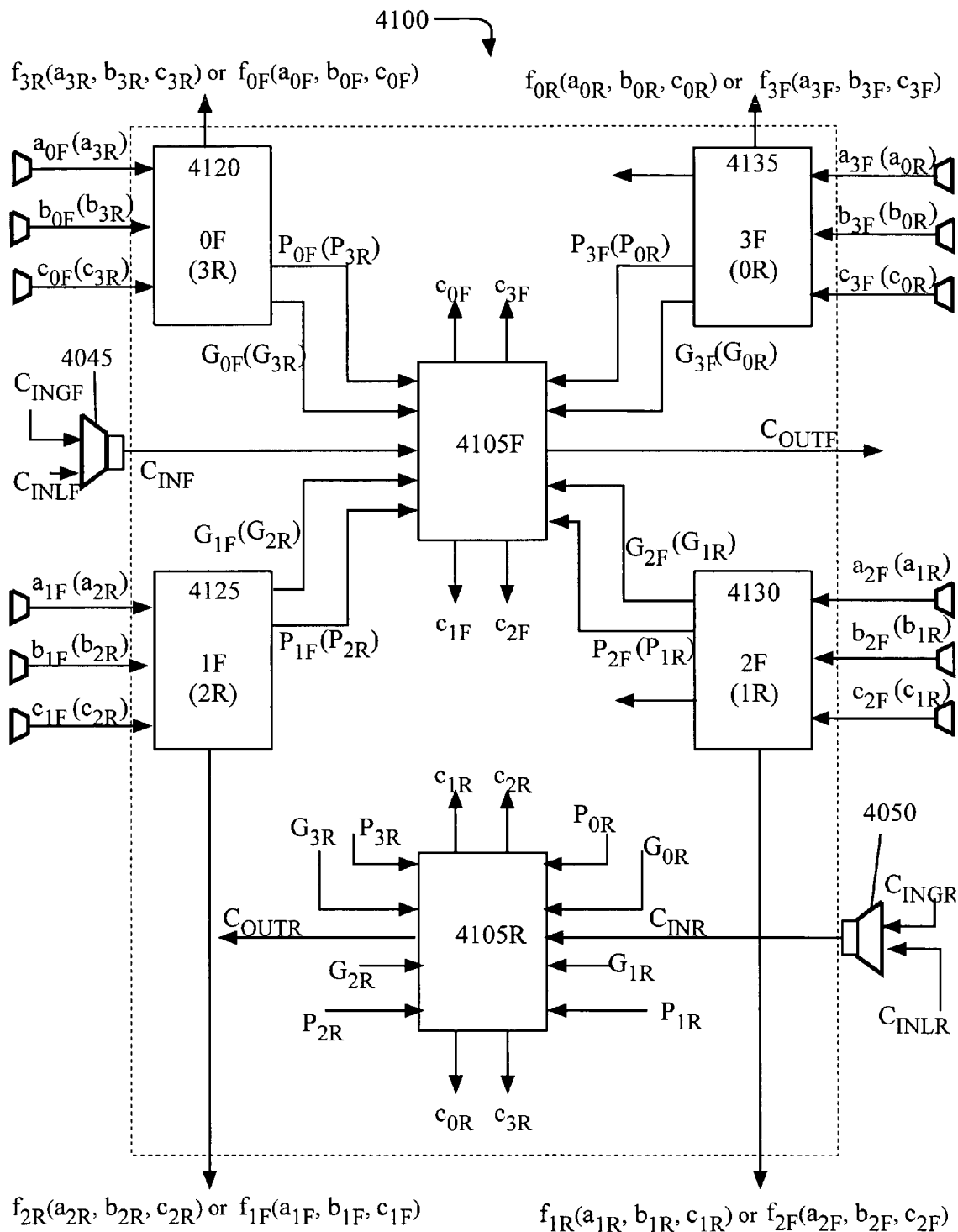
FIG. 41 illustrates a tile layout that includes two Manchester carry logics, two routing multiplexers, and two sets of carry in and out signals.

FIG. 41 illustrates one such modified tile layout 4100. The tile layout in this figure is similar to the tile layout in FIG. 35, except that the tile layout 4100 also includes (1) two Manchester carry logic chains 4105F and 4105R (instead of one Manchester carry logic chain 3505), (2) two routing multiplexers 4045 and 4050 (instead of one routing multiplexer 3510), and (3) two sets of carry in and out signals (instead of one). The carry logic 4105F is used by the left-to-right carry chain 4025, while the carry logic 4105R is used by the right-to-left carry chain 4030. In FIG. 41, the notation F and R are used to specify the signals in the forward and reverse carry paths 4025 and 4030.

When the tile layout 4100 is used to perform an adder/subtractor operation, its LUT's 4120–4135 receive data and carry inputs for performing such an operation. When the forward carry chain 4025 is used, the data and carry signals flow through the LUT's 4120, 4125, 4130, and then 4135. On the other hand, when the reverse carry chain 4030 is used, the data and carry signals flow through the LUT's 4135, 4130, 4125, and then 4120. Accordingly, the LUT's and the inputs and outputs of the circuits in FIG. 41 are labeled to show the identity of these signals during the forward and reverse carry flows.

The notations in FIG. 41 can be interpreted as follows. Tile layout 4100 can be used to add two four-bit signals "a" and "b", where this addition factors in a four-bit carry signal "c". Each of the signals "a", "b", and "c" has a bit 0, bit 1, bit 2, and bit 3. Each of the four LUT's 4130—4130 always receives the same signal value in the forward and reverse flows through the LUT's. However, in the forward and reverse flows, the signal value received by each LUT is a different bit in the addition operation.

For instance, LUT 4125 is labeled as 1F and 2R to indicate that this circuit is LUT 1 in the left-to-right adder/subtractor implementation, while it is LUT 2 in the right-to-left adder/subtractor implementation. When the tile layout 4100 performs an addition operation in the forward flow, the "a", "b", and "c" signals received by the LUT 4125 are designated as $a_{1F}$, $b_{1F}$, and $c_{1F}$, to specify that these signals are the second bits in the nibble-wide add operation performed by the LUT's of the tile layout 4100. Alternatively, when the tile layout 4100 performs an addition operation in the reverse flow, the "a", "b", and "c" signals received by the LUT 4125 are designated as $a_{2R}$, $b_{2R}$ and $C_{2R}$, to specify that these signals are the third bits in the nibble-wide add operation performed by the LUT's of the tile layout 4100. Similarly, the propagate signal of LUT 4135 is labeled as $P_{3F}$ and $P_{0R}$ to indicate that (1) when acting as a left-to-right adder/subtractor, the propagate signal of LUT 4135 is the third propagate signal, while (2) when acting as a right-to-left adder/subtractor, the propagate signal of LUT 4135 (which now is acting as LUT 0) is the first propagate signal.

As mentioned above, the routing multiplexers 4045 and 4050 are interconnect/storage elements, like the interconnect/storage element 2700 of FIG. 27. Similarly, in some embodiments, the routing multiplexer 3510 of FIG. 35 is also an interconnect/storage element. Using interconnect/storage elements for routing multiplexers 3510, 4045, and 4050 is beneficial in that it allows some embodiments to perform different portions of an adder/subtractor operation in different sub-cycles.

For instance, to perform a thirty-two bit add operation, some embodiments can perform two sixteen bit add operations in two different sub-cycles. To do this, these embodiments can latch the carry out signal or signals associated with the addition operations for the first set of sixteen bits, in the interconnect/storage RMUX's (3510, 4045, or 4050) of the LUT's that perform the addition for the second set of sixteen bits, or some interconnect/storage RMUX's that are used to route the signals. While performing the addition on the second set of sixteen bits, the IC of some embodiments can simply latch the result of the addition operation on the first set of sixteen bits, or it can perform additional operations on this result in order to increase its throughput through pipelining.

IX. Memories Embedded in and Between the Tile Layouts

Figure 42:
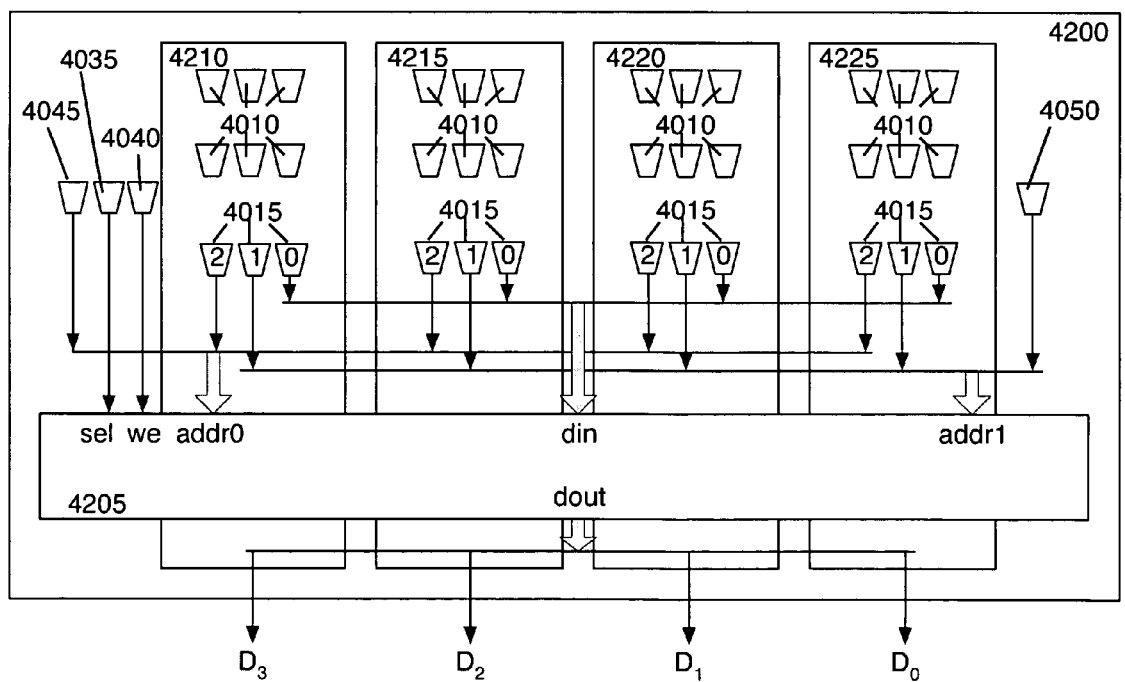
FIG. 42 illustrates one manner of embedding a memory in the layout of the tile group of FIG. 40.

Configurable IC's typically include memory arrays for storing data used by the configurable IC. Some embodiments embed memories in the tiles of a configurable IC's tile arrangement. For example, FIG. 42 illustrates one manner of embedding a memory 4205 in the layout of the tile group 4000 of FIG. 40. The memory 4200 is a 128-bit memory that can be addressed by five address bits to read or write four bits of data at a time.

The tile layout 4200 of FIG. 42 is similar to the tile layout 4000 of FIG. 40, except that the LUT's 4020 and carry chains 4025 and 4030 in the layout 4000 are replaced with a memory 4200 in the layout 4200. Both layouts 4000 and 4200 have four sets of routing multiplexers 4010, four sets of input select multiplexers 4015, and four other routing multiplexers 4035–4050.

Like the four three-input LUT's 4020 in FIG. 40, the memory 4205 receives the twelve bits output from the twelve input select multiplexers 4015. However, in the layout 4200, (1) the output of the IMUX "2" in each tile and the output of the routing multiplexer 4045 form a five-bit write-address bus of the memory 4205, (2) the output of the IMUX "1" in each tile and the output of the routing multiplexers 4050 form a five-bit read-address bus of the memory 4205, and (3) the output of the IMUX "0" in each tile forms a four-bit input data bus.

The tile layout 4200 also has a four-bit output data bus that utilizes the same four bit output data path that is used in the tile group 4000 to output the four output bits of the four LUT's 4020. The tile layout 4200 utilizes the output of the multiplexer 4040 as the write-enable signal WE. This signal directs the memory 4205 to utilize the address from the write-address bus to identify a location in the memory to write the data on the data input bus. The tile layout 4200 utilizes the output of the multiplexer 4035 as a chip select signal SEL. This signal either indicates that the memory is selected for operation, or is not selected, in which case the memory can operate in a reduced power mode.

Figure 43:
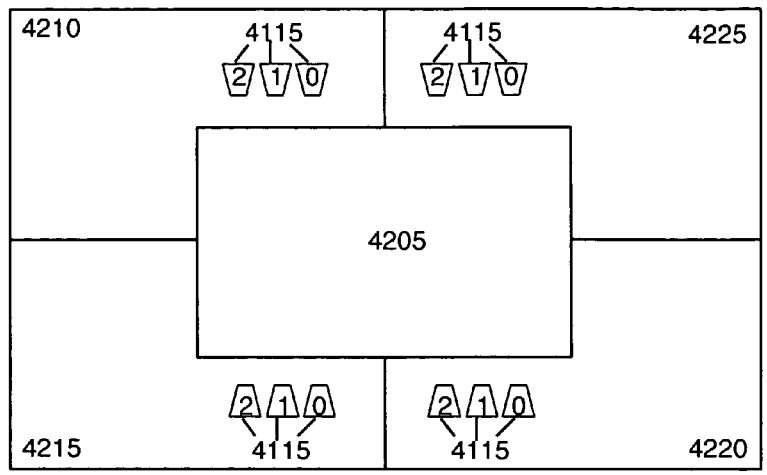
FIG. 43 illustrates a physical layout for embedding a memory in an aligned tile group, which is formed by four tiles that are aligned with each other in a manner similar to the aligned tile groups of FIGS. 31 and 41.

FIG. 43 illustrates a physical layout for embedding the memory 4205 in an aligned tile group, which is formed by four tiles that are aligned with each other in a manner similar to the aligned tile groups 3100 and 4100 of FIGS. 31 and 41. The alignment illustrated in FIG. 43 has the memory 4205 placed in the middle of the four aligned tiles 4210, 4215, 4220, and 4225, which were topologically illustrated in FIG. 42. In this embedding, the memory array 4205 in the arrangement illustrated in FIG. 43 takes the place of the LUT's 0–3 and shared carry logic circuits 4105 in FIG. 41.

In some embodiments, the embedding illustrated in FIG. 43 does not disrupt the routing fabric within the tiles that contain the memory 4205. In these, the embedding illustrated in FIG. 43 does not utilize many or any of the configurable routing multiplexers (that are part of the configurable routing fabric of the configurable IC) in the four tiles illustrated in this figure. These unused routing multiplexers can then be used as part of the configurable routing fabric that routes signals between the configurable logic circuits of the configurable IC.

Figure 44:
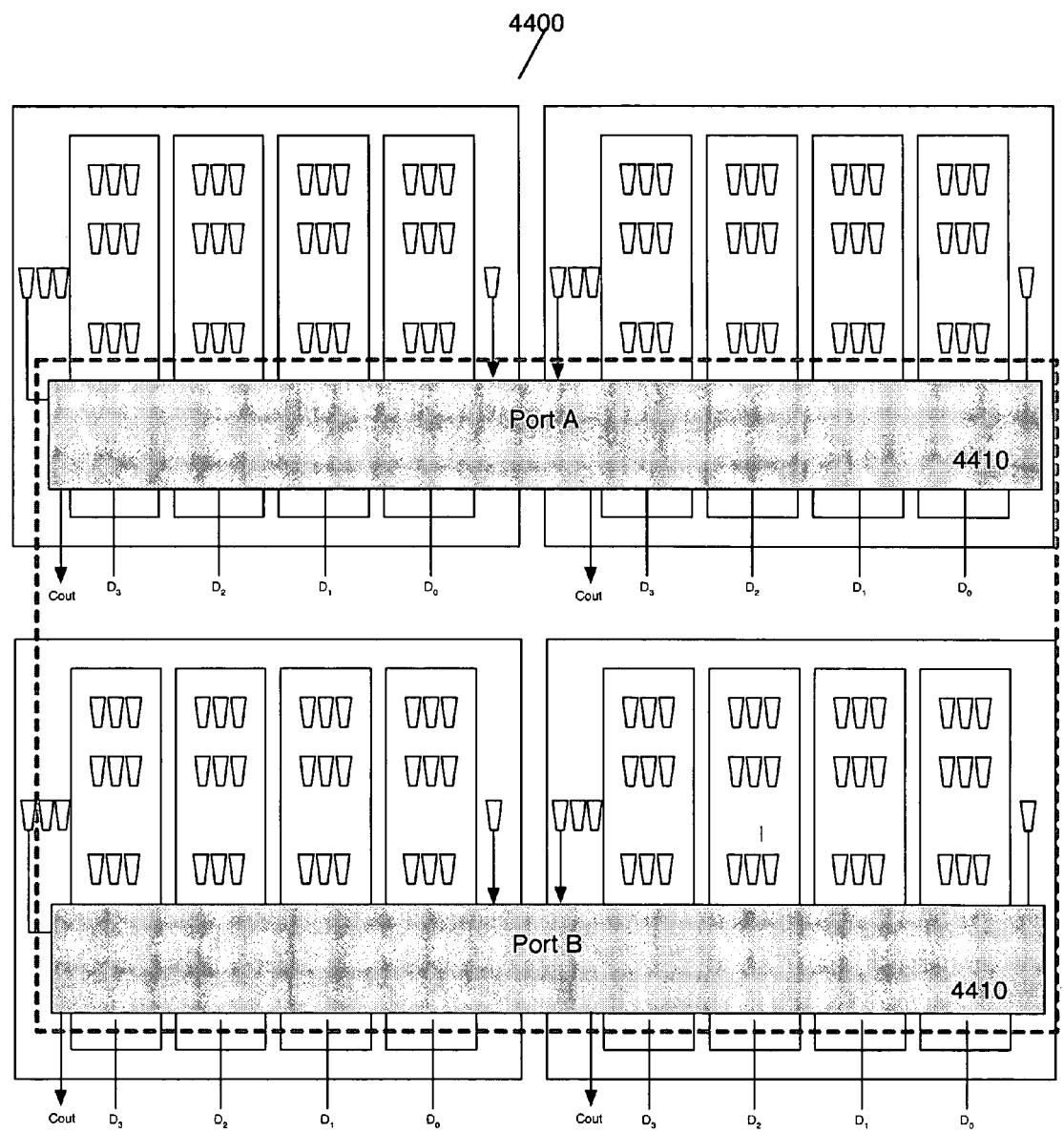
FIG. 44 illustrates an architecture that includes address and data signals for a memory that come from several groups of tiles.

In some architectures, the address and data signals for a memory can come from several groups of tiles. FIG. 44 illustrates one such architecture 4400. This is a dual-ported architecture that includes two memory address/data ports 4410. Each memory port 4410 spans across two groups of eight tiles. Each port has (1) a nine-bit read address bus, (2) a nine-bit write address bus, (3) a ten-bit input data bus, and (4) a ten-bit output data bus.

The nine-bit write address bus is formed by (1) the output of the IMUX "2" in each of the eight tiles spanned by the port, and (2) the output of one of the routing multiplexers 4045 in the two groups. The nine-bit read address bus is formed by (1) the output of the IMUX "1" in each of the eight tile spanned by the port, and (2) the output of one of the routing multiplexers 4050 in the two groups.

The ten-bit data input bus is formed by (1) the output of the IMUX "0" in each of the eight tiles spanned by the port, and (2) the output of a routing multiplexer that correspond to the routing multiplexer in a computational tile (i.e., a tile with a logic circuit) that provides the carry in to the aligned tile layout. The ten-bit data output bus includes two sets of four bit lines that are each aligned with the four bit output data path used in the tile group 4000 to output the four output bits of the four LUT's 4020. The ten-bit data output bus also includes two bit lines that are aligned with the carry-out signal line of a tile group 4000 with four LUT's 4020 and associated carry logic.

These address and data lines of the dual ported architecture 4400 allow simultaneous read and/or write operations to and/or from two different locations in a memory array, which stores 5120 bits in some embodiments. Also, in some embodiments, the two ports A and B of FIG. 44 can operate on two different clock domains. Specifically, some embodiments can drive the circuits (e.g., the configurable routing and input-select interconnect circuits) of the two sets of tiles spanned by the two ports by two different clock signals, which potentially have different phases and/or operate at different frequencies.

Figure 45:
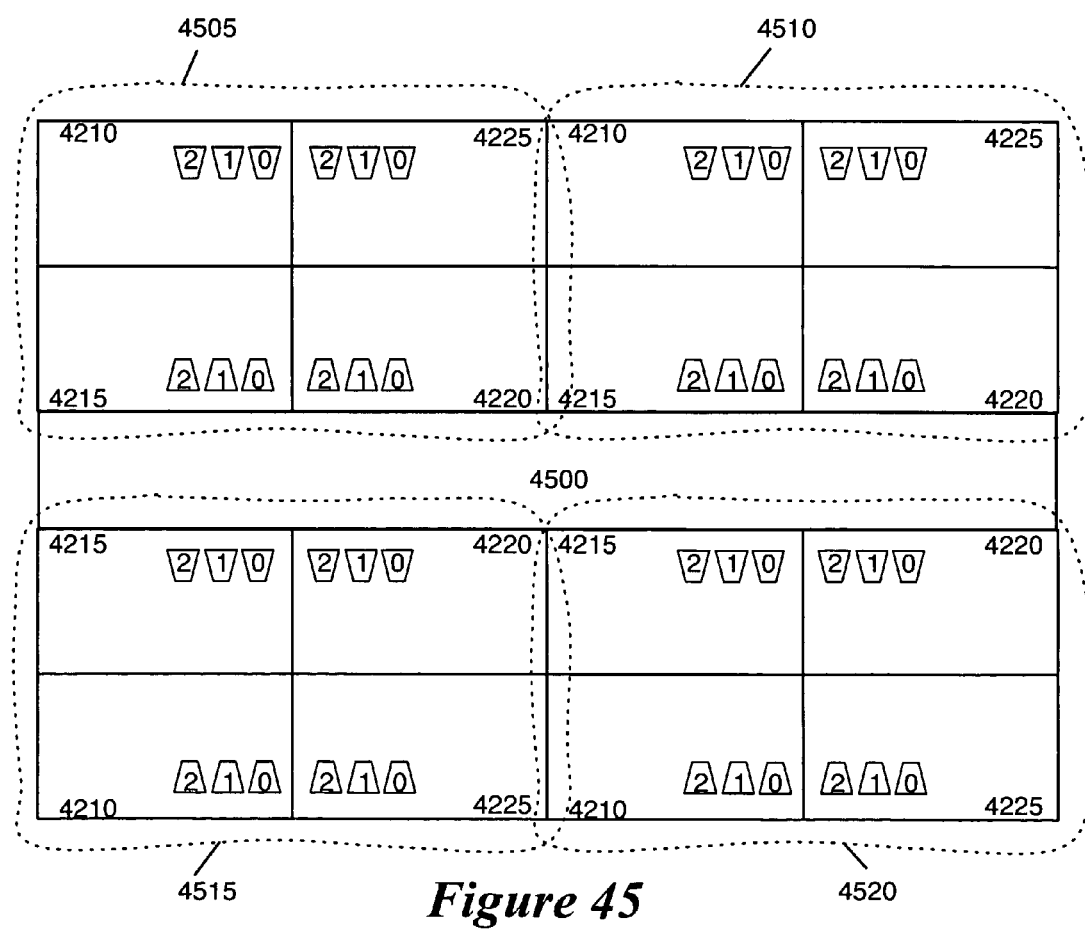
FIG. 45 illustrates a manner for establishing the dual-ported architecture of FIG. 43.

FIG. 45 illustrates one manner for establishing the dual-ported architecture 4400 of FIG. 44 in the tile architecture of some embodiments. Specifically, FIG. 45 illustrates a physical layout for embedding a memory 4500 between four aligned tile groups in the tile architecture of some embodiments. Each aligned tile group is formed by four tiles that are aligned with each other in a manner similar to the aligned tile groups 3100 and 4100 of FIGS. 31 and 41.

The alignment illustrated in FIG. 45 has a memory 4500 placed between two pairs of aligned tiles, with the top pair including tile groups 4505 and 4510 and the bottom pair including tile groups 4515 and 4520. The top pair of tile groups 4505 and 4510 provide the address and data signals for one port (e.g., port A) of the memory 4500, while the bottom pair of tile groups 4515 and 4520 provide the address and data signals for another port (e.g., port B) of the memory 4500.

Unlike the embedding illustrated in FIG. 43, which simply takes the place of the LUT's 0–3 and the shared carry logic circuits, the embedding in FIG. 45 is not within a tile layout. The embedding in FIG. 45 also requires additional wiring to route the signals from the multiplexers of the top and bottom aligned tile groups to the memory 4500. However, in some embodiments, the embedding illustrated in FIG. 45 does not disrupt the routing fabric of the tiles that are on either side of the memory 4500. In these embodiments, the embedding illustrated in FIG. 45 does not utilize many or any of the configurable routing multiplexers (that are part of the configurable routing fabric of the configurable IC) in the sixteen tiles illustrated in this figure. These unused routing multiplexers can then be used as part of the configurable routing fabric that routes signals between the configurable logic circuits of the configurable IC.

X. Configurable IC and System

Some embodiments described above are implemented in configurable IC's that can compute configurable combinational digital logic functions on signals that are presented on the inputs of the configurable IC's. In some embodiments, such computations are state-less computations (i.e., do not depend on a previous state of a value). Some embodiments described above are implemented in configurable IC's that can perform a continuous function. In these embodiments, the configurable IC can receive a continuous function at its input, and in response, provide a continuous output at one of its outputs.

Figure 46:
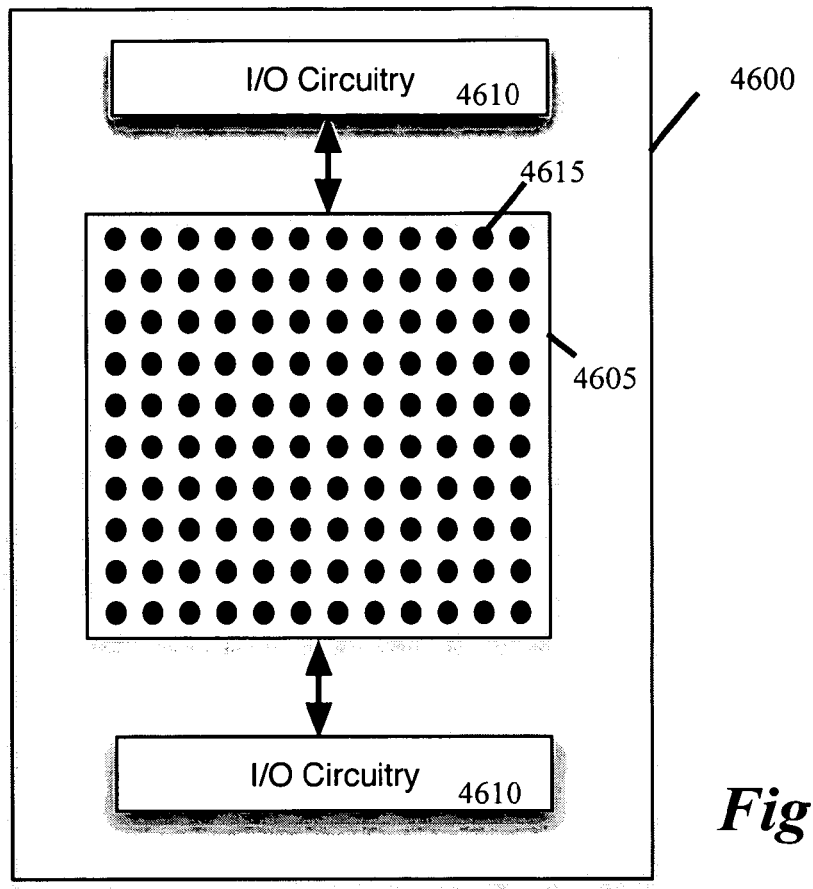
FIG. 46 illustrates a portion of a configurable IC.

FIG. 46 illustrates a portion of a configurable IC 4600 of some embodiments of the invention. As shown in this figure, this IC 4600 has a configurable circuit arrangement 4605 and I/O circuitry 4610. The configurable circuit arrangement 4605 can be any of the invention's configurable circuit arrangements that were described above. The I/O circuitry 4610 is responsible for routing data between the configurable nodes 4615 of the arrangement 4605 and circuits outside of the arrangement (i.e., circuits outside of the IC, or within the IC but outside of the arrangement 4605). As further described below, such data includes data that needs to be processed or passed along by the configurable nodes.

Figure 47:
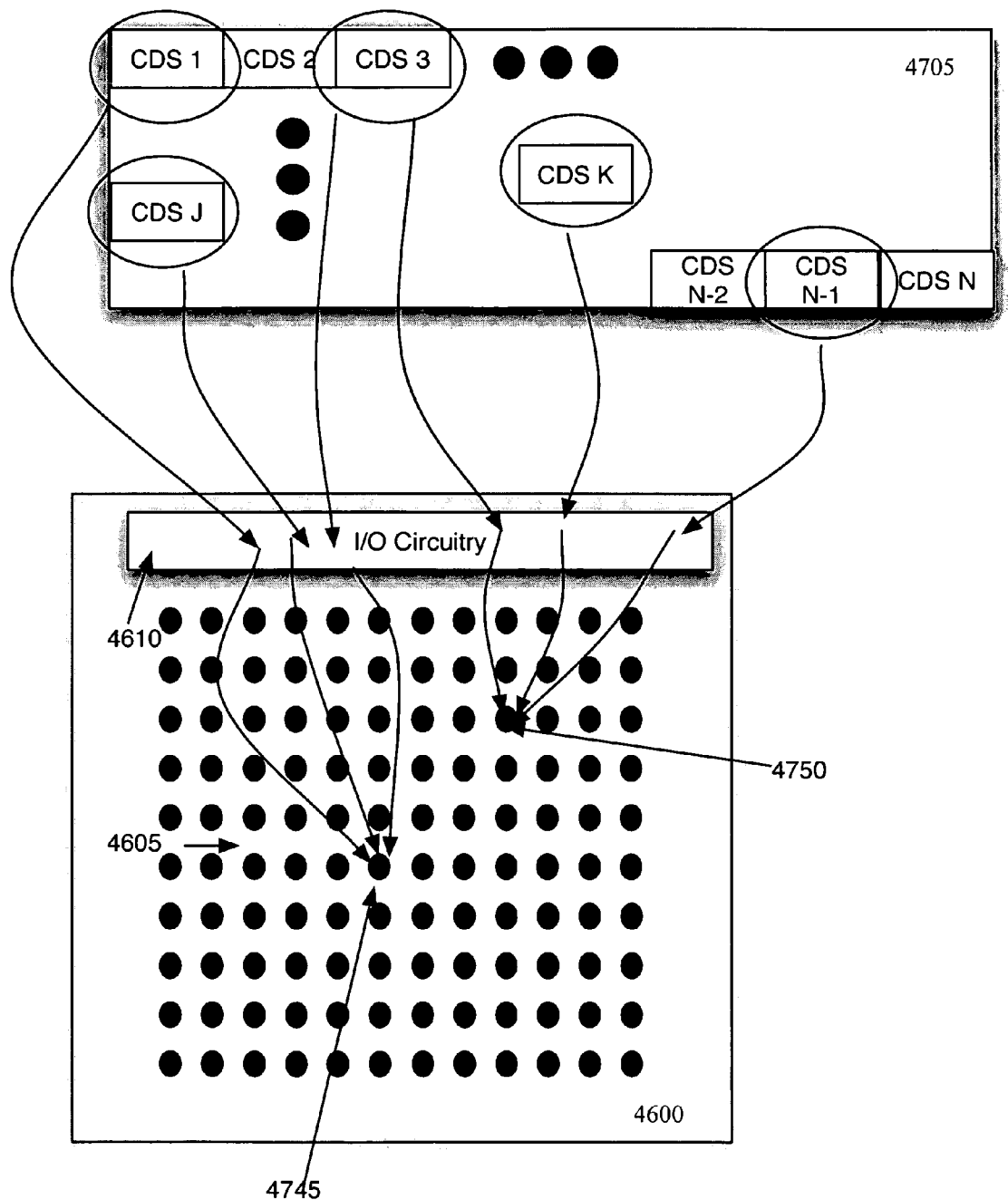
FIG. 47 illustrates a more detailed example of a configuration data pool for the configurable IC.

The data also includes in some embodiments configuration data that configure the nodes to perform particular operations. FIG. 47 illustrates a more detailed example of this. Specifically, this figure illustrates a configuration data pool 4705 for the configurable IC 4600. This pool includes N configuration data sets (CDS). As shown in FIG. 47, the input/output circuitry 4610 of the configurable IC 4600 routes different configuration data sets to different configurable nodes of the IC 4600. For instance, FIG. 47 illustrates configurable node 4745 receiving configuration data sets 1, 3, and J through the I/O circuitry, while configurable node 4750 receives configuration data sets 3, K, and N−1 through the I/O circuitry. In some embodiments, the configuration data sets are stored within each configurable node. Also, in some embodiments, a configurable node can store multiple configuration data sets so that it can reconfigure quickly by changing to another configuration data set. In some embodiments, some configurable nodes store only one configuration data set, while other configurable nodes store multiple such data sets.

Figure 48:
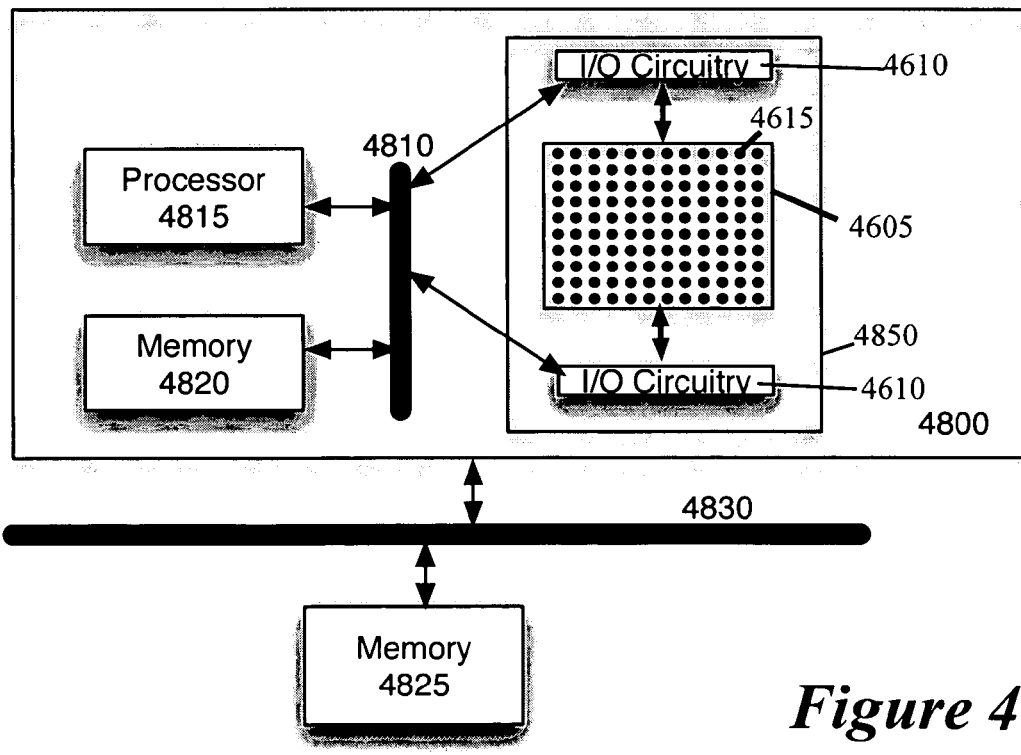
FIG. 48 illustrates a system on chip ("SoC") implementation of a configurable IC.

A configurable IC of the invention can also include circuits other than a configurable circuit arrangement and I/O circuitry. For instance, FIG. 48 illustrates a system on chip ("SoC") implementation of a configurable IC 4800. This IC has a configurable block 4850, which includes a configurable circuit arrangement 4605 and I/O circuitry 4610 for this arrangement. It also includes a processor 4815 outside of the configurable circuit arrangement, a memory 4820, and a bus 4810, which conceptually represents all conductive paths between the processor 4815, memory 4820, and the configurable block 4850. As shown in FIG. 48, the IC 4800 couples to a bus 4830, which communicatively couples the IC to other circuits, such as an off-chip memory 4825. Bus 4830 conceptually represents all conductive paths between the components of the IC 4800.

This processor 4815 can read and write instructions and/or data from an on-chip memory 4820 or an offchip memory 4825. The processor 4815 can also communicate with the configurable block 4850 through memory 4820 and/or 4825 through buses 4810 and/or 4830. Similarly, the configurable block can retrieve data from and supply data to memories 4820 and 4825 through buses 4810 and 4830.

Figure 49:
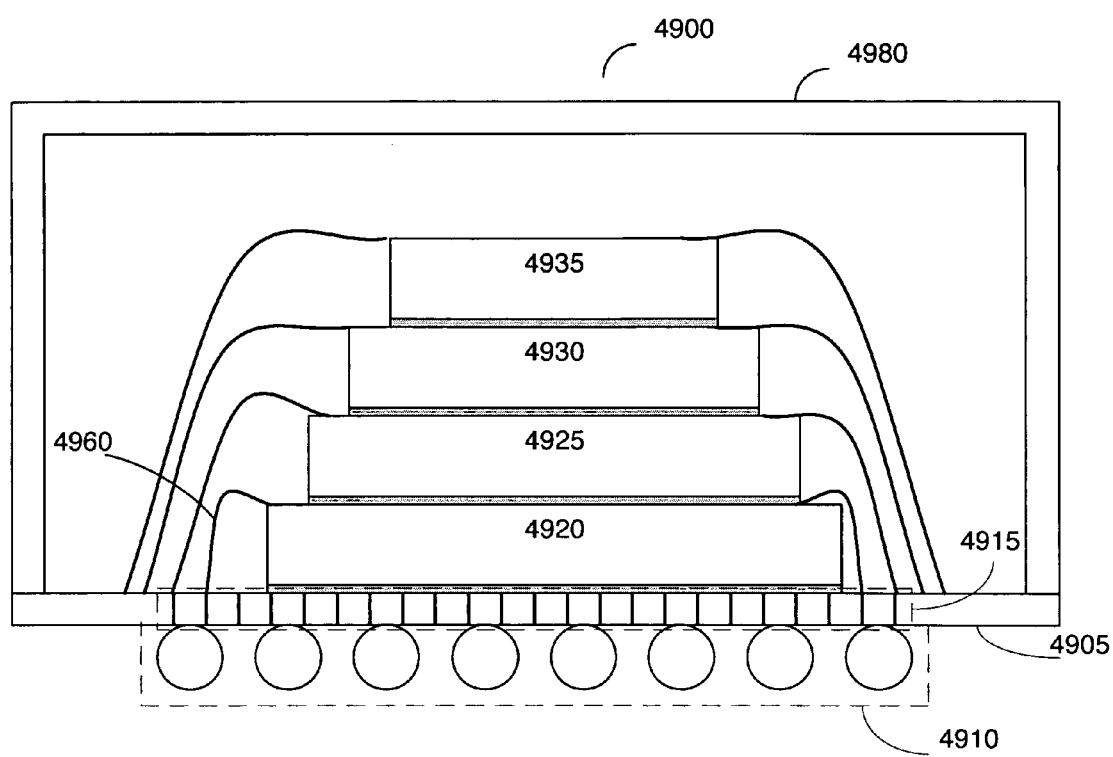
FIG. 49 illustrates a system in package ("SiP") implementation for a configurable IC.

Instead of, or in conjunction with, the system on chip ("SoC") implementation for a configurable IC, some embodiments might employ a programmable system in package ("PSiP") implementation for a configurable IC. FIG. 49 illustrates one such SiP 4900. As shown in this figure, SiP 4900 includes four IC's 4920, 4925, 4930, and 4935 that are stacked on top of each other on a substrate 4905. At least one of these IC's is a configurable IC that includes a configurable block, such as the configurable block 4850 of FIG. 48. Other IC's might be other circuits, such as processors, memory, etc.

As shown in FIG. 49, the IC communicatively connects to the substrate 4905 (e.g., through wire bondings 4960). These wire bondings allow the IC's 4920–4935 to communicate with each other without having to go outside of the PSiP 4900. In some embodiments, the IC's 4920–4935 might be directly wire-bonded to each other in order to facilitate communication between these IC's. Instead of, or in conjunction with the wire bondings, some embodiments might use other mechanisms to communicatively couple the IC's 4920–4935 to each other.

As further shown in FIG. 49, the PSiP includes a ball grid array ("BGA") 4910 and a set of vias 4915. The BGA 4910 is a set of solder balls that allows the PSiP 4900 to be attached to a printed circuit board ("PCB"). Each via connects a solder ball in the BGA 4910 on the bottom of the substrate 4905, to a conductor on the top of the substrate 4905.

The conductors on the top of the substrate 4905 are electrically coupled to the IC's 4920–4935 through the wire bondings 4960. Accordingly, the IC's 4920–4935 can send and receive signals to and from circuits outside of the PSiP 4900 through the wire bondings, the conductors on the top of the substrate 4905, the set of vias 4915, and the BGA 4910. Instead of a BGA, other embodiments might employ other structures (e.g., a pin grid array) to connect a PSiP to circuits outside of the PSiP. As shown in FIG. 49, a housing 4980 encapsulates the substrate 4905, the BGA 4910, the set of vias 4915, the IC's 4920–4935, and the wire bondings, to form the PSiP 4900. This and other PSiP structures are further described in United States Patent Application entitled "Programmable System in Package" "Method for Manufacturing a Programmable System in Package", filed concurrently herewith with the Ser. No. 11/081,820.

Figure 50:
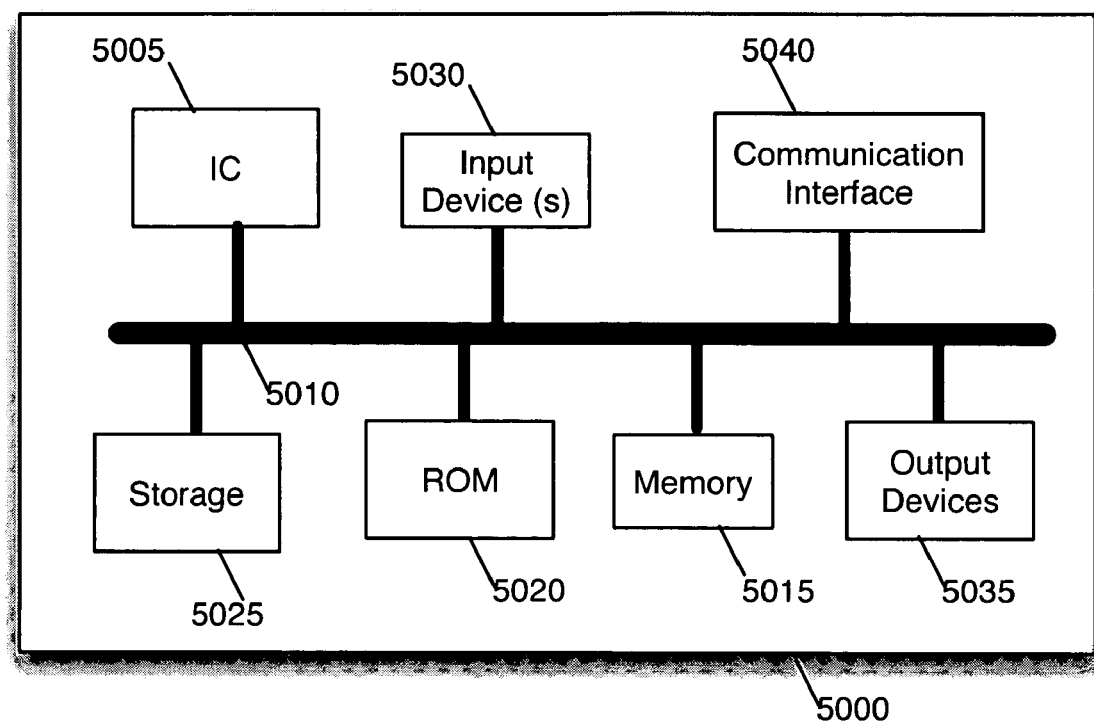
FIG. 50 illustrates a more detailed example of a computing system that has a configurable IC.

FIG. 50 conceptually illustrates a more detailed example of a computing system 5000 that has an IC 5005, which includes one of the invention's configurable circuit arrangements that were described above. The system 5000 can be a stand-alone computing or communication device, or it can be part of another electronic device. As shown in FIG. 50, the system 5000 not only includes the IC 5005, but also includes a bus 5010, a system memory 5015, a read-only memory 5020, a storage device 5025, input devices 5030, output devices 5035, and communication interface 5040.

The bus 5010 collectively represents all system, peripheral, and chipset interconnects (including bus and non-bus interconnect structures) that communicatively connect the numerous internal devices of the system 5000. For instance, the bus 5010 communicatively connects the IC 5015 with the read-only memory 5020, the system memory 5015, and the permanent storage device 5025.

From these various memory units, the IC 5005 receives data for processing and configuration data for configuring the IC's configurable logic and/or interconnect circuits. When the IC 5005 has a processor, the IC also retrieves from the various memory units instructions to execute. The read-only-memory (ROM) 5020 stores static data and instructions that are needed by the IC 5010 and other modules of the system 5000. The storage device 5025, on the other hand, is a read-and-write memory device. This device is a non-volatile memory unit that stores instruction and/or data even when the system 5000 is off. Like the storage device 5025, the system memory 5015 is a read-and-write memory device. However, unlike the storage device 5025, the system memory is a volatile read-and-write memory, such as a random access memory. The system memory stores some of the instructions and/or data that the IC needs at runtime.

The bus 5010 also connects to the input and output devices 5030 and 5035. The input devices 5030 enable the user to enter information into the system 5000. The input devices 5030 can include touch-sensitive screens, keys, buttons, keyboards, cursor-controllers, microphone, etc. The output devices 5035 display the output of the system 5000.

Finally, as shown in FIG. 50, the bus 5010 also couples the system 5000 to other devices through the communication interface 5040. Examples of the communication interface 5040 include network adapters that connect to a network of computers, or wired or wireless transceivers for communicating with other devices. One of ordinary skill in the art would appreciate that any other system configuration may also be used in conjunction with the invention, and these system configurations might have fewer or additional components.

While the invention has been described with reference to numerous specific details, one of ordinary skill in the art will recognize that the invention can be embodied in other specific forms without departing from the spirit of the invention. For example, although numerous embodiments were described by reference to flat tile architectures, one of ordinary skill will realize that these embodiments could be implemented in other configurable IC architectures.

Also, in some embodiments, the position of many circuits (e.g., of routing and input-select interconnects in aligned tile layouts) are topologically illustrated in the figures. The actual physical location of these circuits may be different in different embodiments. For instance, in a computation aligned tile layout that has logic circuits and routing and input-select interconnects, some embodiments position (1) the logic circuits in the center of the aligned tile layout, (2) the input-select interconnects above, below, to the right, and to the left of the centrally located logic circuits, and (3) the routing interconnects in the remaining corner areas of the aligned tile layout with other circuits.

Many embodiments described above include input select interconnects for the logic circuits. Other embodiments, however, might not use such interconnects. Thus, one of ordinary skill in the art would understand that the invention is not to be limited by the foregoing illustrative details, but rather is to be defined by the appended claims.

We claim:

1. A configurable IC comprising:
   a) a plurality of configurable computational tiles and a plurality of memory tiles, said tiles arranged in a particular tile arrangement;
   b) each computational tile including a set of configurable logic circuits for configurably performing a plurality of computations and a set of configurable routing circuits, said routing circuits of said tiles for configurably routing signals between configurable logic circuits;
   c) a plurality of memory arrays for storing data that serve as variables in the computations of the logic circuits, each memory array embedded in the tile arrangement between two sets of memory tiles;
   d) each memory tile including a set of routing circuits;
   e) wherein at least a first memory tile has the same set of configurable routing circuits as at least a second computational tile.

2. The configurable IC of claim 1,
   a) wherein each particular computational tile includes a plurality of input-select interconnects, each input-select interconnect for receiving a plurality of signals and supplying a set of the received signals to a logic circuit in the particular computational tile;
   b) wherein each particular memory tile includes a plurality of input select interconnects, each input-select interconnect for receiving a plurality of signals and supplying a set of the received signals to the memory array adjacent to the particular memory tile;
   c) wherein the first memory tile has the same set of input select interconnects as the second computational tile.

3. The configurable IC of claim 2, wherein two sets of input select interconnects are the same when the two sets includes the same number of input select interconnects and the input select interconnects receives the same number of signals.

4. The configurable IC of claim 3, wherein two sets of interconnects are the same when the relative positions of the interconnects of one set are the same as the relative positions of the interconnects of the other set.

5. The configurable IC of claim 2, wherein the routing circuits within a particular tile connect to the input select interconnects within the particular tile and within other tiles.

6. The configurable IC of claim 5,
   a) wherein the routing circuits of the first memory tile have a first set of connections to the input select interconnects of the first tile;
   b) wherein the routing circuits of the second computational tile have a second set of connections to the input select interconnects of the second tile, wherein the first and second sets of connections are similar.

7. The configurable IC of claim 1, wherein two sets of routing circuits are the same when the two sets includes the same number of routing circuits and the routing circuits receives the same number of signals.

8. The configurable IC of claim 1, wherein two sets of routing circuits are the same when the relative positions of the routing circuits of one set are the same as the relative positions of the routing circuits of the other set.

9. The configurable IC of claim 1, wherein said routing circuits form a routing network for routing signals between logic circuits and between logic circuits and memory arrays, wherein the embedded memory arrays do not create a discontinuity in the routing network.

10. The configurable IC of claim 9, wherein the routing network in a section about the configurable IC that contains a memory array embedded in a memory tile is the same as the routing network in a section that does not contain the memory array.

11. The configurable IC of claim 1, wherein each set of memory tile includes a plurality of configurable circuits that provide signals to the memory array.

12. The configurable IC of claim 11, wherein the configurable circuits of the two sets of memory tiles form two ports for accessing the memory array.

13. The configurable IC of claim 12, wherein the sets of memory tiles operate based on two different clocks to provide two memory-access ports that operate in two different clock domains.

14. An electronic device comprising:
   a configurable IC comprising:
      a plurality of configurable computational tiles and a plurality of memory tiles, said tiles arranged in a particular tile arrangement;
      each computational tile including a set of configurable logic circuits for configurably performing a plurality of computations and a set of configurable routing circuits, said routing circuits of said tiles for configurably routing signals between configurable logic circuits;
      a plurality of memory arrays for storing data that serve as variables in the computations of the logic circuits, each memory array embedded in the tile arrangement between two sets of memory tiles;
      each memory tile including a set of routing circuits;
      wherein at least a first memory tile has the same set of configurable routing circuits as at least a second computational tile.

15. The electronic device of claim 14, wherein the configurable IC further comprises:
   wherein each particular computational tile includes a plurality of input-select interconnects, each input-select interconnect for receiving a plurality of signals and supplying a set of the received signals to a logic circuit in the particular computational tile;
   wherein each particular memory tile includes a plurality of input select interconnects, each input-select interconnect for receiving a plurality of signals and supplying a set of the received signals to the memory array adjacent to the particular memory tile;
   wherein the first memory tile has the same set of input select interconnects as the second computational tile.

16. The electronic device of claim 15, wherein two sets of input select interconnects are the same when the two sets includes the same number of input select interconnects and the input select interconnects receives the same number of signals.

17. The electronic device of claim 16, wherein two sets of interconnects are the same when the relative positions of the interconnects of one set are the same as the relative positions of the interconnects of the other set.

18. The electronic device of claim 17, wherein the routing circuits within a particular tile connect to the input select interconnects within the particular tile and within other tiles.

19. The electronic device of claim 18,
   a) wherein the routing circuits of the first memory tile have a first set of connections to the input select interconnects of the first tile;
   b) wherein the routing circuits of the second computational tile have a second set of connections to the input select interconnects of the second tile, wherein the first and second sets of connections are similar.

20. The electronic device of claim 14, wherein two sets of routing circuits are the same when the two sets includes the same number of routing circuits and the routing circuits receives the same number of signals.

21. The electronic device of claim 14, wherein two sets of routing circuits are the same when the relative positions of the routing circuits of one set are the same as the relative positions of the routing circuits of the other set.

22. The electronic device of claim 14, wherein said routing circuits form a routing network or routing signals between logic circuits and between logic circuits and memory arrays, wherein the embedded memory arrays do not create a discontinuity in the routing network.

23. The electronic device of claim 22, wherein the routing network in a section about the configurable IC that contains a memory array embedded in a memory tile is the same as the routing network in a section that does not contain the memory array.

* * * * *

UNITED STATES PATENT AND TRADEMARK OFFICE
CERTIFICATE OF CORRECTION

| | |
|---|---|
| PATENT NO. | : 7,242,216 B1 |
| APPLICATION NO. | : 11/081809 |
| DATED | : July 10, 2008 |
| INVENTOR(S) | : Herman Schmit et al. |

It is certified that error appears in the above-identified patent and that said Letters Patent is hereby corrected as shown below:

<u>Column 37</u>

Lines 19 and 20 read: ""Programmable System in Package" "Method for Manufacturing a Programmable System in Package", filed concurrently herewith with the Ser. No. 11/081,820."

Should read: --"Method for Manufacturing a Programmable System in Package", filed concurrently herewith with the Ser. No. 11/081,820.--

Signed and Sealed this

Twenty-seventh Day of January, 2009

JOHN DOLL
*Acting Director of the United States Patent and Trademark Office*